(12) United States Patent
Godo

(10) Patent No.: US 9,601,631 B2
(45) Date of Patent: Mar. 21, 2017

(54) SEMICONDUCTOR DEVICE AND METHOD FOR MANUFACTURING THE SAME

(71) Applicant: SEMICONDUCTOR ENERGY LABORATORY CO., LTD., Atsugi-shi, Kanagawa-ken (JP)

(72) Inventor: Hiromichi Godo, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 399 days.

(21) Appl. No.: 13/686,022

(22) Filed: Nov. 27, 2012

(65) Prior Publication Data
US 2013/0134415 A1 May 30, 2013

(30) Foreign Application Priority Data

Nov. 30, 2011 (JP) .................................. 2011-262644
Nov. 30, 2011 (JP) .................................. 2011-262720

(51) Int. Cl.
*H01L 29/786* (2006.01)
*H01L 29/66* (2006.01)

(52) U.S. Cl.
CPC .... *H01L 29/7869* (2013.01); *H01L 29/66969* (2013.01)

(58) Field of Classification Search
CPC ..................... H01L 29/7869; H01L 29/66969
(Continued)

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

EP 1 737 044 A1 12/2006
EP 2 226 847 A2 9/2010
(Continued)

OTHER PUBLICATIONS

Jacob.K et al., "Solid-State Cells with Buffer Electrodes for the Measurement of Thermodynamic Properties of $IrO_2$, $CaIrO_3$, $Ca_2IrO_4$, and $Ca_4IrO_6$,", J. Electrochem. Soc. (Journal of the Electrochemical Society), Jan. 19, 1999, vol. 146, No. 5, pp. 1854-1861.
(Continued)

*Primary Examiner* — Cuong Q Nguyen
*Assistant Examiner* — Tong-Ho Kim
(74) *Attorney, Agent, or Firm* — Nixon Peabody LLP; Jeffrey L. Costellia

(57) ABSTRACT

A semiconductor device in which a shift of the threshold voltage of a transistor is suppressed is provided. A semiconductor device in which a decrease in the on-state current of a transistor is suppressed is provided. The semiconductor device is manufactured as follows: forming a gate electrode layer over a substrate; forming a gate insulating film over the gate electrode layer; forming an oxide semiconductor film over the gate insulating film; forming a metal oxide film having a higher reducing property than the oxide semiconductor film over the oxide semiconductor film; performing heat treatment while the metal oxide film and the oxide semiconductor film are in contact with each other, thereby the metal oxide film is reduced so that a metal film is formed; and processing the metal film to form a source electrode layer and a drain electrode layer.

16 Claims, 34 Drawing Sheets

(58) Field of Classification Search
USPC .............................. 257/43, E21.46; 438/104
See application file for complete search history.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,912,163 | B2 | 6/2005 | Zheng et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,383,470 | B2 | 2/2013 | Akimoto et al. |
| 8,420,553 | B2 | 4/2013 | Yamazaki |
| 8,546,181 | B2 * | 10/2013 | Yamazaki ......... H01L 29/66969 257/E29.296 |
| 8,772,784 | B2 | 7/2014 | Akimoto et al. |
| 8,946,097 | B2 | 2/2015 | Yamazaki |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0230835 | A1 * | 9/2008 | Shingu et al. ................. 257/347 |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0176393 | A1 * | 7/2010 | Kim et al. ....................... 257/43 |
| 2011/0065216 | A1 | 3/2011 | Kaji et al. |
| 2011/0127519 | A1 * | 6/2011 | Kang et al. ...................... 257/43 |
| 2011/0127524 | A1 * | 6/2011 | Yamazaki et al. .............. 257/43 |
| 2011/0140095 | A1 | 6/2011 | Kim et al. |
| 2011/0151618 | A1 * | 6/2011 | Yamazaki et al. ............ 438/104 |
| 2011/0186853 | A1 | 8/2011 | Terai et al. |
| 2011/0281394 | A1 * | 11/2011 | Yamazaki ..................... 438/104 |

FOREIGN PATENT DOCUMENTS

| | | |
|---|---|---|
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 05-251705 | 9/1993 |
| JP | 06-275697 | 9/1994 |
| JP | 08-264794 | 10/1996 |
| JP | 11-505377 | 5/1999 |
| JP | 2000-044236 | 2/2000 |
| JP | 2000-150900 | 5/2000 |
| JP | 2002-076356 | 3/2002 |
| JP | 2002-261294 | 9/2002 |
| JP | 2002-289859 | 10/2002 |
| JP | 2003-086000 | 3/2003 |
| JP | 2003-086808 | 3/2003 |
| JP | 2004-103957 | 4/2004 |
| JP | 2004-273614 | 9/2004 |
| JP | 2004-273732 | 9/2004 |
| JP | 2006-165528 | 6/2006 |
| JP | 2008-270313 | 11/2008 |
| JP | 2010-109145 A | 5/2010 |
| JP | 2010-171415 A | 8/2010 |
| JP | 2011-014796 A | 1/2011 |
| JP | 2011-086955 A | 4/2011 |
| JP | 2011-129926 | 6/2011 |
| JP | 2011-142309 A | 7/2011 |
| JP | 2011-159908 | 8/2011 |
| JP | 2011-176104 | 9/2011 |
| JP | 2011-181801 | 9/2011 |
| WO | WO-2004/114391 A1 | 12/2004 |
| WO | WO-2011/070892 | 6/2011 |

(56) References Cited

FOREIGN PATENT DOCUMENTS

OTHER PUBLICATIONS

Rard.J, "Chemistry and Thermodynamics of Ruthenium and Some of Its Inorganic Compounds and Aqueous Species,", Chem. Rev. (Chemical Reviews), Feb. 1, 1985, vol. 85, No. 1, pp. 1-39, American Chemical Society.

Kadoshima.M et al., "Thermally Unstable Ruthenium Oxide Gate Electrodes in Metal/High-k Gate Stacks,", Jpn. J. Appl. Phys. ( Japanese Journal of Applied Physics ) , Apr. 25, 2008, vol. 47, No. 4, pp. 2108-2111.

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T at al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of SOL-Gel-Derived Zinc Oxide Films by Irradiation With Ultraviolet Lamp,", Journal of SOL-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

(56) References Cited

OTHER PUBLICATIONS

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn, J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B.(Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

9.13.1 Simple substance and Inorganic compound, , Chemistry manual (the 4th edition of revision) basic vol. (II), Sep. 30, 1993, pp. 285-294, Maruzen.

Notification (Application No. 2012-260973; J17973) Dated Aug. 6, 2013.

\* cited by examiner

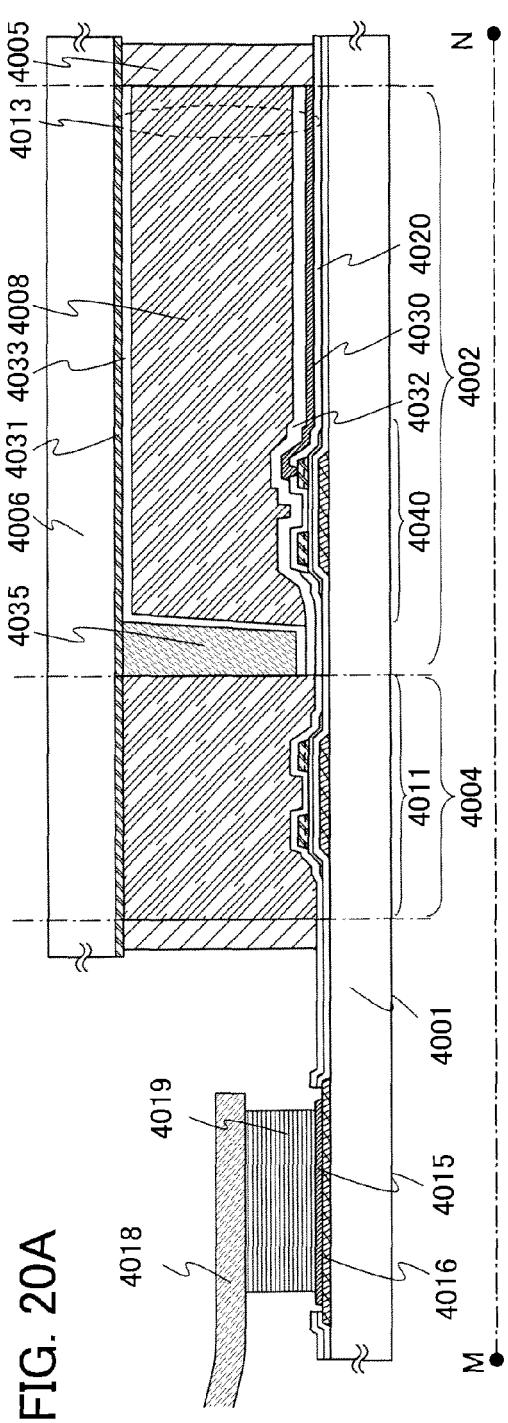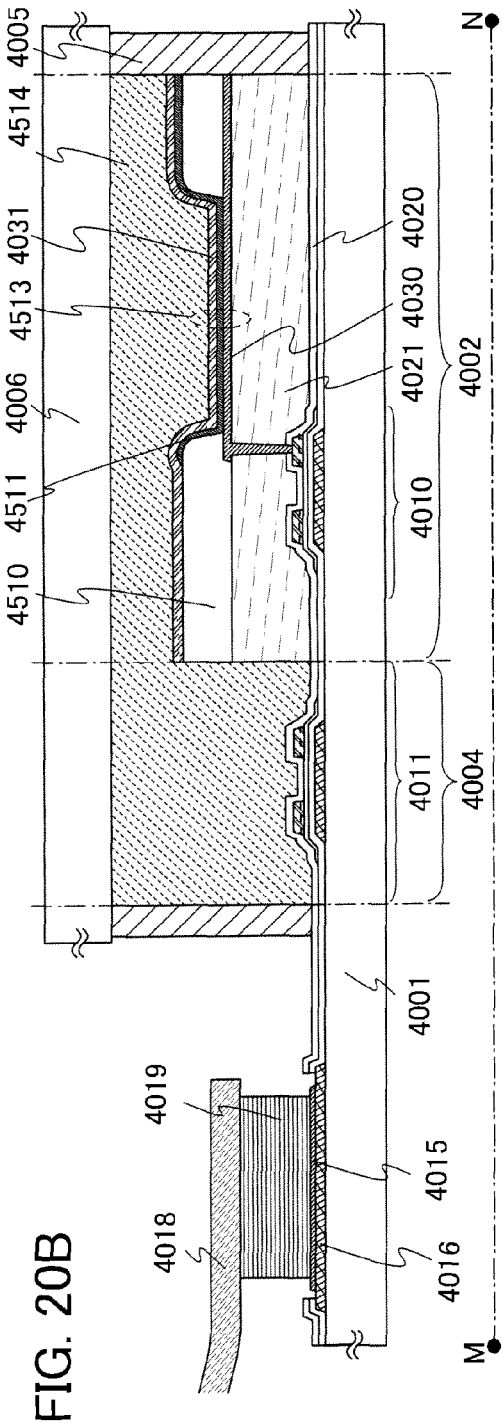

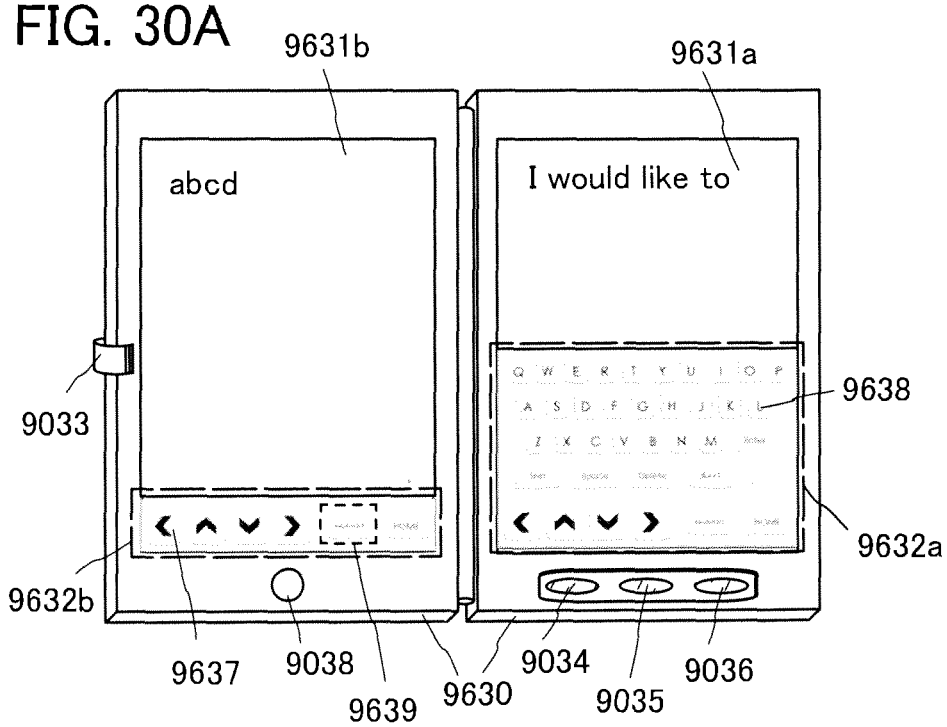
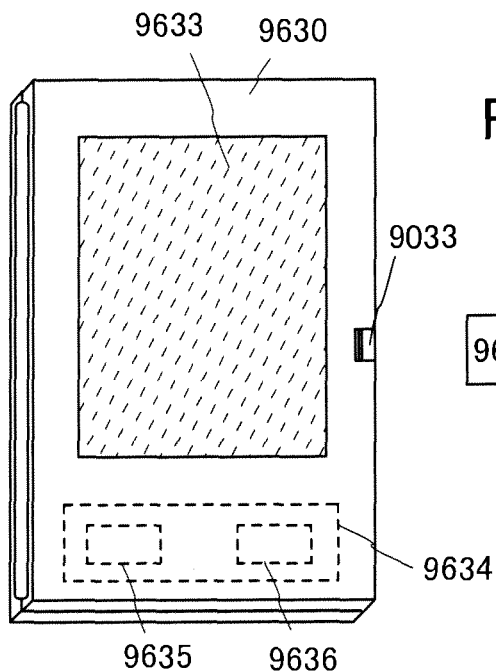
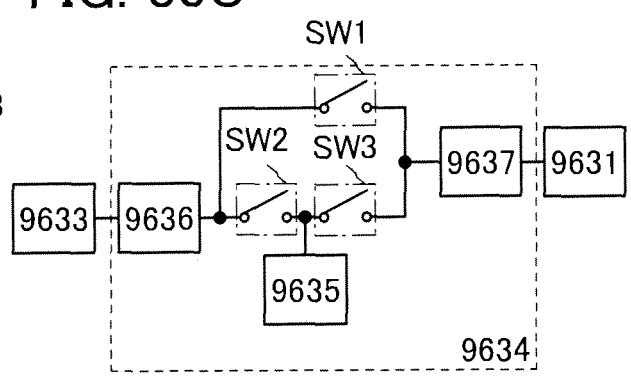

SEMICONDUCTOR DEVICE AND METHOD FOR MANUFACTURING THE SAME

CROSS REFERENCE TO RELATED APPLICATIONS

This application is a claim the benefit of priority of Japanese Application No. 2011-262644, filed Nov. 30, 2011, and Japanese Application No. 2011-262720, filed Nov. 30, 2011, the content of both of which are incorporated herein by reference in their entireties.

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electrooptic device, a semiconductor circuit, and electronic equipment are all semiconductor devices.

2. Description of the Related Art

Attention has been focused on a technique for forming a transistor using a semiconductor thin film formed over a substrate having an insulating surface. The transistor is applied to a wide range of electronic devices such as an integrated circuit (IC) and an image display device (also simply referred to as display device). A silicon-based semiconductor material is widely known as a material of the semiconductor thin film applicable to the transistor. As another material, an oxide semiconductor has been attracting attention.

For example, a transistor including a semiconductor layer formed of an amorphous oxide including indium (In), gallium (Ga), and zinc (Zn) (an In—Ga—Zn—O-based amorphous oxide) is disclosed (see Patent Document 1). Further, titanium, tungsten, molybdenum, or the like is used for a source electrode layer and a drain electrode layer which are provided to be in contact with such an oxide semiconductor film (see Patent Documents 2 and 3).

REFERENCE

[Patent Document 1] Japanese Published Patent Application No. 2011-181801
[Patent Document 2] Japanese Published Patent Application No. 2011-129926
[Patent Document 3] Japanese Published Patent Application No. 2008-270313

SUMMARY OF THE INVENTION

In the case where titanium is used for a source electrode layer and a drain electrode layer which are provided in contact with an oxide semiconductor film and the oxide semiconductor film and the titanium layer are subjected to heat treatment while being in contact with each other, titanium oxide is formed at the interface between the titanium layer and the oxide semiconductor film because the titanium layer reacts with oxygen in the oxide semiconductor film. At this time, the oxide semiconductor film is reduced, oxygen vacancies are formed, and majority carriers are generated in the oxide semiconductor film. As a result, a problem that the threshold voltage of a transistor shifts in the negative direction is caused.

Further, in the case where tungsten or molybdenum is used for the source electrode layer and the drain electrode layer, the oxide semiconductor film, and the tungsten layer or the molybdenum layer are subjected to high-temperature heat treatment while being in contact with each other, so that the oxide semiconductor film is reduced in some cases. As a result, there is a possibility that the threshold voltage of the transistor shifts in the negative direction as in the case where titanium is used.

Further, the oxide semiconductor film and one of the tungsten layer and the molybdenum layer are subjected to high-temperature heat treatment while being in contact with each other, thereby oxygen might be diffused from the oxide semiconductor film to the tungsten layer or the molybdenum layer in some cases. Accordingly, a high resistance component is formed in the source electrode layer and the drain electrode layer, so that the on-state current of the transistor is reduced is caused.

Oxygen vacancies in a channel or a back channel of the oxide semiconductor film can be reduced by supply of oxygen even after the source electrode layer and the drain electrode layer are formed. However, formation of oxygen vacancies at the interface between the oxide semiconductor film and each of the source electrode layer and the drain electrode layer makes it hard to reduce the oxygen vacancies by supply of oxygen at the interface between the oxide semiconductor film and each of the source electrode layer and the drain electrode layer. Further, formation of a high resistance component by diffusion of oxygen in the source electrode layer and the drain electrode layer leads to an additional step for removing the high resistance component.

In view of the above problems, it is an object of the present invention to provide a semiconductor device in which a shift of the threshold voltage of the transistor in the negative direction is suppressed by suppressing reduction of an oxide semiconductor film and reducing oxygen vacancies of an oxide semiconductor film. It is another object to provide a semiconductor device in which a decrease in the on-state current of the transistor is suppressed by reducing resistance due to an oxide semiconductor film, the source electrode layer, and the drain electrode layer. One embodiment of the present invention achieves at least one of the above objects.

In a semiconductor device according to one embodiment of the present invention, in order to prevent extraction of oxygen from the oxide semiconductor film, a metal film having a higher oxidation resistance than a metal element included in the oxide semiconductor film is used as a source electrode layer and a drain electrode layer which are in contact with the oxide semiconductor film. Further, the source electrode layer and the drain electrode layer may have a stacked-layer structure of the metal film and a conductive film.

In this specification and the like, a "metal having a higher oxidation resistance than a metal element included in the oxide semiconductor film" is a metal having a higher oxidation resistance than indium, gallium, zinc, and tin (a metal having higher Gibbs free energy of oxidation reaction than at least indium, gallium, zinc, and tin). Specific examples are copper, silver, ruthenium, iridium, and the like.

Further, the conductive film is preferably formed using a material with which an oxide film is not formed at the interface with the metal oxide film. Examples of the material of the conductive film are gold, platinum, copper, silver, ruthenium, iridium, titanium, tungsten, titanium nitride, molybdenum nitride, tungsten nitride, tantalum nitride, and the like can be given.

Copper, silver, ruthenium, iridium, or the like is used for the metal film which is in contact with the oxide semiconductor film, so that extraction of oxygen from the oxide semiconductor film can be prevented. This makes it possible to suppress an increase in oxygen vacancies in the oxide semiconductor film and prevent the threshold voltage of the transistor from shifting in the negative direction.

Further, since the above-described metal film can suppress diffusion of oxygen in the metal film, the formation of the high resistance component in the metal film can be suppressed. Accordingly, the resistance due to the oxide semiconductor film, the source electrode layer, and the drain electrode layer can be reduced, so that a decrease in on-state current of the transistor can be suppressed.

Further, it is preferable that the metal film (e.g., a film of copper, silver, or ruthenium) having a work function of ±0.2 eV of the electron affinity of the oxide semiconductor film be selected because the contact resistances between the oxide semiconductor film and each of the source electrode layer and the drain electrode layer can be reduced. Thus, the resistance due to the oxide semiconductor film, the source electrode layer, and the drain electrode layer can be reduced, so that a decrease in on-state current of the transistor can be suppressed.

Specifically, one embodiment of the present invention is a semiconductor device which includes an oxide semiconductor film, a source electrode layer and a drain electrode layer which are in contact with the oxide semiconductor film, a gate electrode layer which overlaps with the oxide semiconductor film, and a gate insulating film between the oxide semiconductor film and the gate electrode layer. In the source electrode layer and the drain electrode layer, at least portions in contact with the oxide semiconductor film are formed using a metal having a higher oxidation resistance than a metal element included in the oxide semiconductor film.

Another embodiment of the present invention is a semiconductor device which includes a gate electrode layer over a substrate, a gate insulating film over the gate electrode layer, an oxide semiconductor film provided over the gate insulating film in a region overlapping with the gate electrode layer, and a source electrode layer and a drain electrode layer which are in contact with the oxide semiconductor film. In the source electrode layer and the drain electrode layer, portions in contact with the oxide semiconductor film are formed using a metal having a higher oxidation resistance than a metal element included in the oxide semiconductor film.

Another embodiment of the present invention is a semiconductor device which includes a gate electrode layer over a substrate, a gate insulating film over the gate electrode layer, an oxide semiconductor film provided over the gate insulating film in a region overlapping with the gate electrode layer, and a source electrode layer and a drain electrode layer which are in contact with the oxide semiconductor film. The source electrode layer and the drain electrode layer have a staked-layer structure of a metal film and a conductive film, and a metal having a higher oxidation resistance than a metal element included in the oxide semiconductor film is used for the metal film.

Another embodiment of the present invention is a semiconductor device which includes a gate electrode layer over a substrate, a gate insulating film over the gate electrode layer, an oxide semiconductor film provided over the gate insulating film in a region overlapping with the gate electrode layer, an insulating film provided over the oxide semiconductor film in the region overlapping with the gate electrode layer, and a source electrode layer and a drain electrode layer which are in contact with the oxide semiconductor film and the insulating film. The source electrode layer and the drain electrode layer have a staked-layer structure of a metal film and a conductive film, and a metal having a higher oxidation resistance than a metal element included in the oxide semiconductor film is used for the metal film.

Another embodiment of the present invention is a semiconductor device which includes a gate electrode layer over a substrate, a gate insulating film over the gate electrode layer, a source electrode layer and a drain electrode layer over the gate insulating film, and an oxide semiconductor film over the gate insulating film, the source electrode layer, and the drain electrode layer. The source electrode layer and the drain electrode layer have a staked-layer structure of a conductive film and a metal film, and a metal having a higher oxidation resistance than a metal element included in the oxide semiconductor film is used for the metal film.

Another embodiment of the present invention is a semiconductor device which includes an oxide semiconductor film over a substrate, a gate insulating film over the oxide semiconductor film, a gate electrode layer over the gate insulating film, an insulating film over the gate electrode layer, sidewall insulating films each of which is in contact with a side surface of the gate electrode layer and a side surface of the insulating film, a source electrode layer which is in contact with the oxide semiconductor film, the gate insulating film, and one of the sidewall insulating films, and a drain electrode layer which is in contact with the oxide semiconductor film, the gate insulating film, and the other of the sidewall insulating films. The oxide semiconductor film includes a channel formation region provided in a region overlapping with the gate electrode layer, and regions which contain dopants and between which the channel formation region is sandwiched. In the source electrode layer and the drain electrode layer, at least portions in contact with the oxide semiconductor film are formed using a metal having a higher oxidation resistance than a metal element included in the oxide semiconductor film.

Another embodiment of the present invention is a semiconductor device which includes an oxide semiconductor film over a substrate, a gate insulating film over the oxide semiconductor film, a gate electrode layer over the gate insulating film, an insulating film over the gate electrode layer, sidewall insulating films each of which is in contact with a side surface of the gate electrode layer and a side surface of the insulating film, a source electrode layer which is in contact with the oxide semiconductor film, the gate insulating film, and one of the sidewall insulating films, and a drain electrode layer which is in contact with the oxide semiconductor film, the gate insulating film, and the other of the sidewall insulating films. The oxide semiconductor film includes a channel formation region provided in a region overlapping with the gate electrode layer, and regions which contain dopants and between which the channel formation region is sandwiched. The source electrode layer and the drain electrode layer which are in contact with the oxide semiconductor film have a stacked-layer structure of a metal film having a higher oxidation resistance than a metal element included in the oxide semiconductor film and a conductive film.

Another embodiment of the present invention is a semiconductor device which includes a source electrode layer and a drain electrode layer over a substrate, an oxide semiconductor film over the source electrode layer and the drain electrode layer, a gate insulating film over the oxide semiconductor film, a gate electrode layer over the gate insulating film, and an insulating film over the gate electrode layer. The oxide semiconductor film includes a channel formation region provided in a region overlapping with the gate electrode layer, and regions which contain dopants and between which the channel formation region is sandwiched. The source electrode layer and the drain electrode layer which are in contact with the oxide semiconductor film have a stacked-layer structure of a conductive film and a metal film having a higher oxidation resistance than a metal element included in the oxide semiconductor film.

In any of the above structures, the thickness of the metal film is preferably greater than or equal to 1 nm and less than or equal to 50 nm.

Further, in any of the above structures, the metal having a higher oxidation resistance than the metal element included in the oxide semiconductor film preferably has higher Gibbs free energy of oxidation reaction than molybdenum. Specifically, it is preferable to use one or more of copper, silver, ruthenium, and iridium.

Further, in any of the above structures, it is preferable to use one or more of gold, platinum, copper, silver, ruthenium, iridium, titanium, tungsten, titanium nitride, molybdenum nitride, tungsten nitride, and tantalum nitride for the conductive film.

The energy gap of the oxide semiconductor film disclosed in this specification and the like is 2.8 eV to 3.2 eV, which is greater than that of silicon (1.1 eV). The minor carrier density of the oxide semiconductor film is $10^{-9}$ cm$^{-3}$, which is much smaller than the intrinsic carrier density of silicon ($10^{11}$ cm$^{-3}$).

Majority carriers (electrons) of the oxide semiconductor film flow only from a source of a transistor. Further, a channel formation region can be depleted completely. Thus, an off-state current of the transistor can be extremely small. The off-state current of the transistor including the oxide semiconductor film is as small as 10 yA/μm or less at room temperature, or 1 zA/μm or less at 85° C. to 95° C.

The transistor including the oxide semiconductor film has a small S value, so that ideal electric characteristics can be obtained. Further, the transistor has high reliability.

In a method for manufacturing a semiconductor device according to one embodiment of the present invention, a metal oxide film which and has a higher reducing property than an oxide semiconductor film is formed to be in contact with the oxide semiconductor film, and heat treatment is performed. By performing the heat treatment, the metal oxide film having a higher reducing property than the oxide semiconductor film is reduced, so that a metal film is formed.

In this specification and the like, a "metal oxide film having a higher reducing property than an oxide semiconductor film" is a metal oxide film having a higher reducing property than films of indium, gallium, zinc, and tin (a metal oxide film having higher Gibbs free energy of oxidation reaction than at least indium, gallium, zinc, and tin). Specific examples are copper oxide, silver oxide, ruthenium oxide, and iridium oxide.

The metal oxide film which is in contact with the oxide semiconductor film and has a higher reducing property than the oxide semiconductor film is subjected to heat treatment, so that the metal oxide film is reduced, and accordingly oxygen is released from the metal oxide film and is supplied to the oxide semiconductor film. Thus, oxygen vacancies in the oxide semiconductor film can be reduced, whereby a shift of the threshold voltage of the transistor in the negative direction is suppressed.

Further, the metal film which is formed by reduction of the metal oxide film is a film having a higher oxidation resistance than the metal element included in the oxide semiconductor film. That is, oxygen is not likely to be diffused in the metal film. The use of the metal film for the source electrode layer and the drain electrode layer makes it possible to suppress the formation of the high resistance component in the metal film. Accordingly, the resistance due to the oxide semiconductor film, the source electrode layer, and the drain electrode layer can be reduced, so that the decrease in on-state current of the transistor can be suppressed.

Further, it is preferable that the metal film (e.g., a film of copper, silver, or ruthenium) having a work function of ±0.2 eV of the electron affinity of the oxide semiconductor film be selected because the contact resistances between the oxide semiconductor film and each of the source electrode layer and the drain electrode layer can be reduced. Thus, the resistance due to the oxide semiconductor film, the source electrode layer, and the drain electrode layer can be reduced, so that the decrease in on-state current of the transistor can be suppressed.

Further, a conductive film may be formed in contact with the metal oxide film having a higher reducing property than the oxide semiconductor film. The conductive film is preferably formed using a material with which an oxide film is not formed at the interface with the metal oxide film having a higher reducing property than the oxide semiconductor film. Examples of the material are copper, silver, ruthenium, iridium, titanium, tungsten, and tantalum nitride.

When the conductive film is formed after the metal oxide film is formed over the oxide semiconductor film, heat treatment may be performed at any timing. For example, the conductive film may be formed after the metal oxide film is formed over the oxide semiconductor film and heat treatment is performed. Alternatively, after the conductive film is formed over the metal oxide film, heat treatment may be performed. Further, alternatively, heat treatment may be performed after the conductive film is formed over the metal oxide film and is processed into a source electrode layer and a drain electrode layer.

Alternatively, when the oxide semiconductor film is formed after the metal oxide film is formed over the conductive film, the heat treatment may be performed after the oxide semiconductor film is formed or after the oxide semiconductor film is processed into an island shape.

Specifically, one embodiment of the present invention is a method for manufacturing a semiconductor device which includes the following steps: forming a gate electrode layer over a substrate; forming a gate insulating film over the gate electrode layer; forming an oxide semiconductor film over the gate insulating film; forming a metal oxide film having a higher reducing property than the oxide semiconductor film over the oxide semiconductor film; performing heat treatment while the metal oxide film and the oxide semiconductor film are in contact with each other, thereby oxygen is supplied from the metal oxide film to the oxide semiconductor film and the metal oxide film is reduced to a metal film; and processing the metal film to form a source electrode layer and a drain electrode layer.

Another embodiment of the present invention is a method for manufacturing a semiconductor device which includes the following steps: forming a gate electrode layer over a substrate; forming a gate insulating film over the gate electrode layer; forming an oxide semiconductor film over the gate insulating film; stacking a metal oxide film having a higher reducing property than the oxide semiconductor film and a conductive film over the oxide semiconductor film; performing heat treatment while the metal oxide film and the oxide semiconductor film are in contact with each other, thereby oxygen is supplied from the metal oxide film to the oxide semiconductor film and the metal oxide film is reduced to a metal film; and processing the metal film and the conductive film to form a source electrode layer and a drain electrode layer.

Another embodiment of the present invention is a method for manufacturing a semiconductor device which includes the following steps: forming a gate electrode layer over a substrate; forming a gate insulating film over the gate electrode layer; forming an oxide semiconductor film over the gate insulating film; forming an insulating film over the oxide semiconductor film; stacking a metal oxide film having a higher reducing property than the oxide semiconductor film and a conductive film over the oxide semiconductor film and the insulating film; performing heat treatment while the metal oxide film and the oxide semiconductor film are in contact with each other, thereby oxygen is supplied from the metal oxide film to the oxide semiconductor film and the metal oxide film is reduced to a metal film; and processing the metal film and the conductive film to form a source electrode layer and a drain electrode layer.

Another embodiment of the present invention is a method for manufacturing a semiconductor device which includes the following steps: forming a gate electrode layer over a substrate; forming a gate insulating film over the gate electrode layer; stacking a conductive film and a metal oxide film over the gate insulating film; forming a source electrode layer and a drain electrode layer by processing the conductive film and the metal oxide film; forming an oxide semiconductor film having a lower reducing property than the metal oxide film over the source electrode layer and the drain electrode layer; and performing heat treatment while the metal oxide film and the oxide semiconductor film are in contact with each other, thereby oxygen is supplied from the metal oxide film to the oxide semiconductor film and the metal oxide film is reduced to a metal film.

Another embodiment of the present invention is a method for manufacturing a semiconductor device which includes the following steps: forming an oxide semiconductor film over a substrate; forming a gate insulating film over the oxide semiconductor film; stacking a gate electrode layer and an insulating film over the gate insulating film; adding dopants into the oxide semiconductor film using the gate electrode layer and the insulating film as masks; forming sidewall insulating films in contact with side surfaces of the insulating film and the gate electrode layer over the gate insulating film; forming a metal oxide film having a higher reducing property than the oxide semiconductor film to be in contact with the oxide semiconductor film; performing heat treatment while the metal oxide film and the oxide semiconductor film are in contact with each other, thereby oxygen is supplied from the metal oxide film to the oxide semiconductor film and the metal oxide film is reduced to a metal film; forming an interlayer insulating film over the metal film; and performing polishing treatment on the metal film and the interlayer insulating film until the insulating film is exposed, so that a source electrode layer and a drain electrode layer are formed.

Another embodiment of the present invention is a method for manufacturing a semiconductor device which includes the following steps: forming an oxide semiconductor film over a substrate; forming a gate insulating film over the oxide semiconductor film; stacking a gate electrode layer and an insulating film over the gate insulating film; adding dopants into the oxide semiconductor film using the gate electrode layer and the insulating film as masks; forming sidewall insulating films in contact with side surfaces of the insulating film and the gate electrode layer over the gate insulating film; stacking a metal oxide film having a higher reducing property than the oxide semiconductor film and a conductive film to be in contact with the oxide semiconductor film; performing heat treatment while the metal oxide film and the oxide semiconductor film are in contact with each other, thereby oxygen is supplied from the metal oxide film to the oxide semiconductor film and the metal oxide film is reduced to a metal film; forming an interlayer insulating film over the conductive film; and performing polishing treatment on the metal film, the conductive film, and the interlayer insulating film until the insulating film is exposed, thereby a source electrode layer and a drain electrode layer are formed.

Another embodiment of the present invention is a method for manufacturing a semiconductor device which includes the following steps: forming an island-shaped insulating film over a substrate; stacking a conductive film and a metal oxide film over the island-shaped insulating film; performing polishing treatment on the conductive film and the metal oxide film until the island-shaped insulating film is exposed to form a source electrode layer and a drain electrode layer; forming an oxide semiconductor film over the source electrode layer and the drain electrode layer; performing heat treatment while the metal oxide film and the oxide semiconductor film are in contact with each other, thereby oxygen is supplied from the metal oxide film to the oxide semiconductor film and the metal oxide film is reduced to a metal film; forming a gate insulating film over the oxide semiconductor film; forming a gate electrode layer over the gate insulating film; and adding dopants into the oxide semiconductor film with the gate electrode layer as a mask.

In any of the above manufacturing methods, the metal oxide film having a higher reducing property than the oxide semiconductor film is preferably formed to a thickness greater than or equal to 1 nm and less than or equal to 50 nm.

Further, in any of the above manufacturing methods, the metal oxide film is preferably formed using one or more of copper oxide, silver oxide, ruthenium oxide, and iridium oxide. Moreover, the conductive film is preferably formed using one or more of gold, platinum, copper, silver, ruthenium, iridium, titanium, tungsten, titanium nitride, molybdenum nitride, tungsten nitride, and tantalum nitride.

According to one embodiment of the present invention, reduction of the oxide semiconductor film can be suppressed and oxygen vacancies in the oxide semiconductor film can be reduced; thus, it is possible to provide a semiconductor device in which a shift of the threshold voltage of the transistor in the negative direction is suppressed. Further, by reducing resistance due to the oxide semiconductor film, the source electrode layer, and the drain electrode layer, a semiconductor device in which a decrease in the on-state current of the transistor is suppressed can be provided.

BRIEF DESCRIPTION OF THE DRAWINGS

FIGS. 20A and 20B are cross-sectional views each illustrating one embodiment of a semiconductor device.

FIGS. 30A to 30C are views illustrating an electronic device and a block diagram of a charge and discharge control circuit.

DETAILED DESCRIPTION OF THE INVENTION

Hereinafter, embodiments of the invention disclosed in this specification are described with reference to the accompanying drawings. Note that the invention disclosed in this specification is not limited to the following description, and it is easily understood by those skilled in the art that modes and details can be variously changed without departing from the spirit and the scope of the invention. Therefore, the invention disclosed in this specification is not construed as being limited to the description of the following embodiments. Note that the ordinal numbers such as "first" and "second" in this specification are used for convenience and do not denote the order of steps and the stacking order of layers. In addition, the ordinal numbers in this specification do not denote particular names which specify the present invention.

Embodiment 1

In this embodiment, one embodiment of a method for manufacturing a semiconductor device is described with reference to FIGS. 1A to 1C, FIGS. 2A and 2B, and FIG. 9. In this embodiment, a transistor including an oxide semiconductor film is described as an example of the semiconductor device.

There is no particular limitation on the structure of the transistor that can be applied to a semiconductor device according to one embodiment of the present invention; for example, a staggered type or a planar type having a top-gate structure or a bottom-gate structure can be employed. The transistor may have a single-gate structure in which one channel formation region is formed, a double-gate structure in which two channel formation regions are formed, or a triple-gate structure in which three channel formation regions are formed. Further, a transistor may have a dual-gate structure including two gate electrodes positioned above and below a channel forming region with gate insulating films interposed therebetween.

Figure 1A:
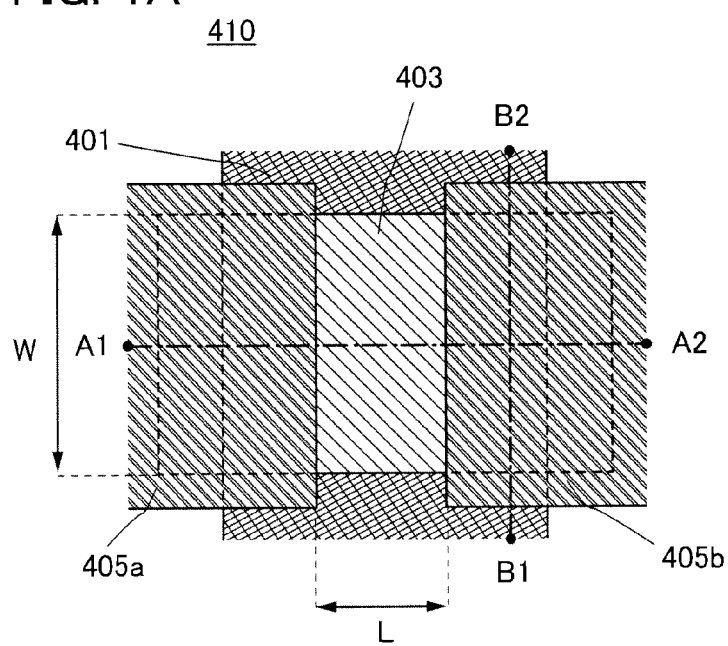
FIGS. 1A to 1C are a plan view and cross-sectional views illustrating one embodiment of a semiconductor device.
Figure 1C:
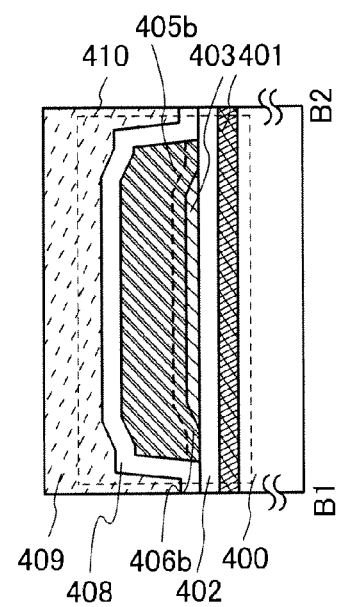
Figure 1B:
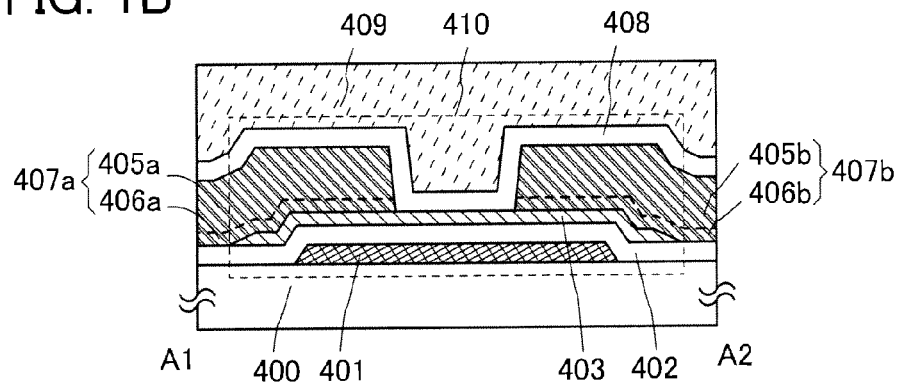

A transistor 410 illustrated in FIGS. 1A, 1B, and 1C is an example of a transistor which is one of bottom-gate transistors and is also referred to as an inverted-staggered transistor. FIG. 1A is a plan view of the transistor 410, FIG. 1B is a cross-sectional view along line A1-A2 in FIG. 1A (cross-sectional view in the direction of the channel length direction of the transistor 410), and FIG. 1C is a cross-sectional view along line B1-B2 in FIG. 1A (cross-sectional view in the direction of the channel width direction). Further, in FIG. 1A, some components of the transistor 410 (e.g., a gate insulating film 402) are not illustrated to avoid complexity.

The transistor 410 illustrated in FIGS. 1A, 1B, and 1C includes a gate electrode layer 401 over a substrate 400 having an insulating surface, the gate insulating film 402 over the gate electrode layer 401, an oxide semiconductor film 403 provided over the gate insulating film 402 in a region overlapping with the gate electrode layer 401, and a source electrode layer 407a and a drain electrode layer 407b which are in contact with the oxide semiconductor film 403. Further, an insulating film 408 and a planarization insulating film 409 are provided to cover the transistor 410.

In the transistor 410 illustrated in FIGS. 1A, 1B, and 1C, the source electrode layer 407a and the drain electrode layer 407b, which are in contact with the oxide semiconductor film 403, have a stacked-layer structure. The source electrode layer 407a is a stack of a metal film 406a and a conductive film 405a. The drain electrode layer 407b is a stack of a metal film 406b and a conductive film 405b. Note that a metal film is referred to as a conductive film in some cases.

In order to prevent extraction of oxygen from the oxide semiconductor film 403, the metal films 406a and 406b which are in contact with the oxide semiconductor film 403 as illustrated in FIGS. 1A, 1B, and 1C, include a metal having a higher oxidation resistance than the metal element included in the oxide semiconductor film 403.

Metals having a higher oxidation resistance than the metal element included in the oxide semiconductor film 403 are described with reference to FIG. 9.

First, Table 1 shows the values of standard enthalpy of formation ΔH and standard entropy S in each substance. The values of standard enthalpy of formation ΔH and standard entropy S in each substance shown in Table 1 is cited from "Kagaku Binran (Handbook of Chemistry) II, Pure Chemistry $4^{th}$ Ed.," edited by the Chemical Society of Japan, Maruzen Co., Ltd. Further, the values of standard enthalpy of formation ΔH and standard entropy S in each substance shown in Table 1 are substituted for a formula of each oxidation reaction to calculate the values of standard enthalpy change of formation ΔH and standard entropy change of formation ΔS. The calculated values of standard enthalpy change of formation ΔH and standard entropy change of formation ΔS in each oxidation reaction are shown in Table 2.

TABLE 1

| Substance | ΔH [kJ/mol] Standard Enthalpy of Formation | S [J/(Kmol)] Standard Entropy |
|---|---|---|
| $O_2$ | 0 | 205.1 |
| Si | 0 | 18.83 |

TABLE 1-continued

| Substance | ΔH [kJ/mol] Standard Enthalpy of Formation | S [J/(Kmol)] Standard Entropy |
|---|---|---|
| $SiO_2$ | −910.9 | 41.84 |
| In | 0 | 57.82 |
| $In_2O_3$ | −925.8 | 104.2 |
| Ga | 0 | 40.88 |
| $Ga_2O_3$ | −1089 | 84.98 |
| Zn | 0 | 41.63 |
| ZnO | −348.3 | 43.64 |
| Sn | 0 | 51.55 |
| $SnO_2$ | −580.7 | 52.3 |
| Al | 0 | 28.33 |
| $Al_2O_3$ | −1676 | 50.92 |
| W | 0 | 32.64 |
| $WO_3$ | −842.9 | 75.9 |
| Mo | 0 | 28.66 |
| $MoO_3$ | −745.1 | 77.74 |
| Cu | 0 | 33.15 |
| CuO | −157.3 | 42.63 |
| $CuO_2$ | −168.6 | 93.14 |
| Ti | 0 | 30.63 |
| $TiO_2$ (rutile) | −944.7 | 50.33 |
| Hf | 0 | 43.56 |
| $HfO_2$ | −1145 | 59.33 |
| Ru | 0 | 28.53 |
| $RuO_2$ | −307 | 52.2 |
| Ag | 0 | 42.55 |
| $Ag_2O$ | −31.05 | 121.3 |
| Ir | 0 | 35.48 |
| $IrO_2$ | −239.23 | 68.43 |

TABLE 2

| Formulas of Oxidation Reaction | Standard Enthalpy Change of Formation ΔH [kJ/mol] | Standard Entropy Change of Formation ΔS [J/(Kmol)] |
|---|---|---|
| $Si + O_2 = SiO_2$ | −910.9 | −182.1 |
| $4/3In + O_2 = 2/3In_2O_3$ | −617.2 | −212.8 |
| $Sn + O_2 = SnO_2$ | −580.7 | −204.4 |
| $4/3Ga + O_2 = 2/3Ga_2O_3$ | −726.1 | −203.0 |
| $2Zn + O_2 = 2ZnO$ | −696.6 | −201.1 |
| $2/3W + O_2 = 2/3WO_3$ | −561.9 | −176.3 |
| $2/3Mo + O_2 = 2/3MoO_3$ | −496.7 | −172.4 |
| $2Cu + O_2 = 2CuO$ | −314.6 | −186.2 |
| $4Cu + O_2 = 2CU_2O$ | −337.2 | −151.5 |
| $4/3Al + O_2 = 2/3Al_2O_3$ | −1117 | −209.0 |
| $Ti + O_2 = TiO_2$ | −944.7 | −185.4 |
| $Hf + O_2 = HfO_2$ | −1145 | −189.4 |
| $4Ag + O_2 = 2Ag_2O$ | −62.10 | −132.7 |
| $Ru + O_2 = RuO_2$ | −307.0 | −181.5 |
| $Ir + O_2 = IrO_2$ | −239.2 | −172.2 |

Next, the values of standard enthalpy change of formation ΔH and standard entropy change of formation ΔS shown in Table 2 is substituted for Formula 1 to calculate the value of Gibbs free energy of each oxidation reaction in the temperature range from 0° C. to 900° C. Note that T in Formula 1 is temperature [K].

$$\Delta G = \Delta H - T \Delta S \times 10^{-3}$$ [Formula 1]

Figure 9:
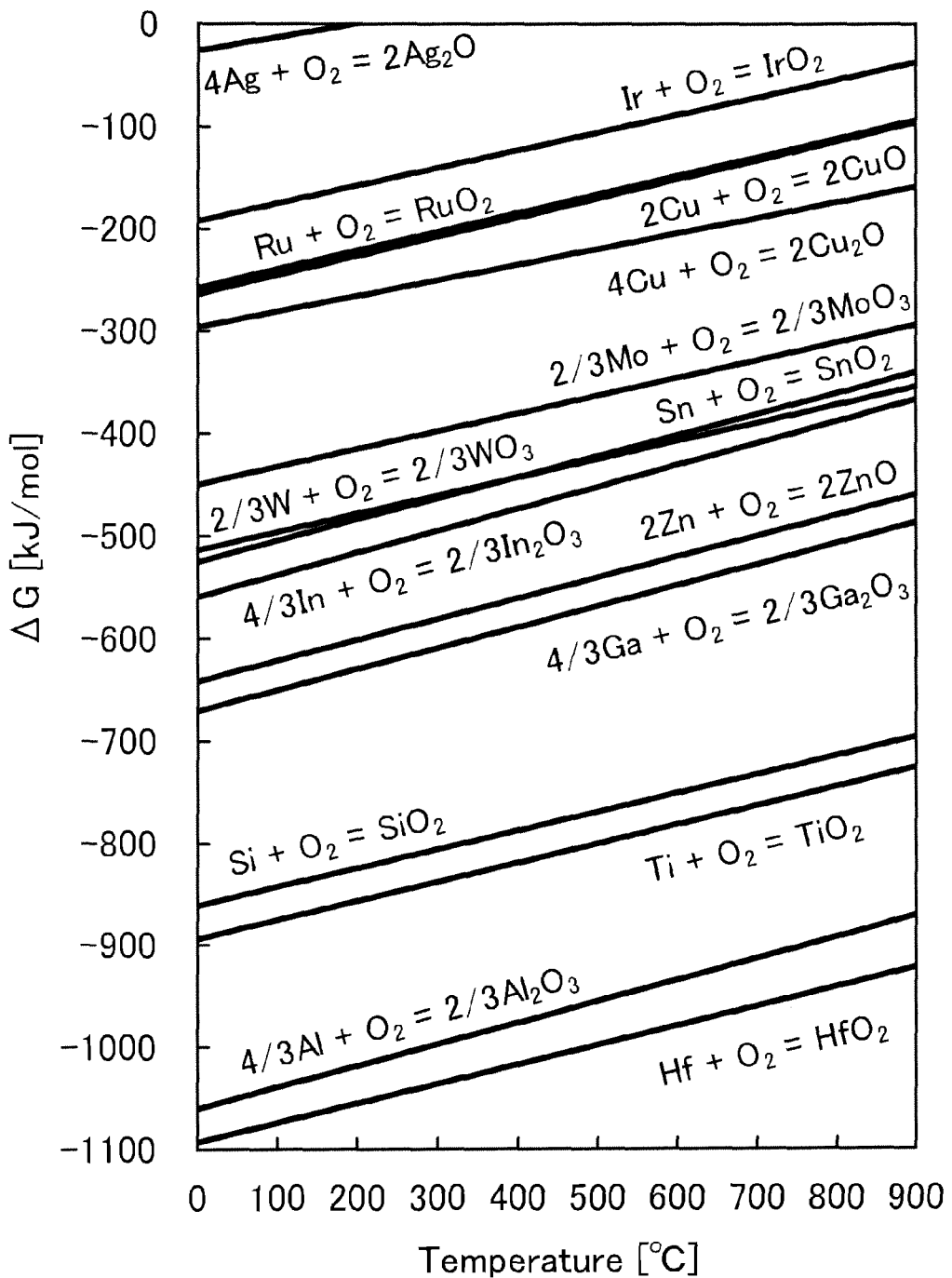
FIG. 9 shows Gibbs free energy of oxidation reaction of metals.

FIG. 9 shows calculation results of Gibbs free energy of oxidation reaction in each metal in the temperature range from 0° C. to 900° C. The horizontal axis indicates temperature [° C.], and the vertical axis indicates Gibbs free energy ΔG [kJ/mol].

From the graph shown in FIG. 9, it can be found that reactions in which oxidation reaction is likely to occur, that is, reactions of metals which are likely to become oxidized are shown in the lower side of FIG. 9, and reactions in which reduction reaction is likely to occur, that is, reactions of metals which are likely to become reduced are shown in the upper side of FIG. 9. The metals having a higher oxidation resistance than the metal element included in the oxide semiconductor film 403 may be any metal as long as the metal is a metal shown in the upper side of FIG. 9.

For example, when the oxide semiconductor film 403 includes an In—Ga—Zn-based oxide, the metal element included in the metal films 406a and 406b may be any metal as long as the metal has a higher oxidation resistance than indium, gallium, and zinc (at least the metal has higher Gibbs free energy of oxidation reaction than indium, gallium, and zinc). When the oxide semiconductor film 403 includes an In—Sn—Zn-based oxide, the metal element included in the metal films 406a and 406b may be any metal as long as the metal has a higher oxidation resistance than indium, tin, and zinc (at least the metal has higher Gibbs free energy of oxidation reaction than indium, tin, and zinc).

However, an increase in heat treatment temperature leads to diffusion of oxygen even in a tungsten film or a molybdenum film, which has a higher oxidation resistance than indium or the like, in some cases. This causes formation of a high resistance component in the tungsten film or the molybdenum film, which poses a problem in which the on-state current of the transistor is reduced. Accordingly, for the metal films 406a and 406b, it is preferable to use a metal having a higher oxidation resistance than molybdenum (a metal having higher Gibbs free energy of oxidation reaction than molybdenum). Specific examples are copper, silver, ruthenium, and iridium shown in FIG. 9.

Using copper, silver, ruthenium, iridium, or the like for the metal films 406a and 406b can prevent extraction of oxygen from the oxide semiconductor film 403; accordingly, an increase in oxygen vacancies in the oxide semiconductor film 403 can be suppressed, and thus a shift of the threshold voltage of the transistor 410 in the negative direction can be suppressed.

Since the metal films 406a and 406b are not likely to become oxidized and thus the diffusion of oxygen in the metal films 406a and 406b can be suppressed, the formation of the high resistance component in the metal films 406a and 406b can be suppressed. Accordingly, the resistance due to the oxide semiconductor film 403, the source electrode layer 407a, and the drain electrode layer 407b can be reduced, so that the decrease in on-state current of the transistor 410 can be suppressed.

It is preferable that the metal films (e.g., a film of copper, silver, or ruthenium) having a work function of ±0.2 eV of the electron affinity of the oxide semiconductor film 403 be selected as the metal films 406a and 406b because the contact resistances between the oxide semiconductor film 403 and each of the source electrode layer 407a and the drain electrode layer 407b can be reduced. Thus, the resistance due to the oxide semiconductor film 403, the source electrode layer 407a, and the drain electrode layer 407b can be reduced, so that the decrease in on-state current of the transistor can be suppressed.

For example, when the electron affinity of an In—Ga—Zn-based oxide semiconductor is 4.6 [eV], ruthenium having a work function of 4.71 [eV] is preferably used. Such materials are used for the oxide semiconductor film 403 and the metal films 406a and 406b, so that the contact resistance can be reduced.

The metals shown in FIG. 9 are listed below in descending order of Gibbs free energy of oxidation reaction.

Au, Pt, Ag, Ir, Ru, Cu, Mo, W, Sn, In, Zn, Ga, Si, Ti, Al, Hf

Further, the conductive films 405a and 405b which are stacked over the metal films 406a and 406b, respectively, preferably include materials with which an oxide film is not formed at the interface with the metal films 406a and 406b. Examples of a material which can be used for the conductive films 405a and 405b are, in addition to the materials which can be used for the metal films 406a and 406b, gold, platinum, titanium, tungsten, titanium nitride, molybdenum nitride, tungsten nitride, and tantalum nitride. The conductive films 405a and 405b have a single-layer structure or a stacked-layer structure. The stacked-layer structure of the conductive films 405a and 405b can be formed of a tantalum nitride film and a tungsten film.

The transistor 410 illustrated in FIGS. 1A, 1B, and 1C includes the source electrode layer 407a and the drain electrode layer 407b which include the metal films 406a and 406b and the conductive films 405a and 405b formed using the same material. Thus, the interface between the metal film 406a and the conductive films 405a and the interface between the metal film 406b and the conductive films 405b are shown by dotted lines. In the case of the transistor 410 illustrated in FIGS. 1A to 1C, for example, ruthenium can be used for the metal films 406a and 406b and the conductive films 405a and 405b.

The transistor 410 may include metal oxide in part of the metal films 406a and 406b. For example, when the metal films 406a and 406b include ruthenium, ruthenium oxide may be formed in part of the metal films 406a and 406b. Even when ruthenium oxide is formed in part of the metal film, the resistivity of the ruthenium oxide is $3.5 \times 10^{-5}$ [cmΩ] (300K), and a high resistance component is not formed in a source electrode layer and a drain electrode layer, which is preferable.

The energy gap of the oxide semiconductor film 403 is 2.8 eV to 3.2 eV, which is greater than that of silicon (1.1 eV). The minor carrier density of the oxide semiconductor film 403 is $10^{-9}$ cm$^{-3}$, which is much smaller than the intrinsic carrier density of silicon ($10^{11}$ cm$^{-3}$).

Majority carriers (electrons) of the oxide semiconductor film 403 flow only from a source of a transistor. Further, a channel formation region can be depleted completely. Thus, an off-state current of the transistor can be extremely small. The off-state current of the transistor including the oxide semiconductor film 403 is as small as 10 yA/μm or less at room temperature, or 1 zA/μm or less at 85° C. to 95° C.

The transistor including the oxide semiconductor film 403 has a small S value, so that an ideal value can be obtained. Further, the transistor has high reliability.

Next, a transistor which has a partly different structure from the transistor 410 illustrated in FIGS. 1A to 1C is described with reference to FIGS. 2A and 2B.

Figure 2A:
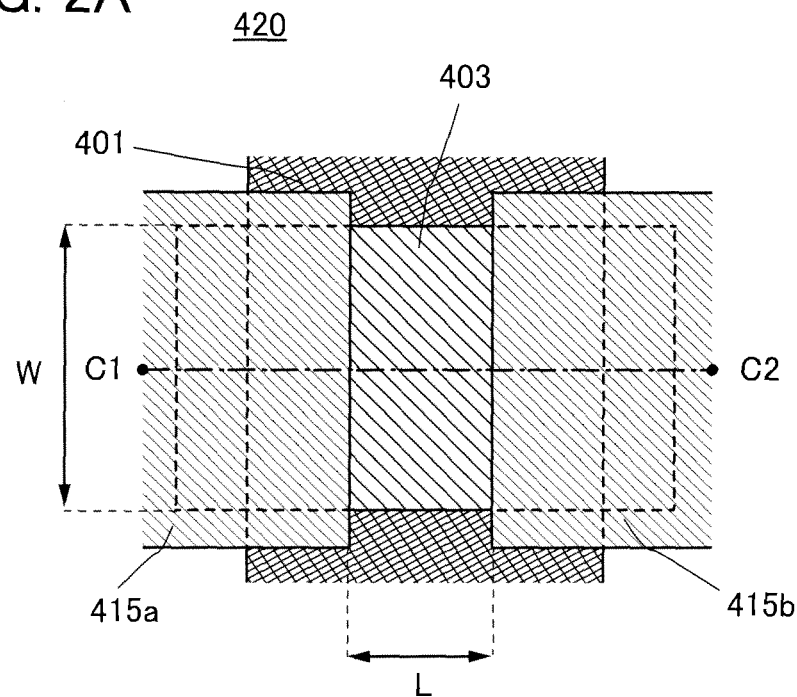
FIGS. 2A and 2B are a plan view and a cross-sectional view illustrating one embodiment of a semiconductor device.
Figure 2B:
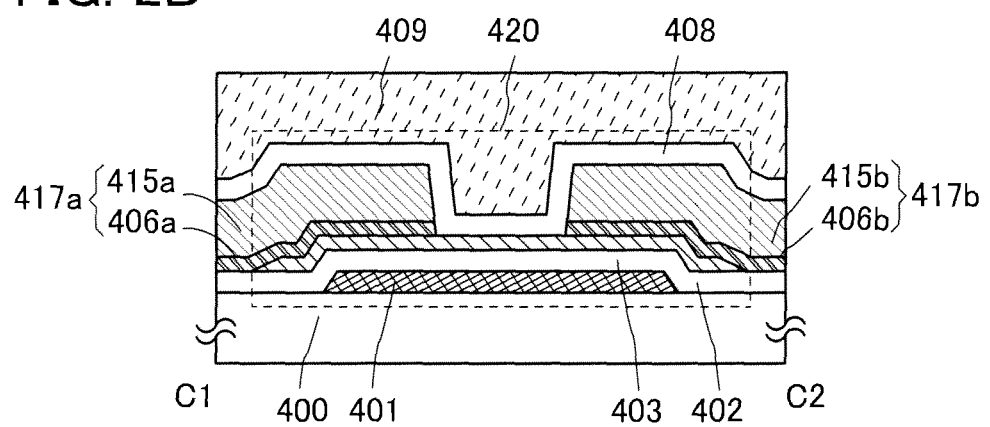

FIG. 2A is a plan view of a transistor 420, and FIG. 2B is a cross-sectional view taken along line C1-C2 in FIG. 2A (a cross-sectional view in the channel length direction of the transistor 420). Further, in FIG. 2A, some components of the transistor 420 (e.g., the gate insulating film 402) are not illustrated to avoid complexity.

In a source electrode layer 417a and a drain electrode layer 417b of the transistor 420 illustrated in FIGS. 2A and 2B, the material for the metal films 406a and 406b and the material for the conductive films 415a and 415b may be selected so as to be different from each other. Thus, the interface between the metal film 406a and the conductive films 415a and the interface between the metal film 406b and the conductive films 415b are shown by solid lines. Note that the conductive films 415a and 415b are formed using the same material as that of the conductive films 405a and 405b, and have a single-layer structure or a stacked-layer structure. In the case of the transistor 420 illustrated in FIGS. 2A and 2B, for example, ruthenium can be used for the metal films 406a and 406b, and tantalum nitride can be used for the conductive films 415a and 415b.

The structure of transistor 420 is similar to that of the transistor 410 except for the material of the source electrode layer 417a and the drain electrode layer 417b; thus, the description of the transistor 410 can be referred to.

As described above, a metal having a higher oxidation resistance than the metal element included in the oxide semiconductor film 403 (a metal having higher Gibbs free energy of oxidation reaction than at least indium, gallium, zinc, and tin) is used for the metal films 406a and 406b, which are in contact with the oxide semiconductor film 403; accordingly, extraction of oxygen from the oxide semiconductor film 403 can be prevented. Thus, an increase in oxygen vacancies at the interface between the oxide semiconductor film 403 and each of the source electrode layer 417a and the drain electrode layer 417b can be suppressed, whereby a shift of the threshold voltage of the transistor in the negative direction can be suppressed.

Further, since the metal films 406a and 406b are not likely to become oxidized as compared to the oxide semiconductor film 403 and thus diffusion of oxygen in the metal films 406a and 406b can be suppressed, the formation of the high resistance component in the metal films 406a and 406b can be suppressed. Accordingly, the resistance due to the oxide semiconductor film, the source electrode layer, and the drain electrode layer can be reduced, so that the decrease in on-state current of the transistor can be suppressed.

The structures, methods, and the like described in this embodiment can be combined as appropriate with any of the structures, methods, and the like described in the other embodiments.

Embodiment 2

In this embodiment, an example of a method for manufacturing a semiconductor device including the transistor 410 illustrated in FIGS. 1A to 1C is described with reference to FIGS. 3A to 3E.

There is no particular limitation on a substrate that can be used as the substrate 400 having an insulating surface as long as it has at least heat resistance to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400. Alternatively, any of these substrates provided with a semiconductor element may be used as the substrate 400.

The semiconductor device may be manufactured using a flexible substrate as the substrate 400. In order to manufacture a flexible semiconductor device, the transistor 410 including the oxide semiconductor film 403 may be directly formed over a flexible substrate. Alternatively, the transistor 410 including the oxide semiconductor film 403 may be formed over a manufacturing substrate, and then, the transistor 410 may be separated from the manufacturing substrate and transferred to a flexible substrate. Note that in order to separate the transistor from the manufacturing substrate and transfer it to the flexible substrate, a separation layer may be provided between the manufacturing substrate and the transistor 410 including the oxide semiconductor film 403.

Next, an insulating film functioning as a base film may be formed over the substrate 400. The insulating film can be formed by a plasma CVD method or a sputtering method using an oxide insulating film of silicon oxide, silicon oxynitride, aluminum oxide, aluminum oxynitride, hafnium oxide, or gallium oxide; a nitride insulating film of silicon oxide, silicon oxynitride, aluminum nitride, or aluminum nitride oxide; or a film of a mixed material of any of the above materials. For example, a stacked-layer structure of a silicon nitride film and a silicon oxynitride film is applied to the insulating film, which suppresses the entry of a metal or hydrogen from the substrate to the oxide semiconductor film formed later, which is preferable.

The insulating film functioning as a base film (in the case where the insulating film has a stacked-layer structure, one of the stacked films that is in contact with the oxide semiconductor film 403) preferably contains oxygen which exceeds at least the stoichiometric composition in the film (bulk). For example, when a silicon oxide film is used as the insulating film, the amount of oxygen is preferably $SiO_2+\alpha$ (where $\alpha>0$).

An insulating film containing much (excessive) oxygen, which serves as an oxygen supply source, may be provided so as to be in contact with the oxide semiconductor film 403, whereby oxygen can be supplied from the insulating film to the oxide semiconductor film 403. Further, the oxide semiconductor film 403 and the insulating film may be subjected to heat treatment in a state where the oxide semiconductor film 403 and the insulating film are at least partly in contact with each other so that oxygen is supplied to the oxide semiconductor film 403. By using the insulating film containing much oxygen, oxygen can be supplied to the oxide semiconductor film 403, so that the oxygen vacancies in the oxide semiconductor film 403 can be reduced.

Next, a conductive film which is to be a gate electrode layer (including a wiring formed using the same layer as the gate electrode layer) is formed over the substrate 400. The conductive film can be formed using a metal material such as molybdenum, titanium, tantalum, tungsten, aluminum, copper, chromium, neodymium, or scandium, or an alloy material containing any of these materials as a main component. The conductive film has a single-layer structure or a stacked-layer structure.

The conductive film can also be formed using a conductive material such as indium tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the conductive film has a stacked structure of the above conductive material and the above metal material.

As the conductive film, which is formed later and to be in contact with the gate insulating film 402, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film can be used. These films each have a work function of 5 eV or higher, preferably 5.5 eV or higher, which enables the threshold voltage of the transistor to take a positive value when used as the gate electrode layer, so that a switching element of what is called normally-off type can be realized.

Next, in a photolithography process, a resist mask is formed over the conductive film and selective etching is performed, so that the gate electrode layer 401 is formed. After the gate electrode layer 401 is formed, the resist mask is removed. Note that the etching of the conductive film may be performed by dry etching, wet etching, or both of them.

Heat treatment may be conducted on the substrate 400 and the gate electrode layer 401 after the formation of the gate electrode layer 401. For example, the heat treatment may be conducted with a GRTA apparatus at 650° C. for 1 minute to 5 minutes. Alternatively, the heat treatment may be conducted with an electric furnace at 500° C. for 30 minutes to 1 hour. The heat treatment enables removal of hydrogen, moisture, or the like from the substrate 400 or the gate electrode layer 401.

Next, the gate insulating film 402 is formed over the gate electrode layer 401.

To improve the coverage with the gate insulating film 402, planarization treatment may be performed on a surface of the gate electrode layer 401. It is preferable that the flatness of the surface of the gate electrode layer 401 be good particularly when the thickness of the gate insulating film 402 is small.

The gate insulating film 402 has a thickness greater than or equal to 1 nm and less than or equal to 20 nm and can be formed by a sputtering method, an MBE method, a CVD method, a PECVD method, a pulsed laser deposition method, an ALD method, or the like as appropriate. The gate insulating film 402 may be formed with a sputtering apparatus which performs film deposition on surfaces of a plurality of substrates set substantially perpendicular to a surface of a sputtering target.

The gate insulating film 402 can be formed using silicon oxide, gallium oxide, aluminum oxide, silicon nitride, silicon oxynitride, aluminum oxynitride, or silicon nitride oxide. The gate insulating film 402 can be formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide, whereby gate leakage current can be reduced. The gate insulating film 402 can be formed to have a single-layer structure or a layered structure using any of the above materials.

It is preferable that the gate insulating film 402 contain oxygen in a portion in contact with the oxide semiconductor film 403 formed later. In particular, the gate insulating film 402 preferably contains a large amount of oxygen which exceeds at least the amount of oxygen in the stoichiometric composition in the film (bulk). For example, in the case where a silicon oxide film is used as the gate insulating film 402, the composition formula is $SiO_{2+\alpha}$ ($\alpha>0$).

The gate insulating film 402 containing much (excess) oxygen, which serves as an oxygen supply source, may be provided so as to be in contact with the oxide semiconductor film 403 formed later, whereby oxygen can be supplied from the gate insulating film 402 to the oxide semiconductor film 403. Heat treatment may be performed in the state where the oxide semiconductor film 403 and the gate insulating film 402 are in contact with each other at least partly to supply oxygen from the gate insulating film 402 to the oxide semiconductor film 403.

By supply of oxygen to the oxide semiconductor film 403, oxygen vacancies in the oxide semiconductor film 403 can be reduced. Further, the gate insulating film 402 is preferably formed in consideration of the size of a transistor to be formed and the step coverage with the gate insulating film 402.

After the formation of the gate insulating film 402, heat treatment may be conducted on the substrate 400, the gate electrode layer 401, and the gate insulating film 402. For example, the heat treatment may be conducted with a GRTA apparatus at 650° C. for 1 minute to 5 minutes. Alternatively, the heat treatment may be conducted with an electric furnace at 500° C. for 30 minutes to 1 hour. The heat treatment enables removal of hydrogen, moisture, or the like contained in the gate insulating film 402.

Next, an oxide semiconductor film is formed over the gate insulating film 402. After that, in a photolithography process, a resist mask is formed over the oxide semiconductor film and selective etching is performed, so that the island-shaped oxide semiconductor film 403 is formed (see FIG. 3A). After the oxide semiconductor film 403 is formed, the resist mask is removed. Note that the etching of the oxide semiconductor film 403 may be dry etching, wet etching, or both dry etching and wet etching.

A resist mask for forming the island-shaped oxide semiconductor film 403 may be formed by an inkjet method. Formation of the resist mask by an inkjet method needs no photomask; thus, manufacturing cost can be reduced.

Note that the etching of the oxide semiconductor film may be dry etching, wet etching, or both dry etching and wet etching. Examples of an etchant used for wet etching of the oxide semiconductor film are a mixed solution of phosphoric acid, acetic acid, and nitric acid. Alternatively, ITO-07N (produced by KANTO CHEMICAL CO., INC.) may be used. Further alternatively, the oxide semiconductor film may be etched by a dry etching method using an inductively coupled plasma (ICP) etching method.

An oxide semiconductor used for the oxide semiconductor film 403 contains at least indium (In). In particular, In and zinc (Zn) are preferably contained. In addition, as a stabilizer for reducing variation in electric characteristics of a transistor formed using the oxide semiconductor film, gallium (Ga) is preferably contained in addition to In and Zn. It is preferable that one or more elements selected from tin (Sn), hafnium (Hf), aluminum (Al), and zirconium (Zr) be contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

For example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

A material represented by $InMO_3(ZnO)_m$ (m>0, where m is not an integer) may be used as the oxide semiconductor. Note that M represents one or more metal elements selected from Ga, Fe, Mn, and Co. Alternatively, a material represented by $In_2SnO_5(ZnO)_n$ (n>0, where n is an integer) may be used as the oxide semiconductor.

For example, an In—Ga—Zn-based oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or an oxide with an atomic ratio in the neighborhood of the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio in the neighborhood of the above atomic ratios may be used.

However, without limitation to the materials given above, a material with an appropriate composition may be used as the oxide semiconductor containing indium depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, mobility can also be increased by reducing the defect density in a bulk in the case of using an In—Ga—Zn-based oxide.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$, and r may be 0.05, for example. The same applies to other oxides.

The oxide semiconductor film 403 is in a single crystal state, a polycrystalline (also referred to as polycrystal) state, an amorphous state, or the like.

The oxide semiconductor film 403 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. Further, from an observation image obtained with a transmission electron microscope (TEM), a boundary between an amorphous part and a crystal part in the CAAC-OS film is not necessarily clear. Further, with the TEM, a grain boundary is not observed in the CAAC-OS film. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in the impurity-added region becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light is reduced. Thus, the transistor has high reliability.

Note that part of oxygen included in the oxide semiconductor film may be substituted with nitrogen.

In an oxide semiconductor having a crystal part such as the CAAC-OS film, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with an average surface roughness ($R_a$) of less than or equal to 1 nm, preferably less than or equal to 0.3 nm, further preferably less than or equal to 0.1 nm.

Note that $R_a$ is obtained by expanding arithmetic mean surface roughness, which is defined by JIS B 0601: 2001 (ISO4287: 1997), into three dimensions so as to be applied to a curved surface. $R_a$ can be expressed as an "average value of the absolute values of deviations from a reference surface to a designated surface" and is defined by Formula 2.

$$Ra = \frac{1}{S_0} \int_{y_1}^{y_2} \int_{x_1}^{x_2} |f(x, y) - Z_0| dx dy. \qquad \text{[FORMULA 2]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the designated surface on the xy plane, and $Z_0$ represents the height of the reference surface (the average height of the designated surface). $R_a$ can be measured using an atomic force microscope (AFM).

In order to improve the planarity of the surface of the oxide semiconductor film 403, planarization treatment is preferably performed on a region which is in the gate insulating film 402 and which is in contact with the oxide semiconductor film 403. The planarization treatment may be, but not particularly limited to, polishing treatment (such as chemical mechanical polishing (CMP)), a dry etching treatment, or a plasma treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the gate insulating film 402.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the gate insulating film 402.

The oxide semiconductor film 403 has a thickness greater than or equal to 1 nm and less than or equal to 200 nm (preferably greater than or equal to 5 nm and less than or equal to 50 nm) and can be formed by a sputtering method, a molecular beam epitaxy (MBE) method, a CVD method, a pulse laser deposition method, an atomic layer deposition (ALD) method, or the like as appropriate. The oxide semiconductor film 403 may be formed with a sputtering apparatus which performs deposition in the state where surfaces of a plurality of substrates are substantially perpendicular to a surface of a sputtering target.

Further, the concentration of hydrogen or water contained in the oxide semiconductor film 403 is preferably as low as possible. This is because if the concentration of hydrogen is high, by a bond of hydrogen and an element contained in an oxide semiconductor, part of hydrogen serves as a donor and generates electrons as carriers.

Therefore, in order to prevent the oxide semiconductor film 403 from containing hydrogen or water as much as possible in the step for forming the oxide semiconductor film 403, it is preferable to preheat the substrate provided with the gate insulating film 402 in a preheating chamber of a sputtering apparatus as pretreatment for formation of the oxide semiconductor film 403 so that impurities such as hydrogen and moisture adsorbed to the substrate and the gate insulating film 402 are eliminated and removed. As an exhaustion unit provided in the preheating chamber, a cryopump is preferable.

The oxide semiconductor film 403 is preferably formed under a condition such that much oxygen is contained (for example, by a sputtering method in an atmosphere of 100% oxygen) to be a film containing much oxygen (preferably having a region containing an excess of oxygen as compared to the stoichiometric composition of the oxide semiconductor in a crystalline state).

In this embodiment, as the oxide semiconductor film 403, a 35-nm-thick In—Ga—Zn-based oxide film (an IGZO film) is formed by a sputtering method using a sputtering apparatus that includes an AC power supply device. In this embodiment, an In—Ga—Zn-based oxide target with an atomic ratio of In:Ga:Zn=3:1:2 is used. The deposition conditions are as follows: the atmosphere is oxygen and argon (the flow rate of oxygen: 50%), the pressure is 0.4 Pa, the power supply is 0.5 kW, and the substrate temperature is 200° C.

It is preferable that a high-purity gas from which impurities such as hydrogen, water, a hydroxyl group, or hydride are removed be used as a sputtering gas for the formation of the oxide semiconductor film 403.

The substrate is held in a film formation chamber kept under reduced pressure. Then, a sputtering gas in which hydrogen and moisture are removed is introduced into the deposition chamber from which remaining moisture is being removed, and the oxide semiconductor film 403 is formed over the substrate 400 using the target. In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. From the deposition chamber which is evacuated with a cryopump, a hydrogen atom, a compound containing a hydrogen atom, such as water ($H_2O$), (preferably also a compound containing a carbon atom), and the like are removed, whereby the concentration of an impurity such as hydrogen, water, a hydroxyl group, or hydride in the oxide semiconductor film 403 formed in the deposition chamber can be reduced.

Further, it is preferable to form the gate insulating film 402 and the oxide semiconductor film 403 successively without exposure of the gate insulating film 402 to the air. The successive formation of the gate insulating film 402 and the oxide semiconductor film 403 without exposure of the gate insulating film 402 to the air can prevent impurities such as hydrogen and moisture from adsorbing onto the surface of the gate insulating film 402.

Further, heat treatment may be performed on the oxide semiconductor film 403 in order to remove excess hydrogen (including water and a hydroxyl group) (to perform dehydration or dehydrogenation treatment). The temperature of the heat treatment is higher than or equal to 300° C. and lower than or equal to 700° C., or lower than the strain point of the substrate. The heat treatment can be performed under reduced pressure, a nitrogen atmosphere, or the like.

In the case of using a crystalline oxide semiconductor film as the oxide semiconductor film 403, heat treatment for crystallization may be conducted.

In this embodiment, the substrate is introduced into an electric furnace which is a kind of heat treatment apparatus, and the oxide semiconductor film 403 is subjected to heat treatment at 450° C. in a nitrogen atmosphere for 1 hour and then heat treatment at 450° C. in an atmosphere including nitrogen and oxygen for 1 hour.

Further, a heat treatment apparatus used is not limited to an electric furnace, and an apparatus for heating a process object by heat conduction or heat radiation from a heating element such as a resistance heating element may be alternatively used. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

Note that in heat treatment, it is preferable that water, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor film 403 is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, further preferably less than or equal to 10 ppb in the measurement with the use of a dew point meter of a cavity ring down laser spectroscopy (CRDS) system) may be introduced into the same furnace. It is preferable that water, hydrogen, and the like be not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main constituent material of the oxide semiconductor and that is reduced by the step for removing impurities for dehydration or dehydrogenation, so that the oxygen vacancies in the oxide semiconductor film 403 can be reduced.

The heat treatment for dehydration or dehydrogenation may be performed before or after the oxide semiconductor film is processed into an island shape.

Further, the heat treatment for dehydration or dehydrogenation may be performed plural times and may be combined with another heat treatment.

When the heat treatment for dehydration or dehydrogenation is performed in the state where the gate insulating film 402 is covered with the film-shaped oxide semiconductor film which has not been processed into the island-shaped oxide semiconductor film 403, oxygen contained in the gate insulating film 402 can be prevented from being released to the outside by the heat treatment.

Figure 3A:
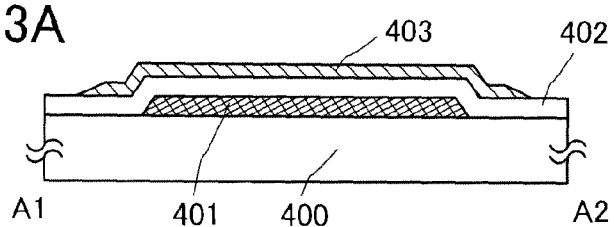
FIGS. 3A to 3E are cross-sectional views illustrating one embodiment of a method for manufacturing a semiconductor device.
Figure 3B:
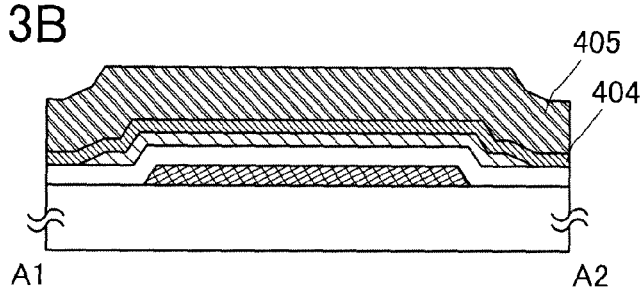

Next, a metal oxide film 404 and a conductive film 405 which are to be a source electrode layer and a drain electrode layer (including a wiring formed using the same layer as the source electrode layer and the drain electrode layer) is formed over the gate electrode layer 401, the gate insulating film 402, and the oxide semiconductor film 403 (see FIG. 3B).

A metal oxide film having a higher reducing property than the oxide semiconductor film 403 is used for the metal oxide film 404. The metal oxide film having a higher reducing property than the oxide semiconductor film 403 may include any metal oxide as long as the metal oxide has a higher reducing property than indium oxide, gallium oxide, zinc oxide, and tin oxide (that is, the metal in the metal oxide has higher Gibbs free energy of oxidation reaction than indium, gallium, zinc, and tin) as shown in FIG. 9. Specific examples are copper oxide, silver oxide, ruthenium oxide, and iridium oxide. The metal oxide film 404 is formed to have a single-layer structure or a stacked-layer structure.

The thickness of the metal oxide film 404 is greater than or equal to 1 nm and smaller than or equal to 50 nm, preferably greater than or equal to 1 nm and smaller than or equal to 30 nm, further preferably greater than or equal to 5 nm and smaller than or equal to 10 nm. The metal oxide film 404 can be formed by a sputtering method, a CVD method, or the like as appropriate.

In this embodiment, as the metal oxide film 404, a 10-nm-thick ruthenium oxide film is formed by a sputtering method.

The conductive film 405 may be formed using a material that can withstand heat treatment performed later. Further, the conductive film 405 is preferably formed using a material with which an oxide film is not formed at the interface between the conductive film 405 and the metal oxide film 404 by heat treatment performed later. For the conductive film 405, for example, gold, platinum, copper, silver, ruthenium, iridium, titanium, tungsten, titanium nitride, molybdenum nitride, tungsten nitride, and tantalum nitride, and the like can be used. The conductive film 405 is preferably formed thicker than the metal oxide film 404, and is formed to have a single-layer structure or a stacked-layer structure. In the case of a stacked-layer structure, a tungsten film may be formed over a tantalum nitride film to form the conductive film 405.

The thickness of the conductive film 405 is greater than or equal to 50 nm and smaller than or equal to 600 nm. The conductive film 405 can be formed by a sputtering method, a CVD method, or the like as appropriate.

In this embodiment, as the conductive film 405, a 200-nm-thick ruthenium film is formed by a sputtering method.

Figure 3C:
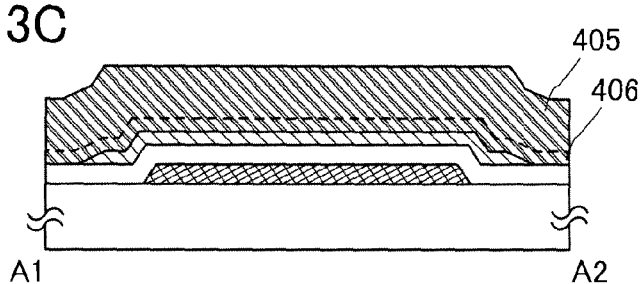

Next, heat treatment is performed on the oxide semiconductor film 403, the metal oxide film 404, and the conductive film 405 (see FIG. 3C). Heat treatment is performed while the metal oxide film 404 is in contact with the oxide semiconductor film 403, so that oxygen is released from the metal oxide film 404 and is supplied to the oxide semiconductor film 403. By supply of oxygen to the oxide semiconductor film 403, oxygen vacancies in the oxide semiconductor film 403 can be reduced. The metal oxide film 404 which has a higher reducing property than the oxide semiconductor film 403 is reduced to form the metal film 406.

The case where the metal oxide film 404 is completely reduced to the metal film 406 has been described with reference to FIG. 3C; however, the following case is also possible: only a portion in the vicinity of the interface between the metal oxide film 404 and the oxide semiconductor film 403 is reduced to be the metal film 406, and the other portion which is not in the vicinity of the interface remains the metal oxide film 404. For example, when ruthenium oxide is used for the metal oxide film 404, only a portion in the vicinity of the interface may be reduced to be ruthenium, and the other portion which is not in the vicinity of the interface may remain ruthenium oxide. Even when the other portion which is not in the vicinity of the interface remains ruthenium oxide, the resistivity of the ruthenium oxide is $3.5 \times 10^{-5}$ [cmΩ] (300K), and a high resistance component is not formed in a source electrode layer and a drain electrode layer, which is preferable.

The metal film 406 which is formed by reduction of the metal oxide film 404 has a higher oxidation resistance than the metal element included in the oxide semiconductor film 403; that is, the metal film 406 is a film in which oxygen is not likely to be diffused in the metal film 406.

As described in this embodiment, heat treatment is performed while the metal oxide film 404 covers the oxide semiconductor film 403, whereby oxygen is supplied to a channel formation region formed later. Therefore, oxygen vacancies are reduced, which is preferable.

Heat treatment is performed while the conductive film 405 is provided over the metal oxide film 404, whereby oxygen contained in the metal oxide film 404 is not released to the outside and is supplied to the oxide semiconductor film 403, which is preferable.

The heat treatment is performed in an inert gas (nitrogen, or a rare gas such as helium, neon, argon, krypton, or xenon) atmosphere, an atmosphere containing an oxidizing gas at 10 ppm or more, preferably 1% or more, further preferably 10% or more, or a reduced pressure state (10 Pa or lower, preferably 1 pa or lower, further preferably 0.1 Pa or lower), at a temperature higher than or equal to 150° C. and lower than or equal to 650° C., preferably higher than or equal to 200° C. and lower than or equal to 450° C.

In this embodiment, the heat treatment may be conducted with a GRTA apparatus at 650° C. for 1 minute to 5 minutes. Alternatively, the heat treatment may be conducted with an electric furnace at 500° C. for 30 minutes to 1 hour.

Figure 3D:
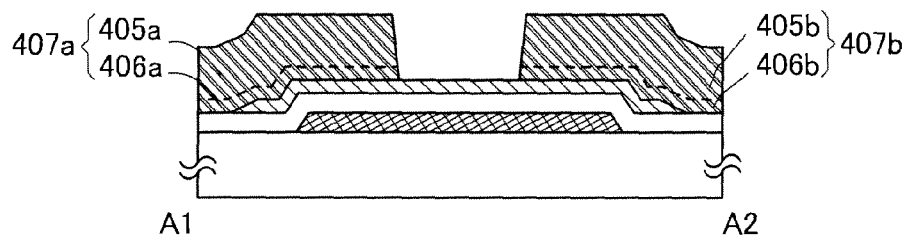

After that, in a photolithography process, a resist mask is formed over the conductive film 405 and selective etching is performed, so that the metal films 406a and 406b and the conductive films 405a and 405b are formed (see FIG. 3D). The metal film 406a and the conductive film 405a function as the source electrode layer 407a, and the metal film 406b and the conductive film 405b function as the drain electrode layer 407b. After the source electrode layer 407a and the drain electrode layer 407b are formed, the resist mask is removed.

Ultraviolet, KrF laser light, or ArF laser light is preferably used for light exposure at the time of forming the resist mask. The channel length L of the transistor 410, which is formed later, is determined by the distance between a lower edge of the source electrode layer 407a and a lower edge of the drain electrode layer 407b, which are adjacent to each other over the oxide semiconductor film 403. In the case where the channel length L is less than 25 nm, the light exposure at the time of forming the resist mask can be performed using extreme ultraviolet having an extremely short wavelength of several nanometers to several tens of nanometers. In the light exposure by extreme ultraviolet light, the resolution is high and the focus depth is large. Therefore, the channel length L of the transistor, which is formed later, can be 10 to 1000 nm, and thus the operation rate of the circuit can be increased.

In order to reduce the number of photomasks used in a photolithography step and reduce the number of photolithography steps, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

As the etching gas used for etching the conductive film 405 and the metal film 406, a gas containing halogen can be used. A gas containing chlorine such as a gas containing chlorine ($Cl_2$), boron trichloride ($BCl_3$), silicon tetrachloride ($SiCl_4$), or carbon tetrachloride ($CCl_4$) can be used as the gas containing halogen. Alternatively, a gas containing fluorine such as a gas containing carbon tetrafluoride ($CF_4$), sulfur hexafluoride ($SF_6$), nitrogen trifluoride ($NF_3$), or trifluoromethane ($CHF_3$) can be used as the gas containing halogen. Alternatively, any of the above-mentioned gases to which a rare gas such as helium (He) or argon (Ar) is added, or the like can be used.

Plasma treatment using an etching gas containing a halogen element is preferably used for the etching of a film which is over and in contact with the oxide semiconductor film 403. However, exposure of the oxide semiconductor film to the etching gas containing a halogen element might cause extraction of oxygen in the oxide semiconductor film due to the halogen element contained in the etching gas, in which case an oxygen vacancy might be formed in the vicinity of a surface of the oxide semiconductor film.

For example, when the metal film 406 is formed using ruthenium, oxygen or a mixed gas of oxygen and a rare gas such as argon can be used as the etching gas. An etching gas containing a halogen element is not needed for the etching of the film which is over and in contact with the oxide semiconductor film 403; accordingly, extraction of oxygen from the oxide semiconductor film 403 can be suppressed. Further, oxygen can be supplied to the oxide semiconductor film 403. It is more preferable that the metal film 406 and the conductive film 405 be formed using ruthenium.

As the etching method, a parallel plate reactive ion etching (RIE) method or an inductively coupled plasma (ICP) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

Note that it is preferable that the etching condition for the conductive film 405 and the metal film 406 be optimized in order to prevent the oxide semiconductor film 403 from being etched to be removed or divided in the etching step of the conductive film 405 and the metal film 406. However, it is difficult to obtain a condition under which only the conductive film 405 and the metal film 406 are etched and the oxide semiconductor film 403 is not etched at all. Therefore, in some cases, part of the oxide semiconductor film 403 is removed when the conductive film 405 and the metal film 406 are etched, so that the oxide semiconductor film 403 may have a groove (depression).

Figure 3E:
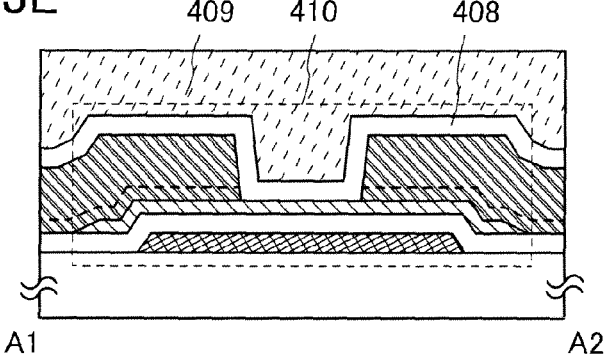

Through the above process, the transistor 410 according to one embodiment of the present invention is formed (see FIG. 3E).

In this embodiment, the insulating film 408 serving as an inorganic insulating film is formed over the source electrode layer 407a and the drain electrode layer 407b to be in contact with the oxide semiconductor film 403.

The insulating film 408 can be formed to a thickness of at least 1 nm by a method such as a sputtering method, in which an impurity such as water or hydrogen does not enter the insulating film 408. When hydrogen is contained in the insulating film 408, entry of the hydrogen into the oxide semiconductor film 403 or extraction of oxygen from the oxide semiconductor film 403 by the hydrogen may occur; thus, the backchannel of the oxide semiconductor film 403 might have lower resistance (n-type conductivity) and a parasitic channel might be formed. Thus, it is important that a deposition method in which hydrogen is not used is employed in order to form the insulating film 408 containing hydrogen as little as possible.

The insulating film 408 can have a single-layer structure or a stacked structure including inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film.

In the case of performing a heating step as the dehydration or dehydrogenation treatment, it is preferable to supply oxygen to the dehydrated or dehydrogenated oxide semiconductor film 403. By supply of oxygen to the oxide semiconductor film 403, oxygen vacancies in the film can be further reduced.

In this embodiment, oxygen is supplied to the oxide semiconductor film 403 using the insulating film 408 as a supply source. The insulating film 408 is an oxide insulating film containing oxygen (e.g., a silicon oxide film or a silicon oxynitride film). In the case where the insulating film 408 is used as a supply source of oxygen, the insulating film 408 can favorably function as the supply source of oxygen when being a film including much (an excessive amount of) oxygen (preferably, a film including a region that includes an excessive amount of oxygen that exceeds the amount of oxygen in the stoichiometric composition of the oxide semiconductor in a crystalline state).

In this embodiment, as the insulating film 408, a 300-nm-thick silicon oxide film is formed by a sputtering method. The substrate temperature in film formation may be higher than or equal to room temperature and lower than or equal to 300° C. and in this embodiment, is 100° C. The silicon oxide film can be formed by a sputtering method under a rare gas (a typical example thereof is argon) atmosphere, an oxygen atmosphere, or a mixed atmosphere containing a rare gas and oxygen. As a target, a silicon oxide target or a silicon target may be used. For example, with use of a silicon target, a silicon oxide film can be formed by a sputtering method under an atmosphere containing oxygen.

In order to remove residual moisture from the deposition chamber of the insulating film 408 as in the deposition of the oxide semiconductor film 403, an entrapment vacuum pump (such as a cryopump) is preferably used. When the insulating film 408 is formed in the deposition chamber evacuated using a cryopump, the concentration of impurities in the insulating film 408 can be reduced. In addition, as an exhaustion unit for removing moisture remaining in the deposition chamber of the interlayer insulating film 408, a turbo molecular pump provided with a cold trap may be used.

It is preferable to use a high-purity gas from which impurities such as hydrogen and water are removed as a sputtering gas for the formation of the insulating film 408.

Next, the oxide semiconductor film 403 is subjected to a heating step in a state in which part of the oxide semiconductor film 403 (a channel formation region) is in contact with the insulating film 408.

The heating step is performed at a temperature higher than or equal to 250° C. and lower than or equal to 700° C., preferably higher than or equal to 400° C. and lower than or equal to 700° C. or lower than the strain point of the substrate. For example, the substrate is introduced into an electric furnace which is one of heat treatment apparatuses, and the heating step is performed on the oxide semiconductor film at 250° C. for one hour in a nitrogen atmosphere.

For the heating step, a heating method and a heating apparatus similar to those for the heating step where a dehydration or dehydrogenation treatment is performed can be employed.

The heating step may be performed under reduced pressure, in a nitrogen atmosphere, in an oxygen atmosphere, in ultra-dry air (air in which the moisture amount is less than or equal to 20 ppm (−55° C. by conversion into a dew point), preferably less than or equal to 1 ppm, further preferably less than or equal to 10 ppb, in the measurement with the use of a dew point meter in the cavity ring down laser spectroscopy (CRDS) system), or in a rare gas (argon, helium, or the like) atmosphere. It is preferable that water, hydrogen, and the like be not contained in the nitrogen atmosphere, in the oxygen atmosphere, in the ultra-dry air, in the rare gas atmosphere, or the like. It is also preferable that the purity of nitrogen, oxygen, or the rare gas which is introduced into a heat treatment apparatus be set to be 6N (99.9999%) or higher, preferably 7N (99.99999%) or higher (that is, the impurity concentration is 1 ppm or lower, preferably 0.1 ppm or lower).

The oxide semiconductor film 403 and the insulating film 408 containing oxygen are in contact with each other during the heating step; thus, oxygen, which is decreased through the step for removing impurities, can be supplied from the insulating film 408 containing oxygen to the oxide semiconductor film 403 (channel formation region).

Furthermore, a highly dense inorganic insulating film may be provided over the insulating film 408. For example, an aluminum oxide film is formed over the insulating film 408 by a sputtering method. The aluminum oxide film is formed to have high density (the film density is higher than or equal to 3.2 g/cm$^3$, preferably higher than or equal to 3.6 g/cm$^3$), so that the transistor 410 can have stable electric characteristics. The film density can be measured by Rutherford backscattering spectrometry (RBS) or X-ray reflectmetry (XRR).

An aluminum oxide film which can be used as an inorganic insulating film provided over the transistor 410 has a high shielding effect (blocking effect) of preventing penetration of both oxygen and impurities such as hydrogen and moisture.

Therefore, during the manufacturing process and after the manufacture, the aluminum oxide film functions as a protective film for preventing entry of an impurity such as hydrogen or moisture, which causes a change, into the oxide semiconductor film 403 and release of oxygen, which is a main constituent material of the oxide semiconductor, from the oxide semiconductor film 403.

In this embodiment, the case where oxygen is supplied to the oxide semiconductor film 403 using the insulating film 408 as a supply source is described; however, oxygen (including at least any one of oxygen radicals, oxygen atoms, and oxygen ions) may be introduced into the oxide semiconductor film 403 in order to supply oxygen to the film. Alternatively, oxygen may be supplied to the oxide semiconductor film 403 by combining the methods.

Oxygen can be introduced by an ion implantation method, an ion doping method, a plasma immersion ion implantation method, plasma treatment, or combination thereof.

Oxygen may be introduced to the oxide semiconductor film 403 through the insulating film 408, or may be directly introduced to the exposed oxide semiconductor film 403. An ion implantation method, an ion doping method, a plasma immersion ion implantation method, or the like may be employed in the case where oxygen is introduced to the oxide semiconductor film 403 through the insulating film 408, whereas plasma treatment or the like can be employed in the case where oxygen is directly introduced to the exposed oxide semiconductor film 403.

The timing of the introduction of oxygen into the oxide semiconductor film 403 is not limited to the timing after the formation of the insulating film 408. For example, the introduction may be performed at the timing after formation of the gate insulating film, or after heating of insulating film 408. In the middle of the manufacturing process of a transistor, introduction of oxygen before removal of hydrogen or moisture might causes oxygen vacancies because oxygen in an oxide semiconductor film is extracted in heat treatment. Accordingly, it is preferable to perform a step for supplying oxygen after the heat treatment for removing hydrogen or moisture because oxygen can be efficiently supplied to the oxide semiconductor film 403.

In addition, the planarization insulating film 409 may be formed in order to reduce surface unevenness due to the transistor 410. As the planarization insulating film 409, an organic material such as a polyimide-based resin, an acrylic-based resin, or a benzocyclobutene-based resin can be used. Other than such organic materials, it is also possible to use a low-dielectric constant material (a low-k material) or the like. Note that the planarization insulating film 409 may be formed by stacking a plurality of insulating films formed using these materials.

For example, a 1500-nm-thick acrylic resin film may be formed as the planarization insulating film 409. The acrylic resin film can be formed by coating using a coating method and then baking (e.g., at 250° C. under a nitrogen atmosphere for 1 hour).

Heat treatment may be performed after the planarization insulating film 409 is formed. For example, heat treatment is performed at 250° C. under a nitrogen atmosphere for 1 hour.

As described above, heat treatment may be performed after formation of the transistor 410. The heat treatment may be performed a plurality of times.

Through the above process, a semiconductor device including the transistor 410 illustrated in FIG. 1B is manufactured.

It is preferable that the oxide semiconductor film 403 be highly purified to contain few impurities such as copper, aluminum, and chlorine. It is preferable that steps through which these impurities do not enter the oxide semiconductor film or are not attached to the surface of the oxide semiconductor film be selected as appropriate as the manufacturing process of the transistor. When the impurities are attached to the surface of the oxide semiconductor film, it is preferable to remove impurities on the surface of the oxide semiconductor film by exposure to oxalic acid, diluted hydrofluoric acid, or the like or performance of plasma treatment (e.g., $N_2O$ plasma treatment). Specifically, the concentration of copper in the oxide semiconductor film 403 is preferably smaller than or equal to $1 \times 10^{18}$ atoms/cm$^3$, preferably smaller than or equal to $1 \times 10^{17}$ atoms/cm$^3$; the concentration of aluminum in the oxide semiconductor film is smaller than or equal to $1 \times 10^{18}$ atoms/cm$^3$; and the concentration of chlorine in the oxide semiconductor film is smaller than or equal to $2 \times 10^{18}$ atoms/cm$^3$.

The oxide semiconductor film is preferably in a supersaturated state in which oxygen which exceeds the stoichiometric composition is contained just after its formation. For example, when an oxide semiconductor film is formed by a sputtering method, it is preferable that the film be formed in a film formation gas containing a high percentage of oxygen, and it is especially preferable that the film be formed under an oxygen atmosphere (oxygen gas 100%). When the film is formed in a film formation gas containing a high percentage of oxygen, particularly under an oxygen atmosphere (oxygen gas 100%), even when the film formation temperature is higher than or equal to 300° C. for example, the release of Zn from the film can be suppressed.

The oxide semiconductor film is preferably highly purified by sufficient removal of impurities such as hydrogen or sufficient supply of oxygen to be in a supersaturated state. Specifically, the concentration of hydrogen in the oxide semiconductor film is $5 \times 10^{19}$ atoms/cm$^3$ or less, preferably $5 \times 10^{18}$ atoms/cm$^3$ or less, further preferably $5 \times 10^{17}$ atoms/cm$^3$ or less. Note that the concentration of hydrogen in the oxide semiconductor film is measured by secondary ion mass spectrometry (SIMS). Further, for sufficient supply of oxygen to make the film in a supersaturated state, an insulating film (e.g., $SiO_x$) containing excess oxygen is provided to be in contact with and covers the oxide semiconductor film.

To adjust the concentration of hydrogen in the insulating film containing excess oxygen is also important because it might affect the characteristics of the transistor.

Influence of hydrogen concentration of the insulating film containing excess oxygen on the characteristics of the transistor is described.

First, hydrogen was intentionally added to the insulating film containing excess oxygen, and the concentration of hydrogen was measured by SIMS.

In this embodiment, four samples were prepared.

A glass substrate was prepared, and a 300-nm-thick silicon oxide film was formed over the glass substrate by a sputtering method. The silicon oxide film was formed using a quartz target, at pressure of 0.4 Pa, at a power of 1.5 kW (13.56 MHz), and at a substrate temperature in film formation of 100° C. Note that four kinds of conditions in the flow rate of an oxygen ($O_2$) gas, a deuterium ($D_2$) gas, and an argon (Ar) gas which are the gases used for formation of the silicon oxide film were set.

In Table 3, the following are shown: sample names, flow rate of each film formation gas used for forming the silicon oxide film, average concentrations of D (deuterium atom) and H (hydrogen) of a 30-nm-thick silicon oxide film which are obtained by SIMS. Note that the proportion of $D_2$ in the film formation gas ($D_2/(O_2+Ar+D_2)$) of each of the samples (Sample 1, Sample 2, Sample 3, and Sample 4) was as follows: 0 vol % (Sample 1), 0.005 vol % (Sample 2), 0.50 vol % (Sample 3), and 2.50 vol % (Sample 4).

TABLE 3

| Sample Name | $O_2$ [sccm] | Ar [sccm] | $D_2$ [sccm] | Proportion of $D_2$ | Concentration of D [atoms/cm$^3$] | Concentration of H [atoms/cm$^3$] |
|---|---|---|---|---|---|---|
| Sample 1 | 25 | 25 | 0 | 0% | 5.1E+15 | 6.4E+19 |
| Sample 2 | 25 | 25.00 | 0.0025 | 0.005% | 1.6E+19 | 1.4E+20 |

TABLE 3-continued

| Sample Name | O$_2$ [sccm] | Ar [sccm] | D$_2$ [sccm] | Proportion of D$_2$ | Concentration of D [atoms/cm$^3$] | Concentration of H [atoms/cm$^3$] |
|---|---|---|---|---|---|---|
| Sample 3 | 25 | 24.75 | 0.25 | 0.5% | 5.6E+20 | 7.2E+19 |
| Sample 4 | 25 | 23.75 | 1.25 | 2.5% | 7.2E+20 | 1.9E+19 |

Table 3 shows that as the proportion of D$_2$ in the film formation gas becomes higher, the concentration of D contained in the silicon oxide film becomes higher.

Next, transistors including Samples 1 to 4 shown in Table 3 were formed.

Figure 32A:
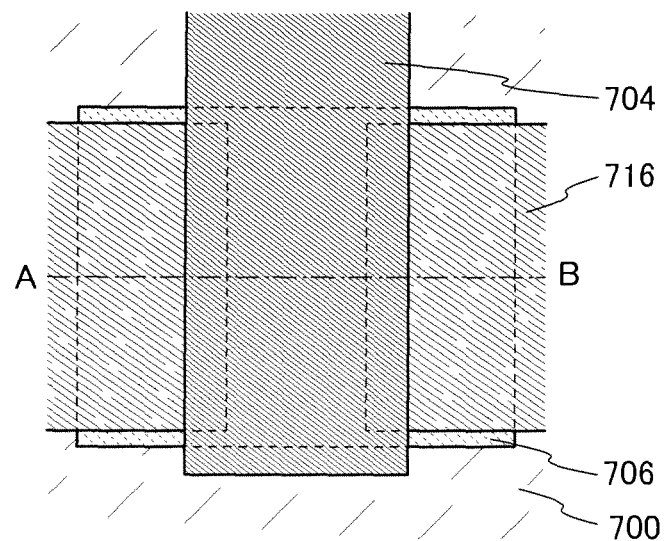
FIGS. 32A and 32B are a top view and a cross-sectional view of a transistor used for evaluation.
Figure 32B:
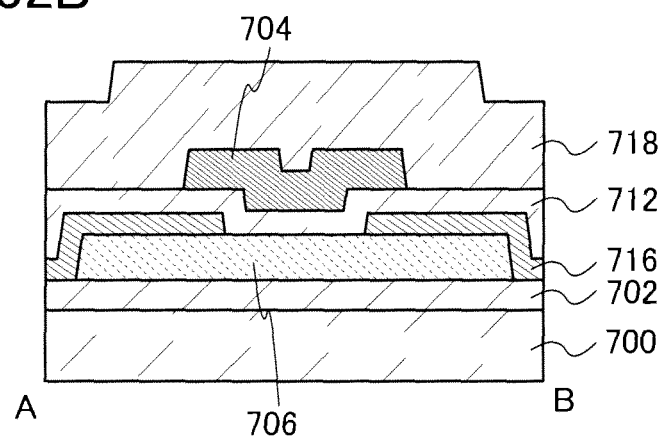

FIG. 32A is the top view of the transistor used for the measurement. FIG. 32B is a cross-sectional view along dashed-dotted line A-B in FIG. 32A. Note that for simplicity, a protective insulating film 718, a gate insulating film 712, an insulating film 702, and the like are omitted in FIG. 32A.

The transistor illustrated in FIG. 32B includes a substrate 700, the insulating film 702 over the substrate 700, an oxide semiconductor film 706 over the insulating film 702, a pair of electrode layers 716 over the oxide semiconductor film 706, the gate insulating film 712 covering the oxide semiconductor film 706 and the pair of electrode layers 716, a gate electrode layer 704 overlapping with the oxide semiconductor film 706 with the gate insulating film 712 interposed therebetween, and the protective insulating film 718 over the gate electrode layer 704 and the gate insulating film 712. Further, the transistor is manufactured to have a channel length L of 10 µm, a channel width W of 10 µm, and each L$_{ov}$ of 1 µm. Note that L$_{ov}$ is the length of the portion in which the gate electrode layer 704 overlaps with each of the pair of electrode layers 716 in a channel length direction; that is, the total L$_{ov}$ of the transistor is 2 µm.

A transistor that includes the insulating film 702 formed under the film formation conditions of Sample 1 is referred to as Sample 5, a transistor that includes the insulating film 702 formed under the film formation conditions of Sample 2 is referred to as Sample 6, a transistor that includes the insulating film 702 formed under the film formation conditions of Sample 3 is referred to as Sample 7, and a transistor that includes the insulating film 702 formed under the film formation conditions of Sample 4 is referred to as Sample 8. The thickness of the insulating film 702 is 300 nm.

Samples 5 to 8 were formed under similar conditions except the condition of formation of the insulating film 702. The substrate 700 was a glass substrate. A 20-nm-thick IGZO film (which is formed using a target containing In:Ga:Zn in an atomic ration of 1:1:1) was used as the oxide semiconductor film 706. A 100-nm-thick tungsten layer was used as the pair of electrode layers 716. A 30-nm-thick silicon oxynitride film was used as the gate insulating film 712. A 15-nm-thick tantalum nitride film and a 135-nm-thick tungsten film, which were stacked from the gate insulating film 712 side, were used as the gate electrode layer 704. A 300-nm-thick silicon oxynitride film was used as the protective insulating film 718.

A BT stress test was conducted on each of the transistors (Sample 5 to 8) having the above structures. The method of the conducted BT stress test is described below.

First, the drain current I$_d$ was measured in the following conditions: the substrate temperature was 25° C., the drain voltage V$_d$ was 3V, and the gate voltage V$_g$ was swept from −6 V to 6 V. The characteristics of the transistor on such conditions are referred to as the characteristics of the transistor before the BT stress test.

Next, the conditions that V$_d$ and V$_g$ were kept to 0.1 V and −6 V, respectively, for one hour at a substrate temperature of 150° C.

Next, increases in the V$_d$, the V$_g$, and the temperature were stopped, and the I$_d$ was measured in the following conditions: the substrate temperature was 25° C., the drain voltage V$_d$ was 3V, and the gate voltage V$_g$ was swept from −6 V to 6 V. The characteristics of the transistor on such conditions are referred to as the characteristics of the transistor after the BT stress test.

Table 4 shows a threshold voltage V$_{th}$ and a field effect mobility µFE before and after the BT stress test.

TABLE 4

| Sample Names | Before BT Stress Test | | After BT Stress Test | |
|---|---|---|---|---|
| | Vth [V] | µFE [cm$^2$/Vs] | Vth [V] | µFE [cm$^2$/Vs] |
| Sample 5 | 0.94 | 8.6 | 1.17 | 7.8 |
| Sample 6 | 0.82 | 8.6 | 1.03 | 8.2 |
| Sample 7 | 0.89 | 8.8 | 1.05 | 7.8 |
| Sample 8 | 0.71 | 8.7 | 0.43 | 2.5 |

Table 4 shows that µFE in Sample 8 is markedly reduced after the BT stress test.

Further, it is found that the variation of V$_{th}$ in the direction of negative direction becomes greater in Sample 8 as compared to the other samples.

As described above, a transistor in which a silicon oxide film is in contact with an oxide semiconductor film has abnormal characteristics when the concentration of D in the silicon oxide film is 7.2×10$^{20}$ atoms/cm$^3$.

In the case where the concentration of deuterium in an insulating film containing excess oxygen is greater than or equal to 7.2×10$^{20}$ atoms/cm$^3$, variation in initial characteristics of the transistor is increased, a channel length dependence of electric characteristics of the transistor is increased, and the transistor is significantly deteriorated in the BT stress test; therefore, the concentration of deuterium in the insulating film containing excess oxygen is preferably less than 7.2×10$^{20}$ atoms/cm$^3$. In other words, the concentration of hydrogen in the oxide semiconductor film is preferably less than or equal to 5×10$^{19}$ atoms/cm$^3$, and the concentration of deuterium in the insulating film containing excess oxygen is preferably less than 7.2×10$^{20}$ atoms/cm$^3$.

A blocking film (e.g., AlO$_x$) that prevents oxygen from diffusing into the oxide semiconductor film is preferably formed outside the insulating film containing excess oxygen to cover the oxide semiconductor film.

The oxide semiconductor film is covered with the insulating film containing excess oxygen or a blocking film, so that the oxide semiconductor film can be in a state in which oxygen the amount of which is approximately the same as the stoichiometric composition is contained or a supersaturated state in which oxygen which exceeds the stoichiometric composition is contained. For example, when the oxide semiconductor film is an IGZO film, an example of the stoichiometric composition is In:Ga:Zn:O=1:1:1:4 [atomic ratio]; thus, an atomic ratio of oxygen is four or more.

Note that the top-gate transistor is described with reference to in FIGS. 32A and 32B; however, the above description can be employed in a bottom-gate transistor. That is, an insulating film which has the concentration of hydrogen reduced to the above concentration is used for the gate insulating film 402 and the insulating film 408 which are illustrated in FIGS. 1B and 1C, so that abnormal characteristics in the transistor can be suppressed. Further, an insulating film containing excess oxygen is used as the gate insulating film 402 and the insulating film 408, and a blocking film is formed outside the insulating film containing excess oxygen, so that the oxide semiconductor film can be in a state in oxygen the amount of which is approximately the same as the stoichiometric composition is contained or a supersaturated state in which oxygen which exceeds the stoichiometric composition is contained.

In this embodiment, the case where heat treatment is performed after the conductive film 405 is formed over the metal oxide film 404 is described; however, one embodiment of the present invention is not limited thereto. For example, heat treatment may be performed after the metal oxide film 404 is formed over the oxide semiconductor film 403 or after the conductive film 405 is formed over the metal oxide film 404 and is processed into a source electrode layer and a drain electrode layer.

The materials for the metal film 406 and the material for the conductive film 405 are selected so as to be different from each other, so that the transistor 420 illustrated in FIGS. 2A and 2B can be manufactured. For example, ruthenium oxide and tantalum nitride are used for the metal oxide film 404 and the conductive film 405, respectively, and heat treatment is performed thereon, which forms a stacked layer of ruthenium and tantalum nitride. The stacked layer can be used as the source electrode layer 417a and the drain electrode layer 417b. With such a structure, an oxide film is not formed at the interface between the metal film 406a and the conductive film 415a and the interface between the metal film 406b and the conductive film 415b, which is preferable. Note that the conductive films 415a and 415b may be formed to have a stacked layer of tantalum nitride and tungsten.

Note that even when the material for the metal films 406a and 406b and the material for the conductive films 405a and 405b are selected to be the same as each other, the characteristics of the metal films 406a and 406b are different from those of the conductive films 405a and 405b in some cases because the metal films 406a and 406b are the films which have formed by reducing the metal oxide film 404 and the conductive films 405a and 405b are the films which have formed by deposition. For example, the film density of the metal films 406a and 406b are lower than that of the conductive films 405a and 405b in some cases. The film density can be measured by X-ray reflectmetry (XRR), for example.

Further, the case where the source electrode layer 407a includes the metal film 406a and the conductive film 405a and the drain electrode layer 407b include the metal film 406b and the conductive film 405b is described in this embodiment; however, one embodiment of the present invention is not limited thereto. For example, the conductive films 405a and 405b are not necessarily formed.

Oxygen vacancies in a channel or a back channel of the oxide semiconductor film 403 can be reduced by supply of oxygen from the insulating film 408 or by step for introducing oxygen even after the source electrode layer 407a and the drain electrode layer 407b are formed. However, when a material which is likely to be oxidized is used for the source electrode layer 407a and the drain electrode layer 407b, oxygen vacancies are formed at the interface with the source electrode layer 407a and the drain electrode layer 407b; then, it would become difficult to reduce the oxygen vacancies at the interface by supply of oxygen. Further, formation of a high resistance component by diffusion of oxygen in the source electrode layer 407a and the drain electrode layer 407b leads to an additional step for removing the high resistance component.

According to this embodiment, the metal oxide film 404 which is in contact with the oxide semiconductor film 403 is reduced by heat treatment, so that oxygen is released from the metal oxide film 404 and can be supplied to the oxide semiconductor film 403. Oxygen vacancies can be reduced at the interfaces between the oxide semiconductor film 403 and each of the source electrode layer 407a and the drain electrode layer 407b. Accordingly, a shift of the threshold voltage of the transistor 410 in the negative direction can be suppressed.

Further, the metal film 406 which is formed by reduction of the metal oxide film 404 has a higher oxidation resistance than the metal element included in the oxide semiconductor film 403. That is, the metal film 406 becomes a film in which oxygen is not likely to be diffused. The metal films 406a and 406b are used for the source electrode layer 407a and the drain electrode layer 407b, so that the formation of the high resistance component in the metal films 406a and 406b can be suppressed. Accordingly, the resistance due to the oxide semiconductor film 403, the source electrode layer 407a, and the drain electrode layer 407b can be reduced, so that the decrease in on-state current of the transistor 410 can be suppressed.

Further, it is preferable that the metal film 406 (e.g., a film of copper, silver, or ruthenium) having a work function of ±0.2 eV of the electron affinity of the oxide semiconductor film 403 be selected because the contact resistances between the oxide semiconductor film 403 and each of the source electrode layer 407a and the drain electrode layer 407b can be reduced. Thus, the resistance due to the oxide semiconductor film 403, the source electrode layer 407a, and the drain electrode layer 407b can be reduced, so that the decrease in on-state current of the transistor can be suppressed.

The structures, methods, and the like described in this embodiment can be combined as appropriate with any of the structures, methods, and the like described in the other embodiments.

Embodiment 3

In this embodiment, another embodiment of a semiconductor device is described with reference to FIGS. 4A and 4B and FIGS. 5A and 5B. Description of the same portion as or a portion having a function similar to that in the above embodiments, a manufacturing step similar to that in the above embodiments is not repeated.

Figure 4A:
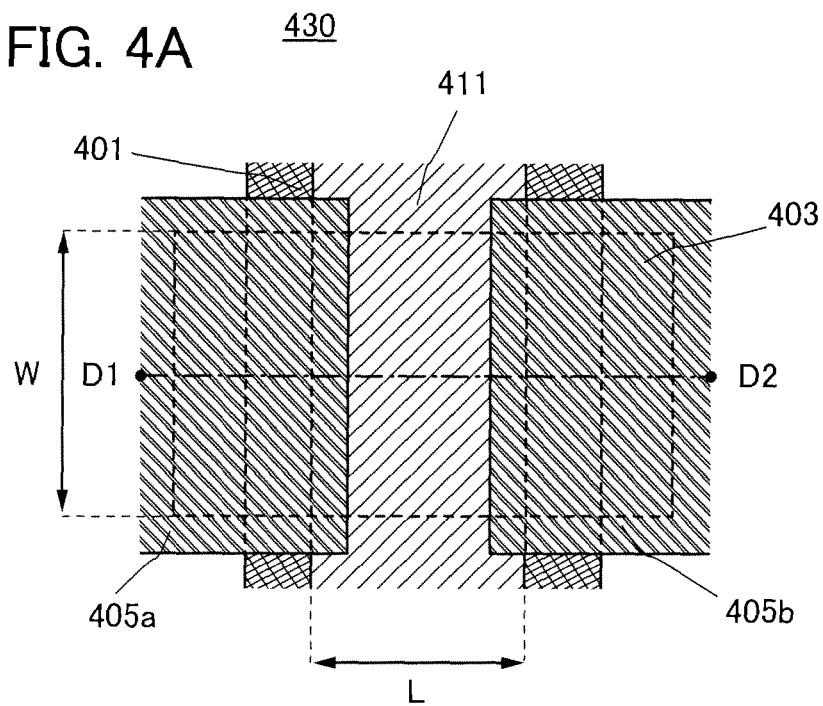
FIGS. 4A and 4B are a plan view and a cross-sectional view illustrating one embodiment of a semiconductor device.
Figure 4B:
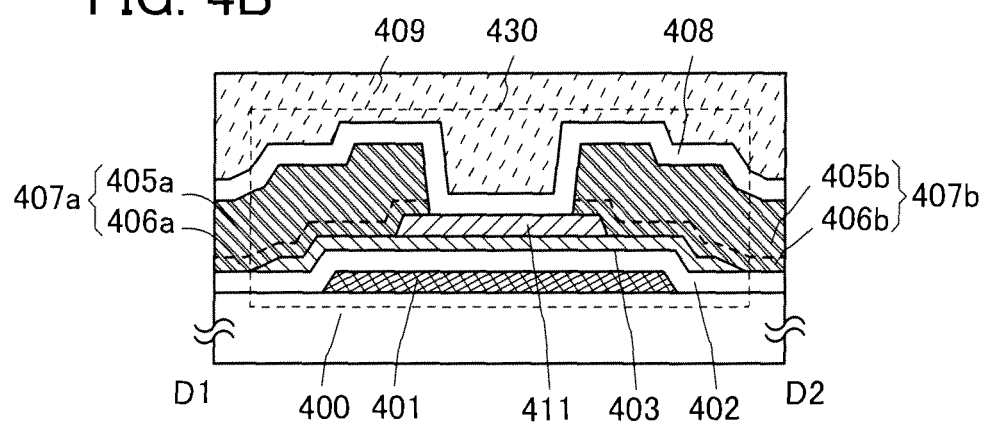

A transistor 430 illustrated in FIGS. 4A and 4B is an example of a bottom-gate transistor. FIG. 4A is a plan view of the transistor 430, and FIG. 4B is a cross-sectional view taken along line D1-D2 in FIG. 4A (a cross-sectional view in the channel length direction of the transistor 430). Further, in FIG. 4A, some components of the transistor 430 (e.g., the gate insulating film 402) are not illustrated to avoid complexity.

The transistor 430 illustrated in FIGS. 4A and 4B includes the gate electrode layer 401 over the substrate 400 having an insulating surface, the gate insulating film 402 over the gate electrode layer 401, the oxide semiconductor film 403 provided over the gate insulating film 402 in a region overlapping with the gate electrode layer 401, an insulating film 411 provided over the oxide semiconductor film 403 in a region overlapping with the gate electrode layer 401, and the source electrode layer 407a and the drain electrode layer 407b in contact with the oxide semiconductor film 403 and the insulating film 411. Further, the insulating film 408 and the planarization insulating film 409 are provided to cover the transistor 430.

As illustrated in FIG. 4B, the transistor 430 includes the source electrode layer 407a and the drain electrode layer 407b which are in contact with the oxide semiconductor film 403 and have a stacked-layer structure. The source electrode layer 407a is a stack of the metal film 406a and the conductive film 405a. The drain electrode layer 407b is a stack of the metal film 406b and the conductive film 405b.

The transistor 430 illustrated in FIG. 4B is different from the transistor 410 illustrated in FIG. 1B in that the insulating film 411 is formed over the oxide semiconductor film 403 in a region overlapping with the gate electrode layer 401 (a region overlapping with a channel formation region of the oxide semiconductor film 403). In FIG. 4B, the insulating film 411 is formed in the region which overlaps with the channel formation region of the oxide semiconductor film 403, so that hydrogen, moisture, an element contained in an etching gas, or the like can be prevented from entering the oxide semiconductor film 403 during the process for manufacturing the transistor 430.

The insulating film 411 can have a single-layer structure or a stacked structure including one or more inorganic insulating films, examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film.

Further, the insulating film 411 (in the case where the insulating film 411 has a stacked-layer structure, one of the stacked films that is in contact with the oxide semiconductor film 403) contains much (excess) oxygen, so that the insulating film 411 (or the film in contact with the oxide semiconductor film 403) can favorably function as a supply source which supplies oxygen to the oxide semiconductor film 403.

The insulating film 411 is formed as follows: an insulating film is formed over the oxide semiconductor film 403, and in a photolithography process, a resist mask is formed over the insulating film and the insulating film is selectively etched. The insulating film formed over the oxide semiconductor film 403 is etched as appropriate, so that the island-shaped insulating film 411 illustrated in FIG. 4B can be formed.

The source electrode layer 407a and the drain electrode layer 407b which are in contact with the oxide semiconductor film 403 and the insulating film 411 have a stacked-layer structure. The source electrode layer 407a is a stack of the metal film 406a and the conductive film 405a. The drain electrode layer 407b is a stack of the metal film 406b and the conductive film 405b.

In order to prevent further extraction of oxygen from the oxide semiconductor film 403, the metal films 406a and 406b, which are in contact with the oxide semiconductor film 403, and the insulating film 411, include a metal having a higher oxidation resistance than the metal element included in the oxide semiconductor film 403 (a metal having higher Gibbs free energy of oxidation reaction than molybdenum). Specific examples are copper, silver, ruthenium, and iridium. The use of the metal having a higher oxidation resistance than the metal element included in the oxide semiconductor film 403 for the metal films 406a and 406b suppresses the oxygen vacancies in the oxide semiconductor film 403.

Further, since the metal films 406a and 406b are not likely to become oxidized as compared to the oxide semiconductor film 403 and thus diffusion of oxygen in the metal films 406a and 406b can be suppressed, the formation of the high resistance component in the metal films 406a and 406b can be suppressed. Accordingly, the resistance due to the oxide semiconductor film 403, the source electrode layer 407a, and the drain electrode layer 407b can be reduced, so that the decrease in on-state current of the transistor can be suppressed.

Further, it is preferable that the metal films 406a and 406b (e.g., a film of copper, silver, or ruthenium) having a work function of ±0.2 eV of the electron affinity of the oxide semiconductor film 403 be selected because the contact resistances between the oxide semiconductor film 403 and each of the source electrode layer 407a and the drain electrode layer 407b can be reduced. Thus, the resistance due to the oxide semiconductor film 403, the source electrode layer 407a, and the drain electrode layer 407b can be reduced, so that the decrease in on-state current of the transistor can be suppressed.

Further, the conductive films 405a and 405b which are stacked over the metal films 406a and 406b, respectively, preferably include materials with which an oxide film is not formed at the interface with the metal films 406a and 406b. Examples of a material which can be used for the conductive films 405a and 405b are, in addition to the materials which can be used for the metal films 406a and 406b, gold, platinum, titanium, tungsten, titanium nitride, molybdenum nitride, tungsten nitride, and tantalum nitride. The conductive films 405a and 405b have a single-layer structure or a stacked-layer structure. The stacked-layer structure of the conductive films 405a and 405b can be formed of a tantalum nitride film and a tungsten film.

The case where the metal films 406a and 406b and the conductive films 405a and 405b are formed using the same material in the source electrode layer 407a and the drain electrode layer 407b of the transistor 430 is described with reference to FIGS. 4A and 4B; however, the material for the metal films 406a and 406b and the material for the conductive films 405a and 405b may be different from each other.

The transistor 430 illustrated in FIGS. 4A and 4B may include metal oxide in part of the metal films 406a and 406b. For example, when the metal films 406a and 406b include ruthenium, ruthenium oxide may be formed in part of the metal films 406a and 406b. Even when ruthenium oxide is formed in part of the metal film, the resistivity of the ruthenium oxide is $3.5 \times 10^{-5}$ [cmΩ] (300K), and a high resistance component is not formed in a source electrode layer and a drain electrode layer, which is preferable.

Next, a transistor which has a partly different structure from the transistor 430 illustrated in FIGS. 4A and 4B is described with reference to FIGS. 5A and 5B.

Figure 5A:
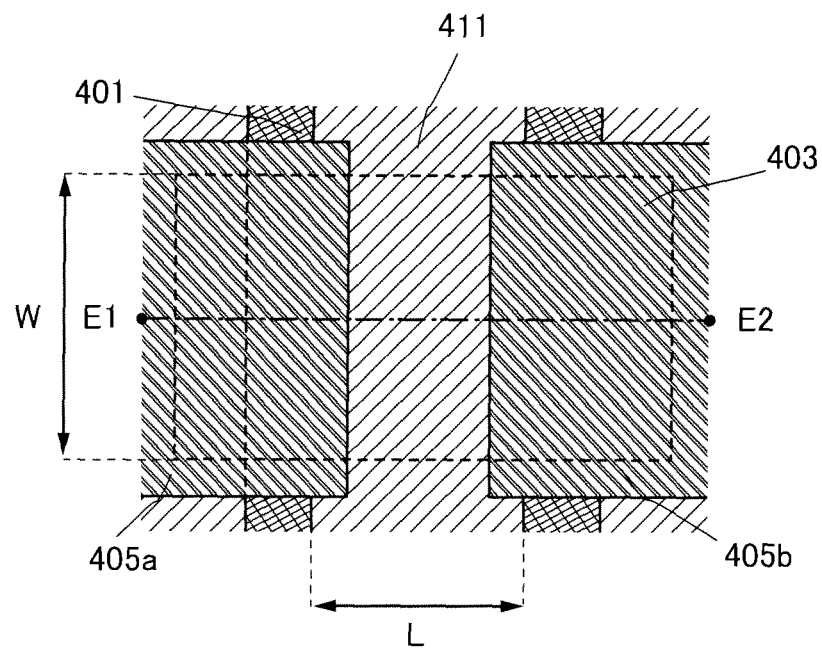
FIGS. 5A and 5B are a plan view and a cross-sectional view illustrating one embodiment of a semiconductor device.
Figure 5B:
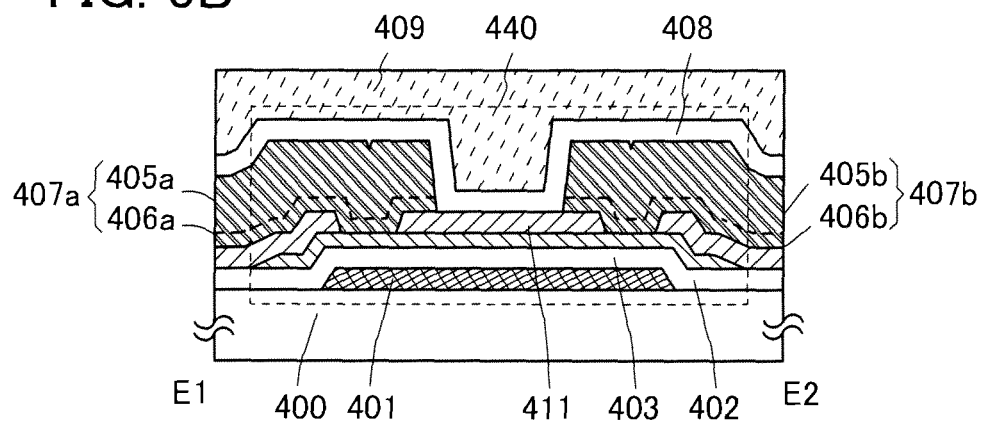

FIG. 5A is a plan view of a transistor 440, and FIG. 5B is a cross-sectional view taken along line E1-E2 in FIG. 5A (a cross-sectional view in the channel length direction of the transistor 440). Further, in FIG. 5A, some components of the transistor 420 (e.g., the gate insulating film 402) are not illustrated to avoid complexity.

The transistor 440 illustrated in FIGS. 5A and 5B is different from the transistor 430 illustrated in FIGS. 4A and 4B in that the insulating film 411 is provided to cover the oxide semiconductor film 403, and the source electrode layer 407a and the drain electrode layer 407b are in contact with the oxide semiconductor film 403 through openings provided in the insulating film 411. The insulating film 411 is provided to cover the oxide semiconductor film 403, so that hydrogen, moisture, an element contained in an etching gas, or the like can be further prevented from entering the oxide semiconductor film 403 during the process for manufacturing the transistor 440.

Note that the structure of transistor 440 is similar to that of the transistor 430 except for the shape of the insulating film 411; thus, the description of the transistor 430 can be referred to.

As described above, for the metal films 406a and 406b, which are in contact with the oxide semiconductor film 403, a metal having a higher oxidation resistance than the metal element included in the oxide semiconductor film 403 (a metal having higher Gibbs free energy of oxidation reaction than at least indium, gallium, zinc, and tin) is used, so that extraction of oxygen from the oxide semiconductor film 403 can be prevented. Accordingly, an increase in oxygen vacancies at the interface between the oxide semiconductor film 403 and each of the source electrode layer 407a and the drain electrode layer 407b can be suppressed, whereby a shift of the threshold voltage of the transistor can be suppressed.

Further, since the metal films 406a and 406b are not likely to become oxidized as compared to the oxide semiconductor film 403 and thus diffusion of oxygen in the metal films 406a and 406b can be suppressed, the formation of the high resistance component in the metal films 406a and 406b can be suppressed. Accordingly, the resistance due to the oxide semiconductor film 403, the source electrode layer 407a, and the drain electrode layer 407b can be reduced, so that the decrease in on-state current of the transistor can be suppressed.

The structures, methods, and the like described in this embodiment can be combined as appropriate with any of the structures, methods, and the like described in the other embodiments.

Embodiment 4

In this embodiment, another embodiment of a semiconductor device is described with reference to FIGS. 6A and 6B and FIGS. 7A and 7B. Description of the same portion as or a portion having a function similar to that in the above embodiments is not repeated.

Figure 6A:
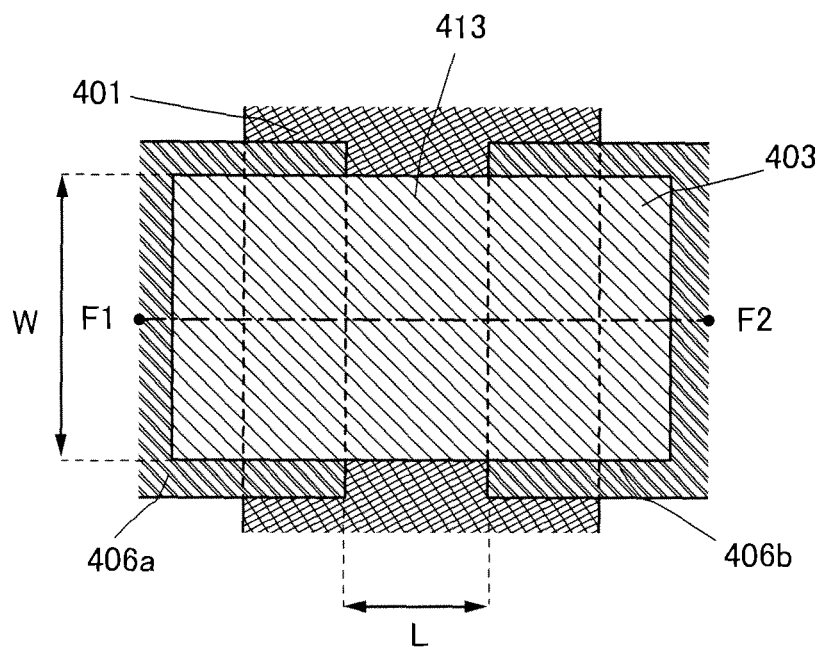
FIGS. 6A and 6B are a plan view and a cross-sectional view illustrating one embodiment of a semiconductor device.
Figure 6B:
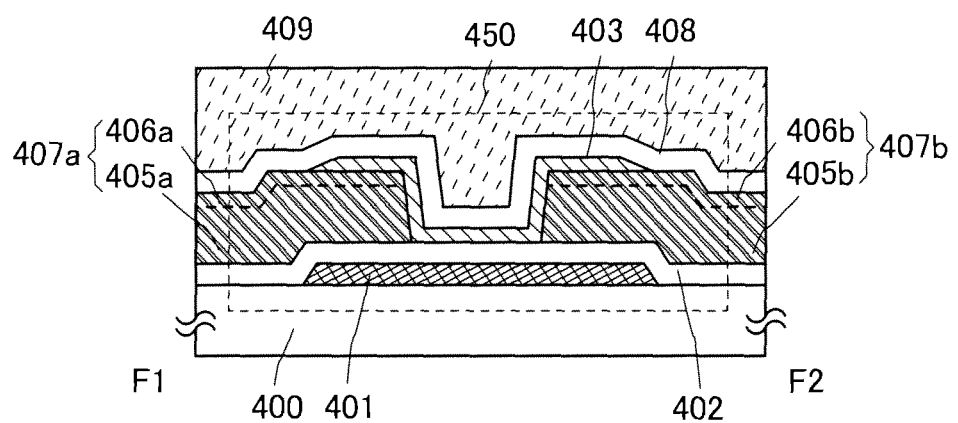

A transistor 450 illustrated in FIGS. 6A and 6B is an example of a bottom-gate transistor. FIG. 6A is a plan view of the transistor 450, and FIG. 6B is a cross-sectional view taken along line F1-F2 in FIG. 6A (a cross-sectional view in the channel length direction of the transistor 450). Further, in FIG. 6A, some components of the transistor 450 (e.g., the gate insulating film 402) are not illustrated to avoid complexity.

The transistor 450 illustrated in FIGS. 6A and 6B includes the gate electrode layer 401 over the substrate 400 having an insulating surface; the gate insulating film 402 over the gate electrode layer 401; the source electrode layer 407a and the drain electrode layer 407b over the gate insulating film 402; and the oxide semiconductor film 403 over the gate insulating film 402, the source electrode layer 407a and the drain electrode layer 407b. Further, the insulating film 408 and the planarization insulating film 409 are provided to cover the transistor 450.

As illustrated in FIGS. 6A and 6B, the transistor 450 includes the source electrode layer 407a and the drain electrode layer 407b which are in contact with the oxide semiconductor film 403 and have a stacked-layer structure. The source electrode layer 407a is a stack of the conductive film 405a and the metal film 406a. The drain electrode layer 407b is a stack of the conductive film 405b and the metal film 406b.

The transistor 450 illustrated in FIG. 6B is different from the transistor 410 illustrated in FIG. 1B in a position in which the oxide semiconductor film 403 is in contact with the source electrode layer 407a and the drain electrode layer 407b. In FIG. 1B, the source electrode layer 407a and the drain electrode layer 407b are in contact with a top surface of the oxide semiconductor film 403; on the other hand, in FIG. 6B, the source electrode layer 407a and the drain electrode layer 407b are in contact with a bottom surface of the oxide semiconductor film 403.

Also in the structure illustrated in FIG. 6B, using copper, silver, ruthenium, iridium, or the like for the metal films 406a and 406b can prevent extraction of oxygen from the oxide semiconductor film 403; accordingly, an increase in oxygen vacancies in the oxide semiconductor film 403 can be suppressed, and thus a shift of the threshold voltage of the transistor 410 in the negative direction can be suppressed.

Further, since the metal films 406a and 406b are not likely to become oxidized as compared to the oxide semiconductor film 403 and thus diffusion of oxygen in the metal films 406a and 406b can be suppressed, the formation of the high resistance component in the metal films 406a and 406b can be suppressed. Accordingly, the resistance due to the oxide semiconductor film 403, the source electrode layer 407a, and the drain electrode layer 407b can be reduced, so that the decrease in on-state current of the transistor can be suppressed.

Further, it is preferable that the metal films 406a and 406b (e.g., a film of copper, silver, or ruthenium) having a work function of ±0.2 eV of the electron affinity of the oxide semiconductor film 403 be selected because the contact resistances between the oxide semiconductor film 403 and each of the source electrode layer 407a and the drain electrode layer 407b can be reduced. Accordingly, the resistance due to the oxide semiconductor film 403, the source electrode layer 407a, and the drain electrode layer 407b can be reduced, so that the decrease in on-state current of the transistor can be suppressed.

Further, the conductive films 405a and 405b preferably include materials with which an oxide film is not formed at the interface with the metal films 406a and 406b. Examples of a material which can be used for the conductive films 405a and 405b are, in addition to the materials which can be used for the metal films 406a and 406b, gold, platinum, titanium, tungsten, titanium nitride, molybdenum nitride, tungsten nitride, and tantalum nitride. It is preferable to use gold, platinum, titanium nitride, molybdenum nitride, or tantalum nitride because side surfaces of the conductive films 405a and 405b are in contact with the oxide semiconductor film 403 as illustrated in FIG. 6B.

In this embodiment, the transistor 450 illustrated in FIGS. 6A and 6B includes the source electrode layer 407a and the drain electrode layer 407b which include the metal films 406a and 406b and the conductive films 405a and 405b formed using the same material. Thus, the interface between the metal film 406a and the conductive films 405a and the interface between the metal film 406b and the conductive films 405b are shown by dotted lines. In the case of the transistor 450 illustrated in FIGS. 6A and 6B, for example, ruthenium can be used for the metal films 406a and 406b and the conductive films 405a and 405b.

The transistor 450 illustrated in FIGS. 6A and 6B may include metal oxide in part of the metal films 406a and 406b. For example, when the metal films 406a and 406b include ruthenium, ruthenium oxide may be formed in part of the metal films 406a and 406b. Even when ruthenium oxide is formed in part of the metal film, the resistivity of the ruthenium oxide is $3.5 \times 10^{-5}$ [cmΩ] (300K), and a high resistance component is not formed in a source electrode layer and a drain electrode layer, which is preferable.

Next, a transistor which has a partly different structure from the transistor 450 illustrated in FIGS. 6A and 6B is described with reference to FIGS. 7A and 7B.

Figure 7A:
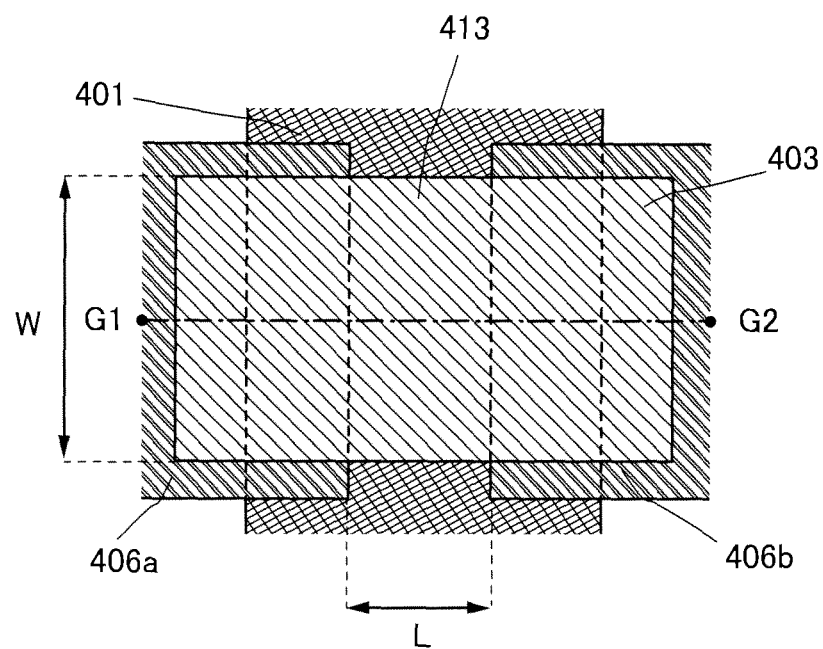
FIGS. 7A and 7B are a plan view and a cross-sectional view illustrating one embodiment of a semiconductor device.
Figure 7B:
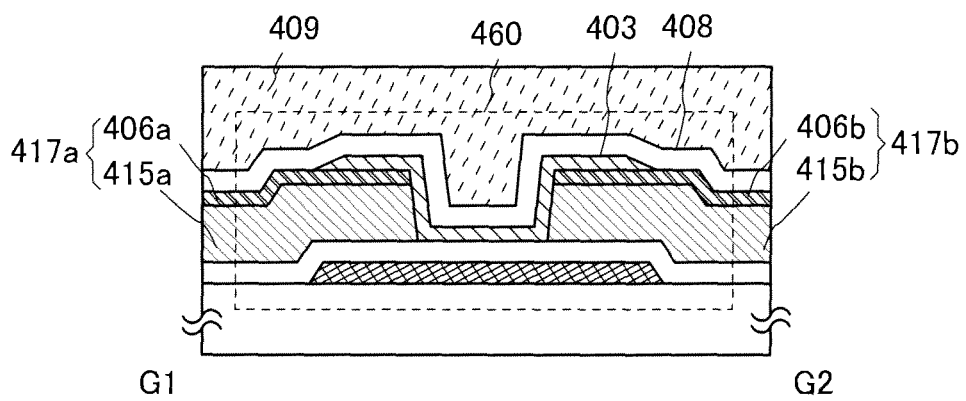

FIG. 7A is a plan view of a transistor 460, and FIG. 7B is a cross-sectional view taken along line G1-G2 in FIG. 7A (a cross-sectional view in the channel length direction of the transistor 460). Further, in FIG. 7A, some components of the transistor 460 (e.g., the gate insulating film 402) are not illustrated to avoid complexity.

In the source electrode layer 417a and the drain electrode layer 417b of the transistor 460 illustrated in FIGS. 7A and 7B, the material for the metal films 406a and 406b and the material for the conductive films 405a and 405b may be selected so as to be different from each other. Thus, the interface between the metal film 406a and the conductive films 405a and the interface between the metal film 406b and the conductive films 405b are shown by solid lines. Note that the conductive films 415a and 415b are formed using the same material as that of the conductive films 405a and 405b, and have a single-layer structure or a stacked-layer structure. Further, as well as in FIG. 6B, also in FIG. 7B, it is preferable to use gold, platinum, titanium nitride, molybdenum nitride, or tantalum nitride because side surfaces of the conductive films 415a and 415b are in contact with the oxide semiconductor film 403. In the case of the transistor 460 illustrated in FIGS. 7A and 7B, for example, ruthenium can be used for the metal films 406a and 406b, and tantalum nitride can be used for the conductive films 415a and 415b.

The structure of transistor 460 is similar to that of the transistor 450 except for the material of the source electrode layer 417a and the drain electrode layer 417b; thus, the description of the transistor 450 can be referred to.

As described above, for the metal films 406a and 406b, which are in contact with the oxide semiconductor film 403, a metal having a higher oxidation resistance than the metal element included in the oxide semiconductor film 403 (a metal having higher Gibbs free energy of oxidation reaction than at least indium, gallium, and zinc) is used, so that extraction of oxygen from the oxide semiconductor film 403 can be prevented. Accordingly, an increase in oxygen vacancies in the oxide semiconductor film 403 can be suppressed, whereby a shift of the threshold voltage of the transistor in the negative direction can be suppressed.

Since the metal films 406a and 406b are not likely to become oxidized and thus the diffusion of oxygen in the metal films 406a and 406b can be suppressed, the formation of the high resistance component in the metal films 406a and 406b can be suppressed. Accordingly, the resistance due to the oxide semiconductor film 403, the source electrode layer 417a, and the drain electrode layer 417b can be reduced, so that the decrease in on-state current of the transistor can be suppressed.

The structures, methods, and the like described in this embodiment can be combined as appropriate with any of the structures, methods, and the like described in the other embodiments.

Embodiment 5

In this embodiment, an example of a method for manufacturing a semiconductor device including the transistor 450 illustrated in FIGS. 6A and 6B is described with reference to FIGS. 8A to 8E.

First, the gate electrode layer 401 and the gate insulating film 402 are formed over the substrate 400 (see FIG. 8A) in a similar manner to that of the step illustrated in FIG. 3A.

Figure 8A:
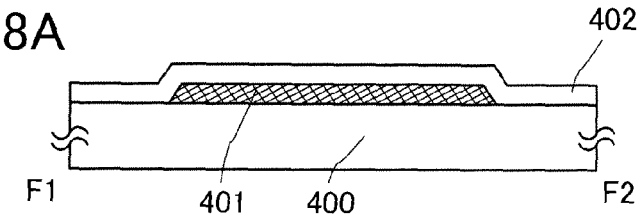
FIGS. 8A to 8E are cross-sectional views illustrating one embodiment of a method for manufacturing a semiconductor device.
Figure 8B:
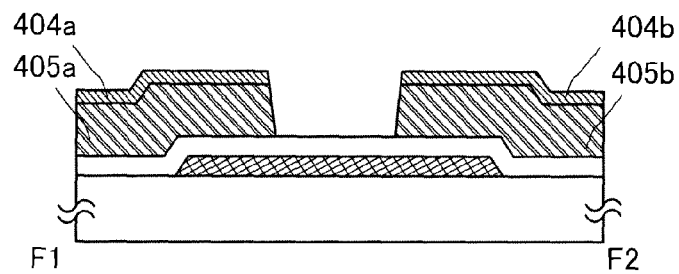

Next, the conductive film 405 and the metal oxide film 404 which are to be a source electrode layer and a drain electrode layer (including a wiring formed using the same layer as the source electrode layer and the drain electrode layer) are formed over the gate insulating film 402 (see FIG. 8B).

The conductive film 405 may be formed using a material that can withstand heat treatment performed later. Further, the conductive film 405 is preferably formed using a material with which an oxide film is not formed at the interface between the conductive film 405 and a metal oxide film to be formed. For the conductive film 405, for example, gold, platinum, copper, silver, ruthenium, iridium, titanium, tungsten, titanium nitride, molybdenum nitride, tungsten nitride, tantalum nitride, and the like can be used. Copper, silver, ruthenium, or iridium is preferably used. The conductive film 405 is preferably formed thicker than the metal oxide film 404, and is formed to have a single-layer structure or a stacked-layer structure.

The thickness of the conductive film 405 is greater than or equal to 50 nm and smaller than or equal to 600 nm. Further, the conductive film 405 can be formed by a sputtering method, a CVD method, or the like as appropriate.

Further, for the metal oxide film 404, a metal oxide film having a higher reducing property than the oxide semiconductor film 403 is used. The metal oxide film having a higher reducing property than the oxide semiconductor film 403 may include any metal oxide as long as the metal oxide has a higher reducing property than indium oxide, gallium oxide, zinc oxide, and tin oxide (that is, the metal in the metal oxide has higher Gibbs free energy of oxidation reaction than indium, gallium, zinc, and tin) as shown in FIG. 9. Specific examples are copper oxide, silver oxide, ruthenium oxide, and iridium oxide. The metal oxide film 404 is formed to have a single-layer structure or a stacked-layer structure.

The thickness of the metal oxide film 404 is greater than or equal to 1 nm and smaller than or equal to 50 nm, preferably greater than or equal to 1 nm and smaller than or equal to 30 nm, further preferably greater than or equal to 5 nm and smaller than or equal to 10 nm. The metal oxide film 404 can be formed by a sputtering method, a CVD method, or the like.

After that, in a photolithography process, a resist mask is formed over the metal oxide film 404 and selective etching is performed, so that metal oxide films 404a and 404b and the conductive films 405a and 405b are formed (see FIG. 8B). After the metal oxide films 404a and 404b and the conductive films 405a and 405b are formed, the resist mask is removed.

Figure 8C:
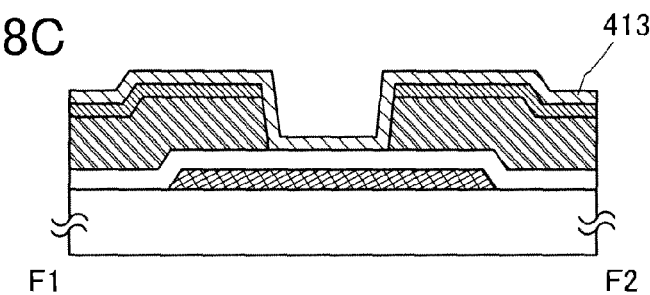

Next, the oxide semiconductor film 413 is formed over the metal oxide films 404a and 404b and the gate insulating film 402 (see FIG. 8C). Note that it can be said that the oxide semiconductor film 413 has a lower reducing property than the metal oxide films 404a and 404b.

Next, heat treatment is performed on the conductive films 405a and 405b, the metal oxide films 404a and 404b, and the oxide semiconductor film 413. For the material and method for forming the oxide semiconductor film 413, the description of the oxide semiconductor film 403, which is illustrated in FIG. 3A, can be referred to.

Heat treatment is performed while the metal oxide film 404 in contact with the oxide semiconductor film 413, so that oxygen is released from the metal oxide films 404a and 404b and is supplied to the oxide semiconductor film 413. By supply of oxygen to the oxide semiconductor film 413, oxygen vacancies in the oxide semiconductor film 413 can be reduced. The metal oxide films 404a and 404b which have a higher reducing property than the oxide semiconductor film 413 are reduced to form the metal films 406a and 406b.

Figure 8D:
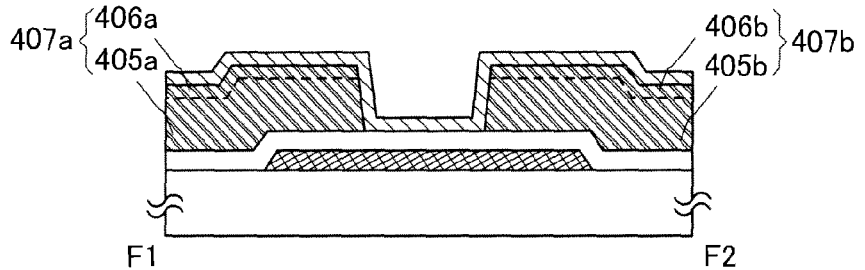

In FIG. 8D, the case where the metal oxide films 404a and 404b are completely reduced to the metal films 406a and 406b is described; however, the following case is also possible: only a portion of the metal oxide films 404a and 404b that is in the vicinity of the interface between the metal oxide films 404a and 404b and the oxide semiconductor film 413 is reduced to be the metal films 406a and 406b, and the other portion which is not in the vicinity of the interface remains the metal oxide films 404a and 404b. For example, when ruthenium oxide is used for the metal oxide films 404a and 404b, only a portion in the vicinity of the interface may be reduced to be ruthenium, and the other portion which is not in the vicinity of the interface may remain ruthenium oxide. Even when the other portion which is not in the vicinity of the interface remains ruthenium oxide, the resistivity of the ruthenium oxide is $3.5 \times 10^{-5}$ [cm$\Omega$] (300K), and a high resistance component is not formed in a source electrode layer and a drain electrode layer, which is preferable.

Further, the metal films 406a and 406b which are formed by reduction of the metal oxide films 404a and 404b has a higher oxidation resistance than the metal element included in the oxide semiconductor film 413. That is, the metal films 406a and 406b are films in which oxygen is not likely to be diffused.

Next, in a photolithography process, a resist mask is formed over the oxide semiconductor film 413 and selective etching is performed, so that the island-shaped oxide semiconductor film 403 is formed. After the island-shaped oxide semiconductor film 403 is formed, the resist mask is removed.

Figure 8E:
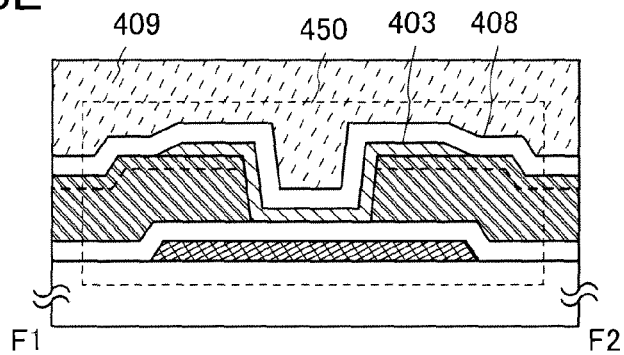

Through the above process, the transistor 450 according to one embodiment of the present invention is formed (see FIG. 8E).

Next, the insulating film 408 and the planarization insulating film 409 are provided to cover the transistor 450. For the material and the formation method of the insulating film 408 and the planarization insulating film 409, the description for FIG. 3E can be referred to; thus, detailed description is omitted.

Through the above process, a semiconductor device including the transistor 450 illustrated in FIG. 6B is manufactured.

In this embodiment, the case where heat treatment is performed after the oxide semiconductor film 413 is formed over the conductive films 405a and 405b and the metal oxide films 404a and 404b; however, one embodiment of the present invention is not limited thereto. For example, heat treatment may be performed after the oxide semiconductor film 413 is formed or is processed to be an island-shaped oxide semiconductor film 403. In this case, the metal oxide films 404a and 404b are reduced in a region which is in contact with the oxide semiconductor film 403, and is not reduced a region which is not in contact with the oxide semiconductor film 403 in some cases. The metal oxide film needs to be reduced at least in the region which is in contact with the oxide semiconductor film 403.

The material for the metal films 406a and 406b and the material for the conductive films 405a and 405b are selected so as to be different from each other, so that the transistor 460 illustrated in FIGS. 7A and 7B can be manufactured. For example, ruthenium oxide and tantalum nitride are used for the metal oxide film 404 and the conductive film 405, respectively, and heat treatment is performed thereon, which forms a stacked layer of ruthenium and tantalum nitride. The stacked layer can be used as the source electrode layer 417a and the drain electrode layer 417b. Further, an oxide film is not formed at the interface between the metal film 406a and the conductive film 415a and the interface between the metal film 406b and the conductive film 415b, which is preferable. Further, oxide can be prevented from being extracted from the oxide semiconductor film 403 at the interface between the oxide semiconductor film 403 and each of the side surfaces of the conductive films 415a and 415b, which is preferable.

Note that even when the material for the metal films 406a and 406b and the material for the conductive films 405a and 405b are selected to be the same as each other, the characteristics of the metal films 406a and 406b are different from those of the conductive films 405a and 405b in some cases because the metal films 406a and 406b are the films which have formed by reducing the metal oxide film 404 and the conductive films 405a and 405b are the films which have formed by deposition. For example, the film density of the metal films 406a and 406b are lower than that of the conductive films 405a and 405b in some cases. The film density can be measured by X-ray reflectmetry (XRR), for example.

Further, the case where the source electrode layer 407a includes the metal film 406a and the conductive film 405a and the drain electrode layer 407b include the metal film 406b and the conductive film 405b is described in this embodiment; however, one embodiment of the present invention is not limited thereto. For example, the conductive film 405 is not necessarily formed.

According to this embodiment, the metal oxide film 404 which is in contact with the oxide semiconductor film 403 is reduced by heat treatment, so that oxygen is released from the metal oxide film 404 and can be supplied to the oxide semiconductor film 403. Oxygen vacancies can be reduced at the interface between the oxide semiconductor film 403 and each of the source electrode layer 407a and the drain electrode layer 407b. Accordingly, a shift of the threshold voltage of the transistor 450 in the negative direction can be suppressed.

Further, the metal film 406 which is formed by reduction of the metal oxide film 404 has a higher oxidation resistance than the metal element included in the oxide semiconductor film 403. That is, the metal film 406 becomes a film in which oxygen is not likely to be diffused. The metal films 406a and 406b are used for the source electrode layer 407a and the drain electrode layer 407b, so that the formation of the high resistance component in the metal films 406a and 406b can be suppressed. Accordingly, the resistance due to the oxide semiconductor film 403, the source electrode layer 407a, and the drain electrode layer 407b can be reduced, so that the decrease in on-state current of the transistor 410 can be suppressed.

Further, it is preferable that the metal film 406 (e.g., a film of copper, silver, or ruthenium) having a work function of ±0.2 eV of the electron affinity of the oxide semiconductor film 403 be selected because the contact resistances between the oxide semiconductor film 403 and each of the source electrode layer 407a and the drain electrode layer 407b can be reduced. Thus, the resistance due to the oxide semiconductor film 403, the source electrode layer 407a, and the drain electrode layer 407b can be reduced, so that the decrease in on-state current of the transistor can be suppressed.

The structures, methods, and the like described in this embodiment can be combined as appropriate with any of the structures, methods, and the like described in the other embodiments.

Embodiment 6

In this embodiment, one embodiment of a method for manufacturing a semiconductor device is described with reference to FIGS. 10A and 10B. In this embodiment, a transistor including an oxide semiconductor film is described as an example of the semiconductor device.

Figure 10A:
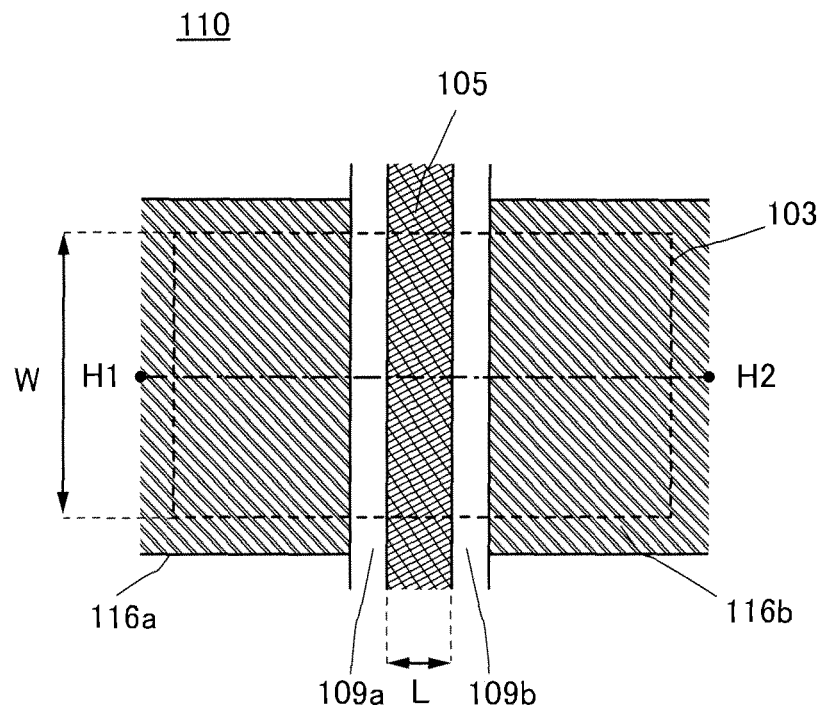
FIGS. 10A and 10B are a plan view and a cross-sectional view illustrating one embodiment of a semiconductor device.
Figure 10B:
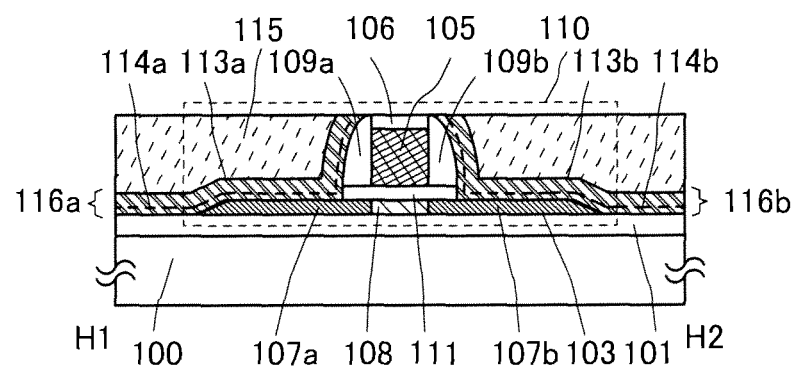

A transistor 110 illustrated in FIGS. 10A and 10B is an example of a top-gate transistor. FIG. 10A is a plan view of the transistor 110, and FIG. 10B is a cross-sectional view taken along line H1-H2 in FIG. 10A (a cross-sectional view in the channel length direction of the transistor 110). Further, in FIG. 10A, some components of the transistor 110 (e.g., a gate insulating film 111 and an insulating film 106) are not illustrated to avoid complexity.

The transistor 110 illustrated in FIGS. 10A and 10B includes an oxide semiconductor film 103 over a substrate 100 having an insulating surface; the gate insulating film 111 over the oxide semiconductor film 103; a gate electrode layer 105 over the gate insulating film 111; the insulating film 106 over the gate electrode layer 105; sidewall insulating films 109a and 109b each of which covers a side surface of the gate electrode layer 105 and a side surface of the insulating film 106; a source electrode layer 116a in contact with the oxide semiconductor film 103, the gate insulating film 111, and the sidewall insulating film 109a; and a drain electrode layer 116b in contact with the oxide semiconductor film 103, the gate insulating film 111, and the sidewall insulating film 109b. Further, the insulating film 101, which functions as a base film, is provided between the substrate 100 and the oxide semiconductor film 103, and an interlayer insulating film 115 is provided to cover the transistor 110.

The oxide semiconductor film 103 includes regions 107a and 107b containing dopants and a channel formation region 108 which is provided between the regions 107a and 107b to overlap with the gate electrode layer 105. The regions 107a and 107b containing dopants have a lower resistance than the channel formation region 108. Note that a "metal film" is also referred to as a "conductive film" in some cases.

As illustrated in FIGS. 10A and 10B, the transistor 110 includes the source electrode layer 116a and the drain electrode layer 116b which are in contact with the oxide semiconductor film 103 and have a stacked-layer structure. The source electrode layer 116a is a stack of a metal film 114a and a conductive film 113a. The drain electrode layer 116b is a stack of a metal film 114b and a conductive film 113b.

In order to prevent extraction of oxygen from the oxide semiconductor film 103, the metal films 114a and 114b which are illustrated in FIG. 10B and are in contact with the oxide semiconductor film 103 include a metal having a higher oxidation resistance than a metal element included in the oxide semiconductor film 103.

In order to prevent extraction of oxygen from the oxide semiconductor film 103, the metal films 114a and 114b which are in contact with the oxide semiconductor film 103 include a metal having a higher oxidation resistance than the metal element included in the oxide semiconductor film 103 (a metal having higher Gibbs free energy of oxidation reaction than molybdenum). Specific examples are copper, silver, ruthenium, and iridium. The use of the metal having a higher oxidation resistance than the metal element included in the oxide semiconductor film 103 for the metal films 114a and 114b suppresses the oxygen vacancies in the oxide semiconductor film 103.

Further, since the metal films 114a and 114b are not likely to become oxidized as compared to the oxide semiconductor film 103 and thus, diffusion of oxygen in the metal films 114a and 114b can be suppressed, the formation of the high resistance component in the metal films 114a and 114b can be suppressed. Accordingly, the resistance due to the oxide semiconductor film 103, the source electrode layer 116a, and the drain electrode layer 116b can be reduced, so that the decrease in on-state current of the transistor 110 can be suppressed.

Further, it is preferable that the metal films 114a and 114b (e.g., a film of copper, silver, or ruthenium) having a work function of ±0.2 eV of the electron affinity of the oxide semiconductor film 103 be selected because the contact resistances between the oxide semiconductor film 103 and each of the source electrode layer 116a and the drain electrode layer 116b can be reduced. Thus, the resistance due to the oxide semiconductor film 103, the source electrode layer 116a, and the drain electrode layer 116b can be reduced, so that the decrease in on-state current of the transistor can be suppressed.

For example, when the electron affinity of an In—Ga—Zn-based oxide semiconductor is 4.6 [eV], ruthenium having a work function of 4.71 [eV] is preferably used. Such a material is used for the oxide semiconductor film 103 and the metal films 114a and 114b, so that the contact resistance can be reduced.

Further, the conductive films 113a and 113b which are stacked over the metal films 114a and 114b, respectively, preferably include materials with which an oxide film is not formed at the interface with the metal films 114a and 114b. Examples of a material which can be used for the conductive films 113a and 113b are, in addition to the materials which can be used for the metal films 114a and 114b, gold, platinum, titanium, tungsten, titanium nitride, molybdenum nitride, tungsten nitride, and tantalum nitride. The conductive films 113a and 113b have a single-layer structure or a stacked-layer structure. The stacked-layer structure of the conductive films 113a and 113b can be formed of a tantalum nitride film and a tungsten film.

The transistor 110 illustrated in FIGS. 10A and 10B includes the source electrode layer 116a and the drain electrode layer 116b which include the metal films 114a and 114b and the conductive films 113a and 113b formed using the same material. Thus, the interface between the metal film 114a and the conductive film 113a and the interface between the metal film 114b and the conductive film 113b are shown by dotted lines. In the case of the transistor 110 illustrated in FIGS. 10A and 10B, for example, ruthenium can be used for the metal films 114a and 114b and the conductive films 113a and 113b. In the source electrode layer 116a and the drain electrode layer 116b, the material for the metal films 114a and 114b and the material for the conductive films 113a and 113b may be selected so as to be different from each other. In this case, for example, ruthenium can be used for the metal films 114a and 114b, and tantalum nitride can be used for the conductive films 113a and 113b.

In the transistor 110, metal oxide may be formed in part of the metal films 114a and 114b. For example, when the metal films 114a and 114b include ruthenium, ruthenium oxide may be formed in part of the metal films 114a and 114b. Even when ruthenium oxide is formed in part of the metal film, the resistivity of the ruthenium oxide is $3.5 \times 10^{-5}$ [cmΩ] (300K), and a high resistance component is not formed in the source electrode layer 116a and the drain electrode layer 116b, which is preferable.

The energy gap of the oxide semiconductor film 103 is 2.8 eV to 3.2 eV, which is greater than that of silicon (1.1 eV). The minor carrier density of the oxide semiconductor film 103 is $10^{-9}$ cm$^{-3}$, which is much smaller than the intrinsic carrier density of silicon ($10^{11}$ cm$^{-3}$).

Majority carriers (electrons) of the oxide semiconductor film 103 flow only from a source of a transistor. Further, a channel formation region can be depleted completely. Thus, an off-state current of the transistor can be extremely small. The off-state current of the transistor including the oxide semiconductor film 103 is as small as 10 yA/μm or less at room temperature, or 1 zA/μm or less at 85° C. to 95° C.

The transistor including the oxide semiconductor film 103 has a small S value, so that an ideal value can be obtained. Further, the transistor has high reliability.

As described above, for the metal films 114a and 114b which are in contact with the oxide semiconductor film 103, a metal having a higher oxidation resistance than the metal element included in the oxide semiconductor film 103 (a metal having higher Gibbs free energy of oxidation reaction than at least indium, gallium, zinc, and tin) is used, so that extraction of oxygen from the oxide semiconductor film 103 can be prevented. Accordingly, an increase in oxygen vacancies at the interface between the semiconductor film 103 and each of the source electrode layer 116a and the drain electrode layer 116b can be suppressed, whereby a shift of the threshold voltage of the transistor in the negative direction can be suppressed.

Further, since the metal films 114a and 114b are not likely to become oxidized as compared to the oxide semiconductor film 103 and thus, diffusion of oxygen in the metal films 114a and 114b can be suppressed, the formation of the high resistance component in the metal films 114a and 114b can be suppressed. Accordingly, the resistance due to the oxide semiconductor film 103, the source electrode layer 116a, and the drain electrode layer 116b can be reduced, so that the decrease in on-state current of the transistor can be suppressed.

The structures, methods, and the like described in this embodiment can be combined as appropriate with any of the structures, methods, and the like described in the other embodiments.

Embodiment 7

In this embodiment, an example of a method for manufacturing a semiconductor device including the transistor 110 illustrated in FIGS. 10A and 10B is described with reference to FIGS. 11A to 11E and FIGS. 12A to 12E.

There is no particular limitation on the substrate that can be used as the substrate 100 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 100, or the substrate provided with a semiconductor element can be used as the substrate 100.

A flexible substrate may be used as the substrate 100 to manufacture the semiconductor device. To manufacture a flexible semiconductor device, the transistor 110 including the oxide semiconductor film 103 may be directly formed over a flexible substrate; or alternatively, the transistor 110 including the oxide semiconductor film 103 may be formed over a substrate and then may be separated and transferred to a flexible substrate. Note that in order to separate the transistor 110 from the manufacturing substrate and transfer it to the flexible substrate, a separation layer may be provided between the manufacturing substrate and the transistor 110 including the oxide semiconductor film 103.

Next, the insulating film 101 functioning as a base film is formed over the substrate 100. The insulating film 101 can be formed by a plasma CVD method or a sputtering method to have a single-layer structure or a stacked-layer structure using an oxide insulating film of silicon oxide, silicon oxynitride, aluminum oxide, aluminum oxynitride, hafnium oxide, or gallium oxide; a nitride insulating film of silicon nitride, silicon oxynitride, aluminum nitride, or aluminum nitride oxide; or a film of a mixed material of any of the above materials.

The insulating film 101 (in the case where the insulating film has a stacked-layer structure, one of the stacked films that is in contact with the oxide semiconductor film 103) preferably contains oxygen which exceeds at least the stoichiometric composition in the film (bulk). For example, when a silicon oxide film is used as the insulating film 101, the amount of oxygen is preferably $SiO_2+\alpha$ (where $\alpha>0$).

An insulating film 101 containing much (excessive) oxygen, which serves as an oxygen supply source, may be provided so as to be in contact with the oxide semiconductor film 103, whereby oxygen can be supplied from the insulating film 101 to the oxide semiconductor film 103. Further, the oxide semiconductor film 103 and the insulating film 101 may be subjected to heat treatment in a state where the oxide semiconductor film 103 and the insulating film 101 are at least partly in contact with each other so that oxygen is supplied to the oxide semiconductor film 103. By using the insulating film 101 containing much oxygen, oxygen can be supplied to the oxide semiconductor film 103, so that the oxygen vacancies in the oxide semiconductor film 103 can be reduced.

In this embodiment, a 300-nm-thick silicon oxide film is formed by a sputtering method as the insulating film 101.

Note that plasma treatment may be performed on the substrate 100 before the insulating film 101 functioning as a base film is formed. As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the substrate 100.

In order to improve the planarity of the surface of an oxide semiconductor film 102 which is formed later, planarization treatment is preferably performed on a region which is in the gate insulating film 101 and is in contact with the oxide semiconductor film 102. The planarization treatment may be, but not particularly limited to, polishing treatment (such as chemical mechanical polishing (CMP)), a dry etching treatment, or a plasma treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the insulating film 101.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the insulating film 101.

The planarization treatment on the insulating film 101 makes it possible to reduce the average surface roughness ($R_a$) of the insulating film 101 to 1 nm or less, preferably 0.3 nm or less, further preferably 0.1 nm or less.

Figure 11A:
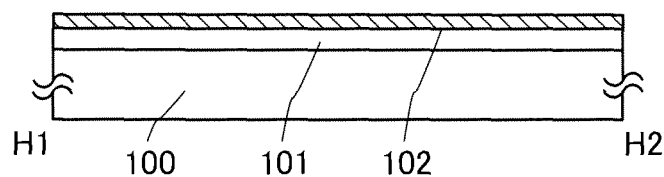
FIGS. 11A to 11E are cross-sectional views illustrating one embodiment of a method for manufacturing a semiconductor device.

Next, the oxide semiconductor film 102 is formed over the insulating film 101 (see FIG. 11A).

For the oxide semiconductor used for the oxide semiconductor film 102, the description of the oxide semiconductor film 403 illustrated in FIG. 3A can be referred to; thus, detailed description is omitted.

The oxide semiconductor film 102 is in a single crystal state, a polycrystalline (also referred to as polycrystal) state, an amorphous state, or the like.

The oxide semiconductor film 102 is preferably a CAAC-OS film.

The oxide semiconductor film 102 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a plasma CVD method, a pulse laser deposition method, an atomic layer deposition (ALD) method, or the like as appropriate. The oxide semiconductor film 102 may be formed with a sputtering apparatus which performs deposition in the state where surfaces of a plurality of substrates are substantially perpendicular to a surface of a sputtering target.

Further, the concentration of hydrogen or water contained in the oxide semiconductor film 103 is preferably as low as possible. This is because if the concentration of hydrogen is high, by a bond of hydrogen and an element contained in an oxide semiconductor, part of hydrogen serves as a donor and generates electrons as carriers.

In order that hydrogen or water is not contained in the oxide semiconductor film 102 as much as possible in the step for forming the oxide semiconductor film 102, it is preferable to heat the substrate provided with the insulating film 101 in a preheating chamber in a sputtering apparatus as a pretreatment for formation of the oxide semiconductor film 102 so that impurities such as hydrogen and moisture adsorbed to the substrate and the insulating film 101 are eliminated and evacuated. As an exhaustion unit provided in the preheating chamber, a cryopump is preferable.

The oxide semiconductor film 102 is preferably formed under a condition such that much oxygen is contained (for example, by a sputtering method in an atmosphere of 100% oxygen) to be a film containing much oxygen (preferably having a region containing an excess of oxygen as compared to the stoichiometric composition of the oxide semiconductor in a crystalline state).

Note that in this embodiment, as the oxide semiconductor film 102, a 10-nm-thick In—Ga—Zn-based oxide film (IGZO film) is formed by a sputtering method using a sputtering apparatus including a DC power device. In this embodiment, an In—Ga—Zn-based oxide target with an atomic ratio of In:Ga:Zn=3:1:2 is used.

It is preferable that a high-purity gas from which impurities such as hydrogen, water, a hydroxyl group, or hydride are removed be used as a sputtering gas for the formation of the oxide semiconductor film 102.

The substrate is held in a deposition chamber kept under reduced pressure. Then, a sputtering gas in which hydrogen and moisture are removed is introduced into the deposition chamber from which remaining moisture is being removed, so that the oxide semiconductor film 102 is formed over the substrate 100 using the target. To remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is evacuated with the cryopump, for example, a hydrogen atom, a compound containing a hydrogen atom, such as water ($H_2O$), (further preferably, also a compound containing a carbon atom), and the like are removed, whereby the concentration of impurities such as hydrogen, moisture, a hydroxyl group, or hydride in the oxide semiconductor film 102 formed in the deposition chamber can be reduced.

The insulating film 101 and the oxide semiconductor film 102 are preferably formed in succession without exposure of the insulating film 101 to the air. By the successive formation of the insulating film 101 and the oxide semiconductor film 102 without exposure of the insulating film 101 to the air, impurities such as hydrogen and moisture can be prevented from being adsorbed onto the surface of the insulating film 101.

Figure 11B:
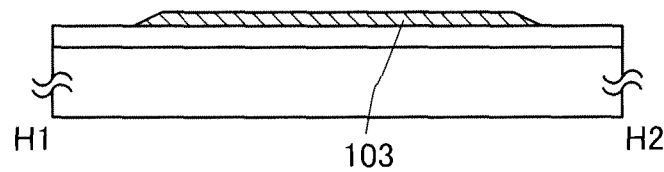

Next, in a photolithography process, a resist mask is formed over the oxide semiconductor film and selective etching is performed, so that the island-shaped oxide semiconductor film 103 is formed (see FIG. 11B). After the island-shaped oxide semiconductor film 103 is formed, the resist mask is removed.

A resist mask for forming the island-shaped oxide semiconductor film 103 may be formed by an inkjet method. Formation of the resist mask by an inkjet method needs no photomask; thus, manufacturing cost can be reduced.

Note that the etching of the oxide semiconductor film 102 may be dry etching, wet etching, or both dry etching and wet etching. Examples of an etchant used for wet etching of the oxide semiconductor film 102 are a mixed solution of phosphoric acid, acetic acid, and nitric acid. Alternatively, ITO-07N (produced by KANTO CHEMICAL CO., INC.) may be used. Further alternatively, the oxide semiconductor film may be etched by a dry etching method using an inductively coupled plasma (ICP) etching method.

Further, heat treatment may be performed on the oxide semiconductor film 103 in order to remove excess hydrogen (including water and a hydroxyl group) (to perform dehydration or dehydrogenation treatment). The temperature of the heat treatment is higher than or equal to 300° C. and lower than or equal to 700° C., or lower than the strain point of a substrate. The heat treatment can be performed under reduced pressure, a nitrogen atmosphere, or the like.

In the case of using a crystalline oxide semiconductor film 103 as the oxide semiconductor film 103, heat treatment for crystallization may be conducted.

In this embodiment, the substrate is put in an electric furnace, which is a kind of heat treatment apparatus, and the oxide semiconductor film 103 is subjected to heat treatment at 450° C. for one hour in a nitrogen atmosphere, and is subjected to further heat treatment at 450° C. for one hour in a mixed atmosphere of nitrogen and oxygen.

Further, the heat treatment apparatus is not limited to the electric furnace, and a device for heating an object by heat conduction or heat radiation from a heating element such as a resistance heating element may also be used. For example, a rapid thermal anneal (RTA) apparatus such as a lamp rapid thermal anneal (LRTA) apparatus or a gas rapid thermal anneal (GRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment with a high-temperature gas. As the high-temperature gas, an inert gas which does not react with an object by heat treatment, such as nitrogen or a rare gas like argon, is used.

For example, as the heat treatment, GRTA may be performed as follows: the substrate is put in an inert gas heated to high temperature of 650° C. to 700° C., heated for several minutes, and taken out of the inert gas.

In the heat treatment, it is preferable that water, hydrogen, and the like be not contained in nitrogen or a rare gas such as helium, neon, or argon. The purity of nitrogen or the rare gas such as helium, neon, or argon which is introduced into the heat treatment apparatus is preferably 6N (99.9999%) or more, further preferably 7N (99.99999%) or more (that is, the impurity concentration is preferably 1 ppm or less, further preferably 0.1 ppm or less).

In addition, after the oxide semiconductor film 103 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb in the measurement with the use of a dew point meter of a cavity ring down laser spectroscopy (CRDS) system) may be introduced into the same furnace. It is preferable that water, hydrogen, and the like be not included in the oxygen gas or the dinitrogen monoxide gas. The purity of the oxygen gas or the dinitrogen monoxide gas which is introduced into the heat treatment apparatus is preferably 6N or more, further preferably 7N or more (that is, the impurity concentration in the oxygen gas or the dinitrogen monoxide gas is preferably 1 ppm or less, further preferably 0.1 ppm or less). The oxygen gas or the dinitrogen monoxide gas acts to supply oxygen that is a main constituent material of the oxide semiconductor and that is reduced by the step for removing impurities for dehydration or dehydrogenation, so that the oxygen vacancies in the oxide semiconductor film 103 can be reduced.

The heat treatment for dehydration or dehydrogenation may be performed after a film-shaped oxide semiconductor film 102 is formed or after the island-shaped oxide semiconductor film 103 is formed.

The heat treatment for dehydration or dehydrogenation may be performed plural times and may also serve as another heat treatment.

When the heat treatment for dehydration or dehydrogenation is performed in the state where the insulating film 101 is covered with the oxide semiconductor film 102 which has not been processed into the oxide semiconductor film 103, oxygen contained in the insulating film 101 can be prevented from being released to the outside by the heat treatment.

Figure 11C:
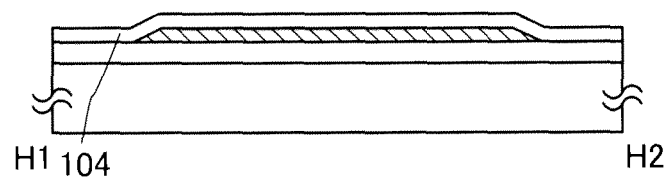
Figure 11D:
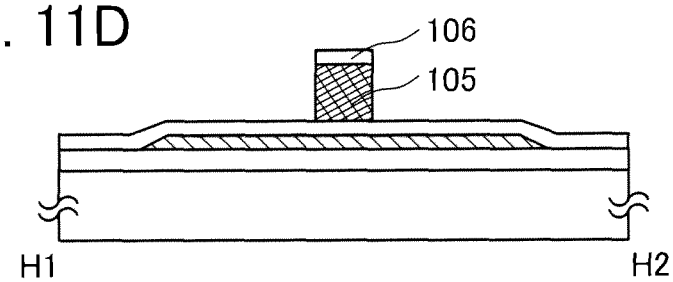

Next, an insulating film 104 which is to be a gate insulating film is formed over the insulating film 101 and the oxide semiconductor film 103 (see FIG. 11C).

To improve the coverage with the insulating film 104, the above-described planarizing treatment may be performed also on the surface of the oxide semiconductor film 103. It is preferable that the flatness of the surface of the oxide semiconductor film 103 be good particularly when the thickness of the insulating film 104 is small.

The insulating film 104 has a thickness greater than or equal to 1 nm and less than or equal to 20 nm and can be formed by a sputtering method, an MBE method, a plasma CVD method, a pulse laser deposition method, an ALD method, or the like as appropriate. The insulating film 104 may also be formed with a sputtering apparatus which performs film formation in the state where surfaces of a plurality of substrates are substantially perpendicular to a surface of a sputtering target.

The insulating film 104 can be formed using silicon oxide, gallium oxide, aluminum oxide, silicon nitride, silicon oxynitride, aluminum oxynitride, or silicon nitride oxide. The insulating film 104 can be formed using a high-k material such as hafnium oxide, yttrium oxide, hafnium silicate ($HfSi_xO_y$, (x>0, y>0)), hafnium silicate to which nitrogen is added ($HfSiO_xN_y$ (x>0, y>0)), hafnium aluminate ($HfAl_xO_y$, (x>0, y>0)), or lanthanum oxide, whereby gate leakage current can be reduced. The insulating film 104 can be formed to have a single-layer structure or a stacked-layer structure using any of the above materials.

In this embodiment, a 20-nm-thick silicon oxynitride film is formed by a plasma CVD method.

Next, after a conductive film which is to be a gate electrode layer (including a wiring formed using the same layer as the gate electrode layer) is formed over the insulating film 104, an insulating film is formed. After that, in a photolithography process, a resist mask is formed over the insulating film and selective etching is performed, so that the gate electrode layer 105 and the insulating film 106 are stacked (see FIG. 11D).

The gate electrode layer 105 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 105. The gate electrode layer 105 has either a single-layer structure or a stacked-layer structure.

The gate electrode layer 105 can also be formed using a conductive material such as indium tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 105 has a stacked structure of the above conductive material and the above metal material.

As one layer of the gate electrode layer 105 which is in contact with the insulating film 104, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function higher than or equal to 5 eV (electron volts), preferably higher than or equal to 5.5 eV (electron volts); thus, when these are used as the gate electrode layer, the threshold voltage of the electric characteristics of the transistor can be positive. Accordingly, a so-called normally-off switching element can be obtained.

As the insulating film 106, an inorganic insulating film such as silicon oxide, silicon oxynitride, aluminum oxide, aluminum oxynitride, silicon nitride, aluminum nitride, silicon nitride oxide, or aluminum nitride oxide can be used. The insulating film 106 can be formed by a plasma CVD method, a sputtering method, or the like.

Figure 11E:
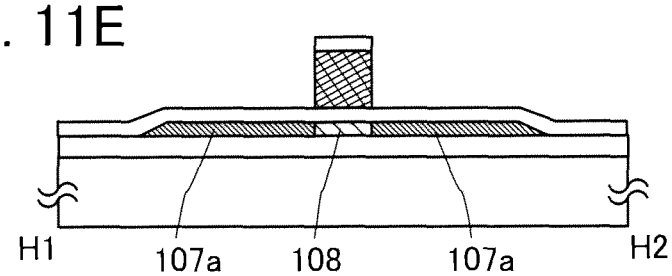

Next, dopants are added into the oxide semiconductor film 103 through the insulating film 104 using the gate electrode layer 105 and the insulating film 106 as masks, so that the regions 107a and 107b each of which contains dopants are formed (see FIG. 11E).

The dopants are an element by which the conductivity of the oxide semiconductor film 103 is changed. One or more selected from the following can be used as the dopant: Group 15 elements (e.g., nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn).

The dopants can be added into the oxide semiconductor film 103 through another film (in this embodiment, the insulating film 104) by an addition method. Examples of the method for adding the dopant are an ion implantation method, an ion doping method, and a plasma immersion ion implantation method. In this case, it is preferable to use a single ion of the dopant a fluoride ion or a chloride ion thereof.

The introduction of the dopants may be controlled by setting the introduction conditions such as the accelerated voltage and the dosage, or the thickness of the films through which the dopants pass as appropriate. In this embodiment, phosphorus is used as the dopant, and boron ions are implanted by an ion implantation method. The dosage of the dopants can be set to be greater than or equal to $1\times10^{13}$ ions/cm$^2$ and less than or equal to $5\times10^{16}$ ions/cm$^2$.

By adding the dopants to the oxide semiconductor film 103, the concentration of the dopants in the regions 107a and 107b each of which contains dopants are preferably increased to greater than or equal to $5\times10^{18}$/cm$^3$ and less than or equal to $1\times10^{22}$/cm$^3$.

The dopants may be added to the oxide semiconductor film 103 while the substrate 100 is heated. Further, the introduction of the dopants into the oxide semiconductor film 103 may be performed plural times, and the number of kinds of dopant may be plural.

Further, heat treatment may be performed thereon after the dopants are added. The heat treatment is preferably performed at a temperature higher than or equal to 300° C. and lower than or equal to 700° C. (further preferably higher than or equal to 300° C. and lower than or equal to 450° C.) for one hour under an oxygen atmosphere. The heat treatment may be performed under a nitrogen atmosphere, reduced pressure, or the air (ultra-dry air).

In this embodiment, phosphorus (P) ions are implanted into the oxide semiconductor film 103 by an ion implantation method. Note that the conditions of the phosphorus (P) ion implantation are as follows: the acceleration voltage is 25 kV and the dosage is $1.0\times10^{15}$ ions/cm$^2$.

When the oxide semiconductor film 103 is a CAAC-OS film, the oxide semiconductor film 103 is partly amorphized by introduction of the dopants in some cases. In this case, the crystallinity of the oxide semiconductor film 103 can be recovered by performing heat treatment thereon after the introduction of the dopant.

By the introduction of the dopants, the oxide semiconductor film 103 in which the regions 107a and 107b containing dopants between which the channel formation region 108 is sandwiched are formed.

Next, an insulating film is formed over the gate electrode layer 105 and the insulating film 106, and the insulating film is etched, whereby the sidewall insulating films 109a and 109b are formed. Further, the insulating film 104 is etched using the gate electrode layer 105 and the sidewall insulating films 109a and 109b as masks, so that the gate insulating film 111 is formed (see FIG. 12A).

The sidewall insulating films 109a and 109b can be formed using a material and a method similar to those of the insulating film 106. In this embodiment, a silicon oxynitride film formed by a CVD method is used for the sidewall insulating films 109a and 109b.

Figure 12A:
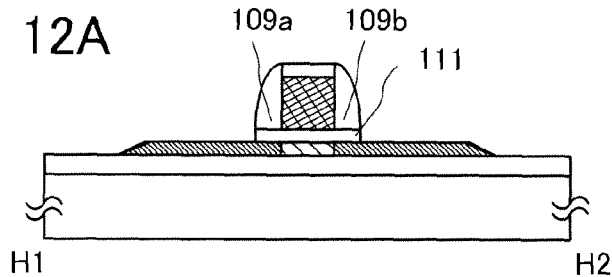
FIGS. 12A to 12E are cross-sectional views illustrating one embodiment of a method for manufacturing a semiconductor device.
Figure 12B:
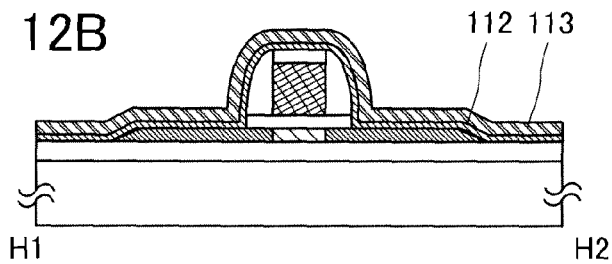

Next, a metal oxide film 112 and a conductive film 113 for forming a source electrode layer and a drain electrode layer (including a wiring formed of the same layer as the source electrode layer and the drain electrode layer) is formed to cover the oxide semiconductor film 103, the gate insulating film 111, the sidewall insulating films 109a and 109b, and the insulating film 106 (see FIG. 12B).

Further, for the metal oxide film 112, a metal oxide film having a higher reducing property than the oxide semiconductor film 103 is used. The metal oxide film having a higher reducing property than the oxide semiconductor film 103 may include any metal as long as the metal has a higher reducing property than indium oxide, gallium oxide, zinc oxide, and tin oxide (that is, the metal has higher Gibbs free energy of oxidation reaction than indium, gallium, zinc, and tin) as shown in FIG. 9. Specific examples are copper oxide, silver oxide, ruthenium oxide, and iridium oxide. The metal oxide film 112 is formed to have a single-layer structure or a stacked-layer structure.

The thickness of the metal oxide film 112 is greater than or equal to 1 nm and smaller than or equal to 50 nm, preferably greater than or equal to 1 nm and smaller than or equal to 30 nm, further preferably greater than or equal to 5 nm and smaller than or equal to 10 nm. Further, the metal oxide film 112 can be formed by a sputtering method, a plasma CVD method, or the like.

In this embodiment, as the metal oxide film 112, a 10-nm-thick ruthenium oxide film is formed by a sputtering method.

The conductive film 113 may be formed using a material that can withstand heat treatment performed later. Further, the conductive film 113 is preferably formed using a material with which an oxide film is not formed at the interface with the metal oxide film 112 by heat treatment performed later. For the conductive film 113, for example, gold, platinum, copper, silver, ruthenium, iridium, titanium, tungsten, titanium nitride, molybdenum nitride, tungsten nitride, tantalum nitride, and the like can be used. The conductive film 113 is preferably formed thicker than the metal oxide film 112, and is formed to have a single-layer structure or a stacked-layer structure. When the conductive film 113 has a stacked-layer structure, a tungsten film may be formed over a tantalum nitride film.

The thickness of the conductive film 113 is greater than or equal to 50 nm and smaller than or equal to 600 nm. Further, the conductive film 113 can be formed by a sputtering method, a plasma CVD method, or the like.

In this embodiment, as the conductive film 113, a 200-nm-thick ruthenium film is formed by a sputtering method.

Figure 12C:
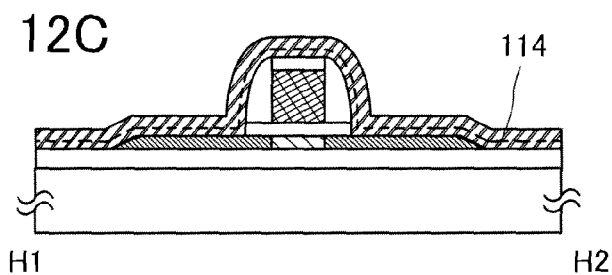

Next, heat treatment is performed on the oxide semiconductor film 103, the metal oxide film 112, and the conductive film 113 (see FIG. 12C). Heat treatment is performed while the metal oxide film 112 is in contact with the oxide semiconductor film 103, so that oxygen is released from the metal oxide film 112 and is supplied to the oxide semiconductor film 103. By supply of oxygen to the oxide semiconductor film 103, oxygen vacancies in the oxide semiconductor film 103 can be reduced. Further, the metal oxide film 112 which has a higher reducing property than the oxide semiconductor film 103 is reduced to form a metal film 114.

Note that in FIG. 12C, the case where the metal oxide film 112 is completely reduced to the metal film 114 is described; however, the following case is also possible: only a portion in the vicinity of the interface between the metal oxide film 112 and the oxide semiconductor film 103 is reduced to be the metal film 114, and the other portion which is not in the vicinity of the interface remains the metal oxide film 112. For example, when ruthenium oxide is used for the metal oxide film 112, only a portion in the vicinity of the interface may be reduced to be ruthenium, and the other portion which is not in the vicinity of the interface may remain ruthenium oxide. Even when the other portion which is not in the vicinity of the interface remains ruthenium oxide, the resistivity of the ruthenium oxide is $3.5 \times 10^{-5}$ [cmΩ] (300K), and a high resistance component is not formed in a source electrode layer and a drain electrode layer, which is preferable.

Further, the metal film 114 which is formed by reduction of the metal oxide film 112 is a film having a higher oxidation resistance than the metal element included in the oxide semiconductor film 103. That is, in the metal film 114, oxygen is not likely to be diffused.

Further, as illustrated in FIG. 12C, the oxide semiconductor film 103 is covered with the metal film 114 and the conductive film 113. Accordingly, release of oxygen contained in the oxide semiconductor film 103, the gate insulating film 111, and the sidewall insulating films 109a and 109b to the outside can be suppressed. Further, the oxygen contained in the gate insulating film 111 and the sidewall insulating films 109a and 109b can be supplied to the oxide semiconductor film 103.

Heat treatment is performed while the conductive film 113 is provided over the metal oxide film 112, oxygen contained in the metal oxide film 112 is not released to the outside and is supplied to the oxide semiconductor film 103, which is preferable.

In this embodiment, the heat treatment may be conducted with a GRTA apparatus at 650° C. for 1 minute to 5 minutes. Further, in this embodiment, the heat treatment is conducted with an electric furnace at 500° C. for 30 minutes to 1 hour.

Figure 12D:
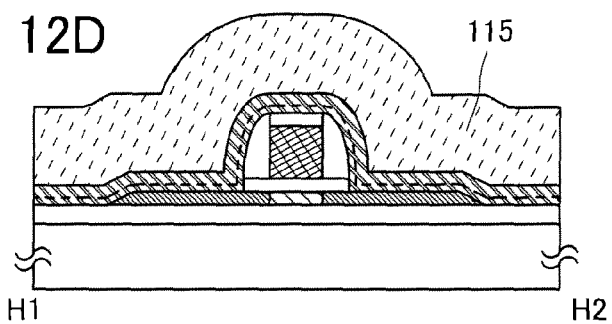

Next, the interlayer insulating film 115 is formed over the conductive film 113 (see FIG. 12D).

The interlayer insulating film 115 is formed as appropriate by a method, a sputtering method for example, which prevents entry of impurities such as hydrogen.

The interlayer insulating film 115 can have a single-layer structure or a stacked structure including an inorganic insulating film, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film.

As the interlayer insulating film 115, an inorganic insulating film having a high density is preferably provided in contact with the conductive film 113. For example, an aluminum oxide film is formed by a sputtering method. The aluminum oxide film is formed to have high density (the film density is higher than or equal to $3.2$ $g/cm^3$, preferably higher than or equal to $3.6$ $g/cm^3$), so that the transistor 110 can have stable electric characteristics. The film density can be measured by Rutherford backscattering spectrometry (RBS) or X-ray reflectmetry (XRR).

Further, the case where the source electrode layer 116a includes the metal film 114a and the conductive film 113a and the drain electrode layer 116b include the metal film 114b and the conductive film 113b is described in this embodiment; however, one embodiment of the present invention is not limited thereto. For example, the conductive films 113a and 113b are not necessarily formed.

The aluminum oxide film which can be used as the inorganic insulating film provided over the transistor 110 has a high shielding effect (blocking effect) of preventing penetration of both oxygen and impurities such as hydrogen and moisture.

Therefore, during the manufacturing process and after the manufacture, the aluminum oxide film functions as a protective film for preventing entry of an impurity such as hydrogen or moisture, which causes change, into the oxide semiconductor film 103 and release of oxygen, which is a main constituent material of the oxide semiconductor, from the oxide semiconductor film 103.

Next, in a photolithography process, a resist mask is formed over the conductive film 113, and the conductive film 113 and the metal film 114 are selectively etched, so that processing of the source electrode layer and the drain electrode layer in the direction of the channel width is performed.

Next, polishing treatment is performed on the interlayer insulating film 115, the conductive film 113, and the metal film 114 until the insulating film 106 is exposed. Accordingly, the interlayer insulating film 115, the conductive film 113, and the metal film 114 are partly etched, so that the source electrode layer 116a and the drain electrode layer 116b are formed.

As the polishing treatment, a chemical mechanical polishing (CMP) method can be used, and another cutting (grinding or polishing) method may be alternatively used. Further, the planarity of the polished surface can be improved by a dry etching method, plasma treatment (reverse plasma treatment), or the like after the polishing treatment.

In this embodiment, since the insulating film 106 is provided over the gate electrode layer 105, even when the polishing treatment is performed on the interlayer insulating film 115, the conductive film 113, and the metal film 114, a short circuit between the gate electrode layer 105 and each of the source electrode layer 116a and the drain electrode layer 116b can be suppressed.

Figure 12E:
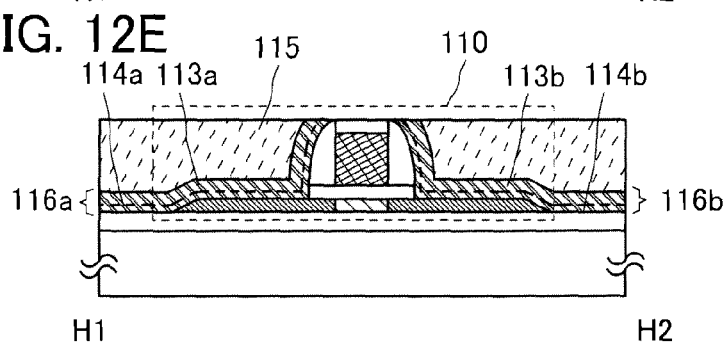

Through the above process, the transistor 110 according to one embodiment of the present invention is formed (see FIG. 12E).

The oxide semiconductor film 103 is preferably a highly purified oxide semiconductor film which contains few impurities such as copper, aluminum, and chlorine. It is preferable that steps through which these impurities do not enter the oxide semiconductor film or are not attached to the surface of the oxide semiconductor film be selected as appropriate as the manufacturing process of the transistor. When the impurities are attached to the surface of the oxide semiconductor film, it is preferable to remove impurities on the surface of the oxide semiconductor film by exposure to oxalic acid, diluted hydrofluoric acid, or the like or performance of plasma treatment (e.g., $N_2O$ plasma treatment). Specifically, the concentration of copper in the oxide semiconductor film 103 is preferably smaller than or equal to $1\times10^{18}$ atoms/cm$^3$, preferably smaller than or equal to $1\times10^{17}$ atoms/cm$^3$. Further, the concentration of aluminum in the oxide semiconductor film is smaller than or equal to $1\times10^{18}$ atoms/cm$^3$. Further, the concentration of chlorine in the oxide semiconductor film is smaller than or equal to $2\times10^{18}$ atoms/cm$^3$.

The oxide semiconductor film is preferably in a supersaturated state in which oxygen which exceeds the stoichiometric composition is contained just after its formation. For example, when an oxide semiconductor film is formed by a sputtering method, it is preferable that the film be formed in a film formation gas containing a high percentage of oxygen, and it is especially preferable that the film be formed under an oxygen atmosphere (oxygen gas 100%). When the film is formed in a film formation gas containing a high percentage of oxygen, particularly under an oxygen atmosphere (oxygen gas 100%), even when the film formation temperature is higher than or equal to 300° C. for example, the release of Zn from the film can be suppressed.

The oxide semiconductor film is preferably highly purified by sufficient removal of impurities such as hydrogen or sufficient supply of oxygen to be in a supersaturated state. Specifically, the concentration of hydrogen in the oxide semiconductor film is $5\times10^{19}$ atoms/cm$^3$ or less, preferably $5\times10^{18}$ atoms/cm$^3$ or less, further preferably $5\times10^{17}$ atoms/cm$^3$ or less. Note that the concentration of hydrogen in the oxide semiconductor film is measured by secondary ion mass spectrometry (SIMS). Further, for sufficient supply of oxygen to make the film in a supersaturated state, an insulating film (e.g., $SiO_x$) containing excess oxygen is provided to be in contact with and covers the oxide semiconductor film.

In the case where the concentration of deuterium in an insulating film containing excess oxygen is greater than or equal to $7.2\times10^{20}$ atoms/cm$^3$, variation in initial characteristics of the transistor is increased, a channel length dependence of electric characteristics of the transistor is increased, and the transistor is significantly deteriorated in the BT stress test; therefore, the concentration of deuterium in the insulating film containing excess oxygen is preferably less than $7.2\times10^{20}$ atoms/cm$^3$. In other words, the concentration of hydrogen in the oxide semiconductor film is preferably less than or equal to $5\times10^{19}$ atoms/cm$^3$, and the concentration of deuterium in the insulating film containing excess oxygen is preferably less than $7.2\times10^{20}$ atoms/cm$^3$.

A blocking film (e.g., $AlO_x$) that prevents oxygen from diffusing into the oxide semiconductor film is preferably formed outside the insulating film containing excess oxygen to cover the oxide semiconductor film.

The oxide semiconductor film is covered with the insulating film containing excess oxygen or a blocking film, so that the oxide semiconductor film can be in a state in which oxygen the amount of which is approximately the same as the stoichiometric composition is contained or a supersaturated state in which oxygen which exceeds the stoichiometric composition is contained. For example, when the oxide semiconductor film is an IGZO film, an example of the stoichiometric composition is In:Ga:Zn:O=1:1:1:4 [atomic ratio]; thus, an atomic ratio of oxygen is four or more.

In this embodiment, the case where heat treatment is performed after the conductive film 113 is formed over the metal oxide film 112 is described; however, one embodiment of the present invention is not limited thereto. For example, heat treatment may be performed after the metal oxide film 112 is formed over the oxide semiconductor film 103 or after the conductive film 113 is formed over the metal oxide film 112 and the interlayer insulating film 115 is formed.

Further, in this embodiment, the material for the metal films 114a and 114b and the material for the conductive films 113a and 113b are selected to be the same as each other; however, the material for the metal films 114a and 114b and the material for the conductive films 113a and 113b may be selected so as to be different from each other. For example, ruthenium oxide and tantalum nitride are used for the metal oxide film 112 and the conductive film 113, respectively, and heat treatment is performed thereon, which forms a stacked layer of ruthenium and tantalum nitride is formed. Further, an oxide film is not formed at the interface between the metal film 114a and the conductive film 113a and the interface between the metal film 114b and the conductive film 113b, which is preferable. Note that the conductive films 113a and 113b may be formed to have a stacked layer of tantalum nitride and tungsten.

Note that even when the material for the metal films 114a and 114b and the material for the conductive films 113a and 113b are selected to be the same as each other, the characteristics of the metal films 114a and 114b are different from those of the conductive films 113a and 113b in some cases because the metal films 114a and 114b are the films which have formed by reducing the metal oxide film 112 and the conductive films 113a and 113b are the films which have formed by deposition. For example, the film density of the metal films 114a and 114b are lower than that of the conductive films 113a and 113b in some cases. The film density can be measured by X-ray reflectmetry (XRR), for example.

According to this embodiment, the metal oxide film 112 which is in contact with the oxide semiconductor film 103 is reduced by heat treatment, so that oxygen is released from the metal oxide film 112 and can be supplied to the oxide semiconductor film 103. Oxygen vacancies can be reduced at the interface between the oxide semiconductor film 103 and each of the source electrode layer 116a and the drain electrode layer 116b. Accordingly, a shift of the threshold voltage of the transistor 110 in the negative direction can be suppressed.

Further, the metal film 114 which is formed by reduction of the metal oxide film 112 has a higher oxidation resistance than the metal element included in the oxide semiconductor film 103. That is, the metal film 114 becomes a film in which oxygen is not likely to be diffused. The metal films 114a and 114b are used for the source electrode layer 116a and the drain electrode layer 116b, so that the formation of the high resistance component in the metal films 114a and 114b can be suppressed. Accordingly, the resistance due to the oxide semiconductor film 103, the source electrode layer 116a, and the drain electrode layer 116b can be reduced, so that the decrease in on-state current of the transistor 110 can be suppressed.

Further, it is preferable that the metal film 114 (e.g., a film of copper, silver, or ruthenium) having a work function of ±0.2 eV of the electron affinity of the oxide semiconductor film 103 be selected because the contact resistances between the oxide semiconductor film 103 and each of the source electrode layer 116a and the drain electrode layer 116b can be reduced. Thus, the resistance due to the oxide semiconductor film 103, the source electrode layer 116a, and the drain electrode layer 116b can be reduced, so that the decrease in on-state current of the transistor can be suppressed.

The structures, methods, and the like described in this embodiment can be combined as appropriate with any of the structures, methods, and the like described in the other embodiments.

Embodiment 8

In this embodiment, another embodiment of a semiconductor device and a method for manufacturing the semiconductor device are described with reference to FIGS. 13A and 13B. Note that the description of the same portion as that in the above embodiments or a portion having functions similar to that in the above embodiments is not repeated. In addition, detailed description of the same portion is omitted.

Figure 13A:
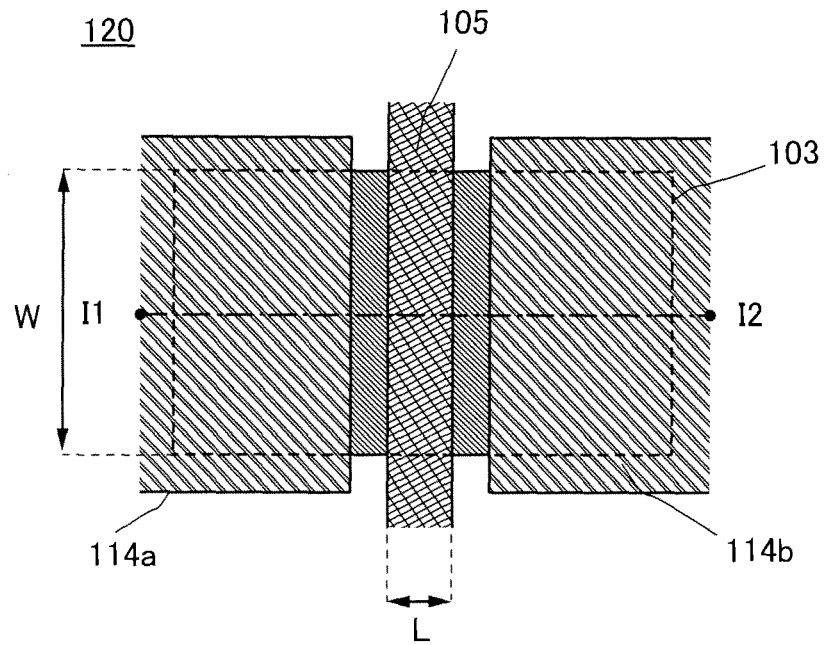
FIGS. 13A and 13B are a plan view and a cross-sectional view illustrating one embodiment of a semiconductor device.
Figure 13B:
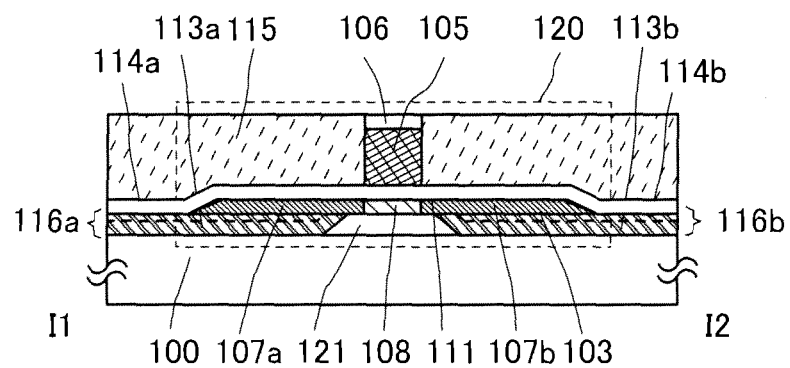

A transistor 120 illustrated in FIGS. 13A and 13B is an example of a top-gate transistor. FIG. 13A is a plan view of the transistor 120, and FIG. 13B is a cross-sectional view taken along line I1-I2 in FIG. 13A (a cross-sectional view in the channel length direction of the transistor 120). Further, in FIG. 13A, some components of the transistor 120 (e.g., the gate insulating film 111) are not illustrated to avoid complexity.

The transistor 120 illustrated in FIGS. 13A and 13B includes the source electrode layer 116a and the drain electrode layer 116b over the substrate 100 having an insulating surface, the oxide semiconductor film 103 over the source electrode layer 116a and the drain electrode layer 116b, the gate insulating film 111 over the oxide semiconductor film 103, the gate electrode layer 105 over the gate insulating film 111, and the insulating film 106 over the gate electrode layer 105. Further, the interlayer insulating film 115 is provided so as to cover the transistor 120.

The oxide semiconductor film 103 includes the regions 107a and 107b containing dopants and the channel formation region 108 which is provided between the regions 107a and 107b to overlap with the gate electrode layer 105. The regions 107a and 107b containing dopants have a lower resistance than the channel formation region 108.

As illustrated in FIG. 13B, the transistor 120 includes the source electrode layer 116a and the drain electrode layer 116b which are in contact with the oxide semiconductor film 103 and have a stacked-layer structure. The source electrode layer 116a is a stack of the conductive film 113a and the metal film 114a. The drain electrode layer 116b is a stack of the conductive film 113b and the metal film 114b.

The transistor 120 illustrated in FIGS. 13A and 13B is different from the transistor 110 illustrated in FIGS. 10A and 10B in a position in which the oxide semiconductor film 103 is in contact with the source electrode layer 116a and the drain electrode layer 116b. In the transistor 110 illustrated in FIGS. 10A and 10B, the source electrode layer 116a and the drain electrode layer 116b are in contact with a top surface of the oxide semiconductor film 103; on the other hand, in the transistor 120 illustrated in FIGS. 13A and 13B, the source electrode layer 116a and the drain electrode layer 116b are in contact with a bottom surface of the oxide semiconductor film 103.

In order to prevent extraction of oxygen from the oxide semiconductor film 103, the metal films 114a and 114b which are in contact with the oxide semiconductor film 103 include a metal having a higher oxidation resistance than a metal element included in the oxide semiconductor film 103 (a metal having higher Gibbs free energy of oxidation reaction than molybdenum). Specific examples are copper, silver, ruthenium, and iridium. The use of the metal having a higher oxidation resistance than the metal element included in the oxide semiconductor film 103 for the metal films 114a and 114b suppresses the oxygen vacancies in the oxide semiconductor film 103.

Further, since the metal films 114a and 114b are not likely to become oxidized as compared to the oxide semiconductor film 103 and thus, diffusion of oxygen in the metal films 114a and 114b can be suppressed, the formation of the high resistance component in the metal films 114a and 114b can be suppressed. Accordingly, the resistance due to the oxide semiconductor film 103, the source electrode layer 116a, and the drain electrode layer 116b can be reduced, so that the decrease in on-state current of the transistor can be suppressed.

Further, it is preferable that the metal films 114a and 114b (e.g., a film of copper, silver, or ruthenium) having a work function of ±0.2 eV of the electron affinity of the oxide semiconductor film 103 be selected because the contact resistances between the oxide semiconductor film 103 and each of the source electrode layer 116a and the drain electrode layer 116b can be reduced. Thus, the resistance due to the oxide semiconductor film 103, the source electrode layer 116a, and the drain electrode layer 116b can be reduced, so that the decrease in on-state current of the transistor can be suppressed.

Further, the conductive films 113a and 113b which are stacked over the metal films 114a and 114b, respectively, preferably include materials with which an oxide film is not formed at the interface with the metal films 114a and 114b. Examples of a material which can be used for the conductive films 113a and 113b are, in addition to the materials which can be used for the metal films 114a and 114b, gold, platinum, titanium, tungsten, titanium nitride, molybdenum nitride, tungsten nitride, and tantalum nitride. The conductive films 113a and 113b have a single-layer structure or a stacked-layer structure. The stacked-layer structure of the conductive films 113a and 113b can be formed of a tantalum nitride film and a tungsten film.

The case where the metal films 114a and 114b and the conductive films 113a and 113b are formed using the same material in the source electrode layer 116a and the drain electrode layer 116b of the transistor 120 is described with reference to FIGS. 13A and 13B; however, the material for the metal films 114a and 114b and the material for the conductive films 113a and 113b may be selected so as to be different from each other.

In the transistor 120 illustrated in FIGS. 13A and 13B, metal oxide may be formed in part of the metal films 114a and 114b. For example, when the metal films 114a and 114b include ruthenium, ruthenium oxide may be formed in part of the metal films 114a and 114b. Even when ruthenium oxide is formed in part of the metal films 114a and 114b, the resistivity of the ruthenium oxide is $3.5 \times 10^{-5}$ [cmΩ] (300K), and a high resistance component is not formed in the source electrode layer 116a and the drain electrode layer 116b, which is preferable.

Further, over the substrate 100, an island-shaped insulating film 121 is provided between the source electrode layer 116a and the drain electrode layer 116b. Further, the island-shaped insulating film 121 is provided to overlap with the channel formation region 108 of the oxide semiconductor film 103.

As the insulating film 121, for example, an inorganic insulating film such as a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, or an aluminum nitride oxide film can be used.

Further, the insulating film 121 (in the case where the insulating film 121 has a stacked-layer structure, one of the stacked films that is in contact with the oxide semiconductor film 103) contains much oxygen, so that the insulating film 121 (or the film in contact with the oxide semiconductor film 103) can favorably function as a supply source which supplies oxygen to the oxide semiconductor film 103.

As described above, for the metal films 114a and 114b which are in contact with the oxide semiconductor film 103, a metal having a higher oxidation resistance than the metal element included in the oxide semiconductor film 103 (a metal having higher Gibbs free energy of oxidation reaction than at least indium, gallium, zinc, and tin) is used, so that extraction of oxygen from the oxide semiconductor film 103 can be prevented. Accordingly, an increase in oxygen vacancies at the interface between the semiconductor film 103 and each of the source electrode layer 116a and the drain electrode layer 116b can be suppressed, whereby a shift of the threshold voltage of the transistor can be suppressed.

Further, since the metal films 114a and 114b are not likely to become oxidized as compared to the oxide semiconductor film 103 and thus, diffusion of oxygen in the metal films 114a and 114b can be suppressed, the formation of the high resistance component in the metal films 114a and 114b can be suppressed. Accordingly, the resistance due to the oxide semiconductor film 103, the source electrode layer 116a, and the drain electrode layer 116b can be reduced, so that the decrease in on-state current of the transistor can be suppressed.

The structures, methods, and the like described in this embodiment can be combined as appropriate with any of the structures, methods, and the like described in the other embodiments.

Embodiment 9

In this embodiment, an example of a method for manufacturing a semiconductor device including the transistor 120 illustrated in FIGS. 13A and 13B is described with reference to FIGS. 14A to 14F. The method for manufacturing transistor 120 is different from that of the transistor 110 described in Embodiment 7 in a method for forming the insulating film 121, the source electrode layer 116a, and the drain electrode layer 116b. Therefore, the detailed description of steps similar to those in Embodiment 7 is omitted.

First, an insulating film to be the island-shaped insulating film 121 is formed over the substrate 100.

The insulating film can be formed using a material and method similar to those of the insulating film 101 which functions as a base film. Note that the thickness of the insulating film can be set depending on the thicknesses of the source electrode layer 116a and the drain electrode layer 116b which are to be formed later.

Next, in a photolithography process, a resist mask is formed over the insulating film and selective etching is performed, so that the island-shaped insulating film 121 is formed. After the island-shaped insulating film 121 is formed, the resist mask is removed.

Figure 14A:
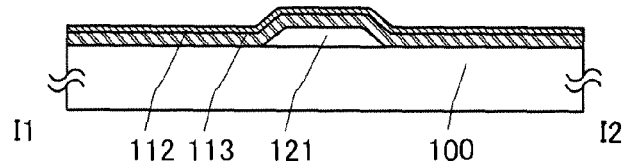
FIGS. 14A to 14F are cross-sectional views illustrating one embodiment of a method for manufacturing a semiconductor device.
Figure 14B:
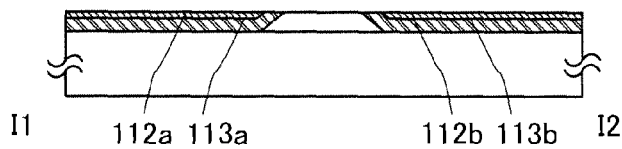

Next, the conductive film 113 and the metal oxide film 112 which are to be a source electrode layer and a drain electrode layer (including a wiring formed using the same layer as the source electrode layer and the drain electrode layer) are formed over the substrate 100 and the insulating film 121 (see FIG. 14A).

The conductive film 113 may be formed using a material that can withstand heat treatment performed later. Further, the conductive film 113 is preferably formed using a material with which an oxide film is not formed at the interface with the metal oxide film 112 by heat treatment performed later. For the conductive film 113, for example, gold, platinum, copper, silver, ruthenium, iridium, titanium, tungsten, titanium nitride, molybdenum nitride, tungsten nitride, tantalum nitride, and the like can be used. The conductive film 113 is preferably formed thicker than the metal oxide film 112, and is formed to have a single-layer structure or a stacked-layer structure. When the conductive film 113 has a stacked-layer structure, a tantalum nitride film may be formed over a tungsten film.

The thickness of the conductive film 113 is greater than or equal to 50 nm and smaller than or equal to 600 nm. Further, the conductive film 113 can be formed by a sputtering method, a plasma CVD method, or the like.

In this embodiment, as the conductive film 113, a 200-nm-thick ruthenium film is formed by a sputtering method.

For the metal oxide film, a metal oxide film having a higher reducing property than the oxide semiconductor film 103 is used. The metal oxide film having a higher reducing property than the oxide semiconductor film 103 may include any metal oxide as long as the metal oxide has a higher reducing property than indium oxide, gallium oxide, zinc oxide, and tin oxide (that is, the metal has higher Gibbs free energy of oxidation reaction than indium, gallium, zinc, and tin) as shown in FIG. 9. Specific examples are copper oxide, silver oxide, ruthenium oxide, and iridium oxide. The metal oxide film 112 is formed to have a single-layer structure or a stacked-layer structure.

The thickness of the metal oxide film 112 is greater than or equal to 1 nm and smaller than or equal to 50 nm, preferably greater than or equal to 1 nm and smaller than or equal to 30 nm, further preferably greater than or equal to 5 nm and smaller than or equal to 10 nm. Further, the metal oxide film 112 can be formed by a sputtering method, a plasma CVD method, or the like.

In this embodiment, as the metal oxide film 112, a 10-nm-thick ruthenium oxide film is formed by a sputtering method.

Next, in a photolithography process, a resist mask is formed over the conductive film 113, and the conductive film 113 and the metal film 114 are selectively etched, so that processing of the source electrode layer and the drain electrode layer in the direction of the channel width is performed.

Next, polishing treatment is performed on the conductive film 113 and the metal oxide film 112 until the insulating film 121 is exposed. Accordingly, the conductive film 113 and the metal oxide film 112 are partly etched, so that the conductive films 113a and 113b and the metal oxide films 112a and 112b are formed (see FIG. 14B).

As the polishing treatment, a chemical mechanical polishing (CMP) method can be used, and another cutting (grinding or polishing) method may be alternatively used. Further, the planarity of the polished surface can be improved by a dry etching method, plasma treatment (reverse plasma treatment), or the like after the polishing treatment.

At this time, the average surface roughness ($R_a$) of the insulating film 121 and the metal oxide films 112a and 112b is preferably set to 1 nm or less, preferably 0.3 nm or less, further preferably 0.1 nm or less.

Figure 14C:
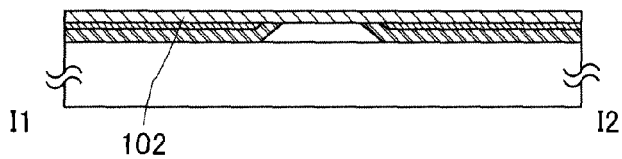

Next, the oxide semiconductor film 102 is formed over the insulating film 121 and the metal oxide films 112a and 112b (see FIG. 14C).

In this embodiment, as the oxide semiconductor film 102, a 10-nm-thick In—Ga—Zn-based oxide film (an IGZO film) is formed by a sputtering method using a sputtering apparatus that includes an AC power supply device.

Figure 14D:
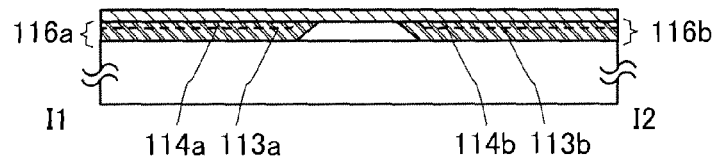
Figure 14E:
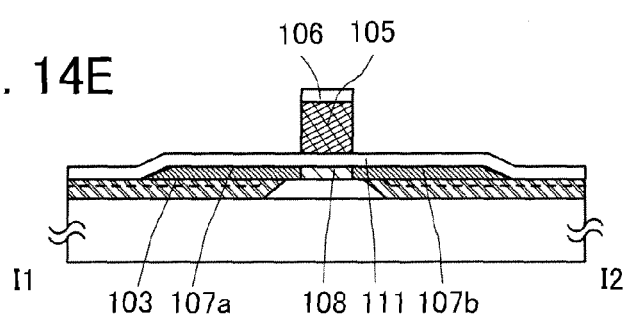

Next, heat treatment is performed on the oxide semiconductor film 103 and the metal oxide films 112a and 112b (see FIG. 14D). Heat treatment is performed while the metal oxide film 112 is in contact with the oxide semiconductor film 103, so that oxygen is released from the metal oxide film 112 and is supplied to the oxide semiconductor film 103. By supply of oxygen to the oxide semiconductor film 103, oxygen vacancies in the oxide semiconductor film 103 can be reduced. Further, the metal oxide film 112 which has a higher reducing property than the oxide semiconductor film 103 is reduced, so that the metal film 114 is formed.

Note that in FIG. 14C, the case where the metal oxide films 112a and 112b are completely reduced to the metal films 114a and 114b is described; however, the following case is also possible: only a portion in the vicinity of the interface between the metal oxide films 112a and 112b and the oxide semiconductor film 103 is reduced to be the metal films 114a and 114b, and the other portion which is not in the vicinity of the interface remains the metal oxide films 112a and 112b. For example, when ruthenium oxide is used for the metal oxide films 112a and 112b, only a portion in the vicinity of the interface may be reduced to be ruthenium, and the other portion which is not in the vicinity of the interface may remain ruthenium oxide. Even when the other portion which is not in the vicinity of the interface remains ruthenium oxide, the resistivity of the ruthenium oxide is $3.5 \times 10^{-5}$ [cmΩ] (300K), and a high resistance component is not formed in a source electrode layer and a drain electrode layer, which is preferable.

Further, the metal films 114a and 114b which is formed by reduction of the metal oxide films 112a and 112b is a film having a higher oxidation resistance than the metal element included in the oxide semiconductor film 103. That is, in the metal films 114a and 114b, oxygen is not likely to be diffused.

In this embodiment, the heat treatment may be conducted with a GRTA apparatus at 650° C. for 1 minute to 5 minutes. Further, in this embodiment, the heat treatment is conducted with an electric furnace at 500° C. for 30 minutes to 1 hour.

Next, in a similar manner to that of the steps illustrated in FIGS. 11B to 11E described in Embodiment 7, the island-shaped oxide semiconductor film 103 is formed, the insulating film is formed over the oxide semiconductor film 103, and the electrode layer 105 and the insulating film 106 are stacked over the insulating film. Next, dopants are added to the oxide semiconductor film 103 using the gate electrode layer 105 and the insulating film 106 as masks, so that the regions 107a and 107b containing dopants and the channel formation region 108 which is provided between the regions 107a and 107b to overlap with the gate electrode layer 105 are formed in the oxide semiconductor film 103.

After that, in a similar manner to that of the step illustrated in FIG. 12A, an insulating film is formed to cover the oxide semiconductor film 103 and the insulating film 106, and the insulating film is etched, whereby the sidewall insulating films 109a and 109b are formed. Further, the gate insulating film 111 may be formed by etching the insulating film 101 using the gate electrode layer 105 and the sidewall insulating films 109a and 109b as masks.

Figure 14F:
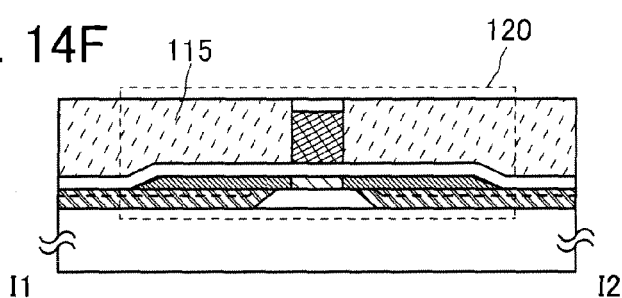

Next, an insulating film is formed to cover the oxide semiconductor film 103 and the insulating film 106, and polishing treatment is performed thereon, so that the interlayer insulating film 115 is formed (see FIG. 14F).

Through the above-described process, the transistor 120 can be manufactured.

According to this embodiment, the metal oxide film 112 which is in contact with the oxide semiconductor film 103 is reduced by heat treatment, so that oxygen is released from the metal oxide film 112 and can be supplied to the oxide semiconductor film 103. Oxygen vacancies can be reduced at the interface between the oxide semiconductor film 103 and each of the source electrode layer 116a and the drain electrode layer 116b. Accordingly, a shift of the threshold voltage of the transistor 110 in the negative direction can be suppressed.

Further, the metal film 114 which is formed by reduction of the metal oxide film 112 has a higher oxidation resistance than the metal element included in the oxide semiconductor film 103. That is, the metal film 114 becomes a film in which oxygen is not likely to be diffused. The metal films 114a and 114b are used for the source electrode layer 116a and the drain electrode layer 116b, so that the formation of the high resistance component in the metal films 114a and 114b can be suppressed. Accordingly, the resistance due to the oxide semiconductor film 103, the source electrode layer 116a, and the drain electrode layer 116b can be reduced, so that the decrease in on-state current of the transistor 110 can be suppressed.

Further, it is preferable that the metal film 114 (e.g., a film of copper, silver, or ruthenium) having a work function of ±0.2 eV of the electron affinity of the oxide semiconductor film 103 be selected because the contact resistances between the oxide semiconductor film 103 and each of the source electrode layer 116a and the drain electrode layer 116b can be reduced. Thus, the resistance due to the oxide semiconductor film 103, the source electrode layer 116a, and the drain electrode layer 116b can be reduced, so that the decrease in on-state current of the transistor can be suppressed.

The structures, methods, and the like described in this embodiment can be combined as appropriate with any of the structures, methods, and the like described in the other embodiments.

Embodiment 10

In this embodiment, another embodiment of the semiconductor device is described with reference to FIGS. 15A and 15B. Description of the same portion as or a portion having a function similar to that in the above embodiments is not repeated.

Figure 15A:
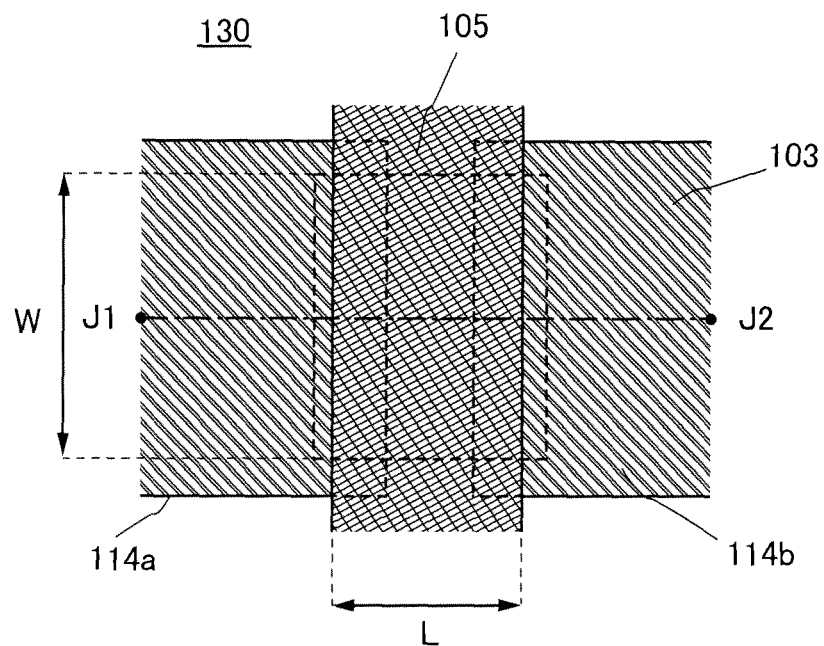
FIGS. 15A and 15B are a plan view and a cross-sectional view illustrating one embodiment of a semiconductor device.
Figure 15B:
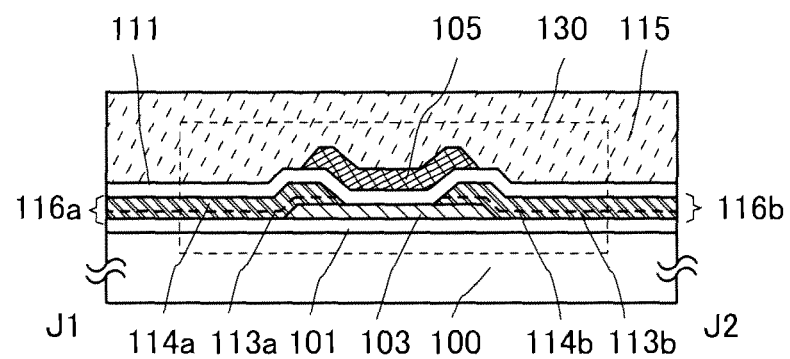

A transistor 130 illustrated in FIGS. 15A and 15B is an example of a top-gate transistor. FIG. 15A is a plan view of the transistor 130, and FIG. 15B is a cross-sectional view taken along line J1-J2 in FIG. 15A (a cross-sectional view in the channel length direction of the transistor 130). Further, in FIG. 15A, some components of the transistor 120 (e.g., the gate insulating film 111) are not illustrated to avoid complexity.

The transistor 130 illustrated in FIGS. 15A and 15B includes the oxide semiconductor film 103 over the substrate 100 having an insulating surface, the source electrode layer 116a and the drain electrode layer 116b in contact with the oxide semiconductor film 103, the gate insulating film 111 over the oxide semiconductor film 103, the source electrode layer 116a, and the drain electrode layer 116b, and the gate electrode layer 105 in a region which is over the gate insulating film 111 and overlaps with the oxide semiconductor film 103. Further, the insulating film 101, which functions as a base film, is provided between the substrate 100 and the oxide semiconductor film 103, and the interlayer insulating film 115 is provided to cover the transistor 130.

The transistor 130 illustrated in FIGS. 15A and 15B includes the source electrode layer 116a and the drain electrode layer 116b which are in contact with the oxide semiconductor film 103 and have a stacked-layer structure. The source electrode layer 116a is a stack of the metal film 114a and the conductive film 113a. The drain electrode layer 116b is a stack of the metal film 114b and the conductive film 113b.

In order to prevent extraction of oxygen from the oxide semiconductor film 103, the metal films 114a and 114b which are in contact with the oxide semiconductor film 103 include a metal having a higher oxidation resistance than a metal element included in the oxide semiconductor film 103 (a metal having higher Gibbs free energy of oxidation reaction than molybdenum). Specific examples are copper, silver, ruthenium, and iridium. The use of the metal having a higher oxidation resistance than the metal element included in the oxide semiconductor film 103 for the metal films 114a and 114b suppresses the oxygen vacancies in the oxide semiconductor film 103.

Further, since the metal films 114a and 114b are not likely to become oxidized as compared to the oxide semiconductor film 103 and thus, diffusion of oxygen in the metal films 114a and 114b can be suppressed, the formation of the high resistance component in the metal films 114a and 114b can be suppressed. Accordingly, the resistance due to the oxide semiconductor film 103, the source electrode layer 116a, and the drain electrode layer 116b can be reduced, so that the decrease in on-state current of the transistor can be suppressed.

Further, it is preferable that the metal films 114a and 114b (e.g., a film of copper, silver, or ruthenium) having a work function of ±0.2 eV of the electron affinity of the oxide semiconductor film 103 be selected because the contact resistances between the oxide semiconductor film 103 and each of the source electrode layer 116a and the drain electrode layer 116b can be reduced. Thus, the resistance due to the oxide semiconductor film 103, the source electrode layer 116a, and the drain electrode layer 116b can be reduced, so that the decrease in on-state current of the transistor can be suppressed.

Further, the conductive films 113a and 113b which are stacked over the metal films 114a and 114b, respectively, preferably include materials with which an oxide film is not formed at the interface with the metal films 114a and 114b. Examples are a material which can be used for the conductive films 113a and 113b are, in addition to the materials which can be used for the metal films 114a and 114b, gold, platinum, titanium, tungsten, titanium nitride, molybdenum nitride, tungsten nitride, and tantalum nitride. The conductive films 113a and 113b have a single-layer structure or a stacked-layer structure. The stacked-layer structure of the conductive films 113a and 113b can be formed of a tantalum nitride film and a tungsten film.

The case where the metal films 114a and 114b and the conductive films 113a and 113b are formed using the same material is in the source electrode layer 116a and the drain electrode layer 116b of the transistor 130 is described with reference to FIGS. 15A and 15B; however, the material for the metal films 114a and 114b and the material for the conductive films 113a and 113b may be different from each other.

In the transistor 130 illustrated in FIGS. 15A and 15B, metal oxide may be formed in part of the metal films 114a and 114b. For example, when the metal films 114a and 114b include ruthenium, ruthenium oxide may be formed in part of the metal films 114a and 114b. Even when ruthenium oxide is formed in part of the metal film, the resistivity of the ruthenium oxide is $3.5 \times 10^{-5}$ [cmΩ] (300K), and a high resistance component is not formed in the source electrode layer 116a and the drain electrode layer 116b, which is preferable.

Next, a transistor, which has a partly different structure from the transistor 130 illustrated in FIGS. 15A and 15B, is described with reference to FIGS. 16A and 16B.

Figure 16A:
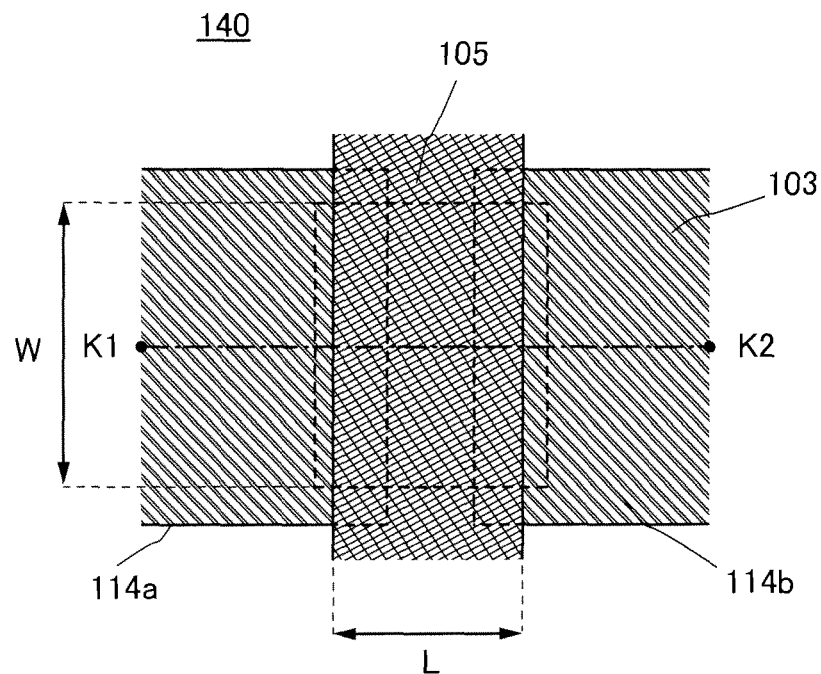
FIGS. 16A and 16B are a plan view and a cross-sectional view illustrating one embodiment of a semiconductor device.
Figure 16B:
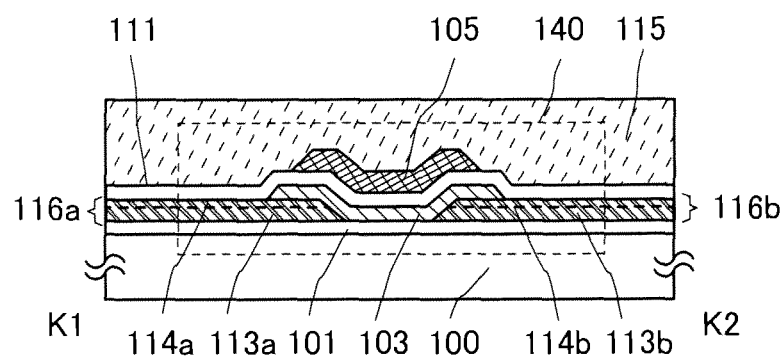

FIG. 16A is a plan view of a transistor 140, and FIG. 16B is a cross-sectional view taken along line K1-K2 in FIG. 16A (a cross-sectional view in the channel length direction of the transistor 140). Further, in FIG. 16A, some components of the transistor 140 (e.g., the gate insulating film 111) are not illustrated to avoid complexity.

As illustrated in FIG. 16B, the transistor 140 includes the source electrode layer 116a and the drain electrode layer 116b which are in contact with the oxide semiconductor film 103 and have a stacked-layer structure. The source electrode layer 116a is a stack of the conductive film 113a and the metal film 114a. The drain electrode layer 116b is a stack of the conductive film 113b and the metal film 114b.

The transistor 140 illustrated in FIGS. 16A and 16B is different from the transistor 130 illustrated in FIGS. 15A and 15B in a position in which the oxide semiconductor film 103 is in contact with the source electrode layer 116a and the drain electrode layer 116b. In the transistor 130 illustrated in FIGS. 15A and 15B, the source electrode layer 116a and the drain electrode layer 116b are in contact with the top surface of the oxide semiconductor film 103; on the other hand, in the transistor 140 illustrated in FIGS. 16A and 16B, the source electrode layer 116a and the drain electrode layer 116b are in contact with a bottom surface of the oxide semiconductor film 103.

As illustrated in FIG. 16B, side surfaces of the conductive films 113a and 113b are in contact with the oxide semiconductor film 103. Thus, for the conductive films 113a and 113b, gold, platinum, titanium nitride, molybdenum nitride, or tantalum nitride is preferably used.

As described above, for the metal films 114a and 114b which are in contact with the oxide semiconductor film 103, a metal having a higher oxidation resistance than the metal element included in the oxide semiconductor film 103 (a metal having higher Gibbs free energy of oxidation reaction than at least indium, gallium, zinc, and tin) is used, so that extraction of oxygen from the oxide semiconductor film 103 can be prevented. Accordingly, an increase in oxygen vacancies at the interface between the semiconductor film 103 and each of the source electrode layer 116a and the drain electrode layer 116b can be suppressed, whereby a shift of the threshold voltage of the transistor can be suppressed.

Further, since the metal films 114a and 114b are not likely to become oxidized as compared to the oxide semiconductor film 103 and thus, diffusion of oxygen in the metal films 114a and 114b can be suppressed, the formation of the high resistance component in the metal films 114a and 114b can be suppressed. Accordingly, the resistance due to the oxide semiconductor film 103, the source electrode layer 116a, and the drain electrode layer 116b can be reduced, so that the decrease in on-state current of the transistor can be suppressed.

The structures, methods, and the like described in this embodiment can be combined as appropriate with any of the structures, methods, and the like described in the other embodiments.

Embodiment 11

In this embodiment, an example of a method for manufacturing a semiconductor device including the transistor 140 illustrated in FIGS. 16A and 16B is described with reference to FIGS. 17A to 17F. Therefore, the detailed description of steps similar to those in Embodiment 7 is omitted.

Figure 17A:
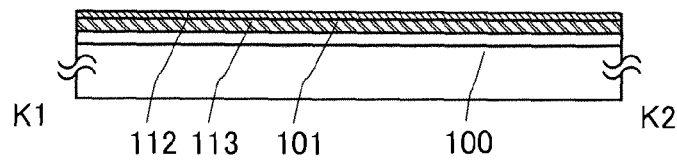
FIGS. 17A to 17F are cross-sectional views illustrating one embodiment of a method for manufacturing a semiconductor device.

First, the insulating film 101 is formed over the substrate 100, the conductive film 113 and the metal oxide film 112 which are to be a source electrode layer and a drain electrode layer (including a wiring formed using the same layer as the source electrode layer and the drain electrode layer) are stacked over the insulating film 101 (see FIG. 17A).

Figure 17B:
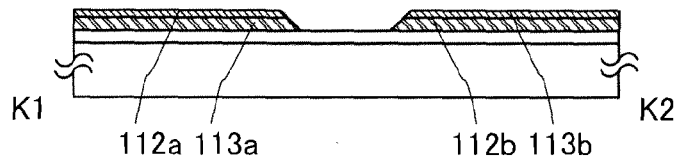

Next, in a photolithography process, a resist mask is formed over the metal oxide film 112 and etching is performed, so that the metal oxide films 112a and 112b and the conductive films 113a and 113b are formed (see FIG. 17B).

Figure 17C:
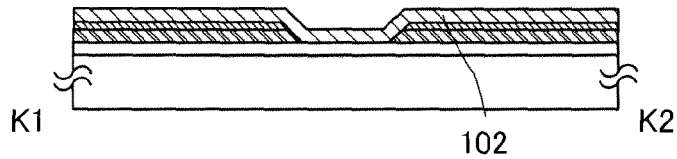

Next, the oxide semiconductor film 102 is formed over the metal oxide films 112a and 112b (see FIG. 17C).

Figure 17D:
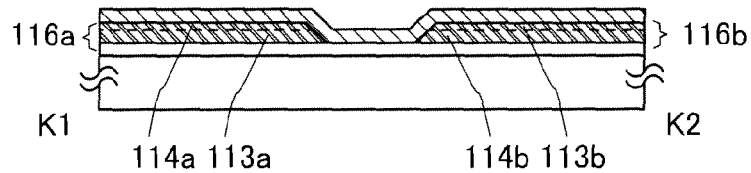
Figure 17E:
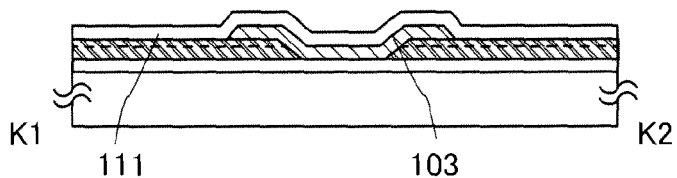

Next, heat treatment is performed on the oxide semiconductor film 102, the metal oxide films 112a and 112b, and the conductive films 113a and 113b (see FIG. 17D). Heat treatment is performed while the metal oxide film 112a and 112b is in contact with the oxide semiconductor film 102, so that oxygen is released from the metal oxide film 112a and 112b and is supplied to the oxide semiconductor film 102. By supply of oxygen to the oxide semiconductor film 102, oxygen vacancies in the oxide semiconductor film 102 can be reduced. Further, the metal oxide film 112a and 112b which has a higher reducing property than the oxide semiconductor film 102 is reduced, so that the metal film 114 is formed.

Note that in FIG. 17D, the case where the metal oxide films 112a and 112b are completely reduced to the metal films 114a and 114b is described; however, the following case is also possible: only a portion in the vicinity of the interface between the metal oxide films 112a and 112b and the oxide semiconductor film 102 is reduced to be the metal films 114a and 114b, and the other portion which is not in the vicinity of the interface remains the metal oxide films 112a and 112b. For example, when ruthenium oxide is used for the metal oxide films 112a and 112b, only a portion in the vicinity of the interface may be reduced to be ruthenium, and the other portion which is not in the vicinity of the interface may remain ruthenium oxide. Even when the other portion which is not in the vicinity of the interface remains ruthenium oxide, the resistivity of the ruthenium oxide is $3.5 \times 10^{-5}$ [cmΩ] (300K), and a high resistance component is not formed in a source electrode layer and a drain electrode layer, which is preferable.

Further, the metal films 114a and 114b which is formed by reduction of the metal oxide films 112a and 112b is a film having a higher oxidation resistance than the metal element included in the oxide semiconductor film 102. That is, in the metal films 114a and 114b, oxygen is not likely to be diffused.

Next, in a photolithography process, a resist mask is formed over the oxide semiconductor film 102 and an etching is performed, so that the oxide semiconductor film 103 is formed. After that, the gate insulating film 111 is formed over the source electrode layer 116a, the drain electrode layer 116b, and the oxide semiconductor film 103 (see FIG. 17E).

Next, a conductive film which is to be a gate electrode layer (including a wiring formed using the same layer as the gate electrode layer) is formed over the gate insulating film 111. After that, in a photolithography process, a resist mask is formed over the conductive film and etching is performed, so that the gate electrode layer 105 is formed. At last, the interlayer insulating film 115 is formed over the gate insulating film 111 and the gate electrode layer 105.

Figure 17F:
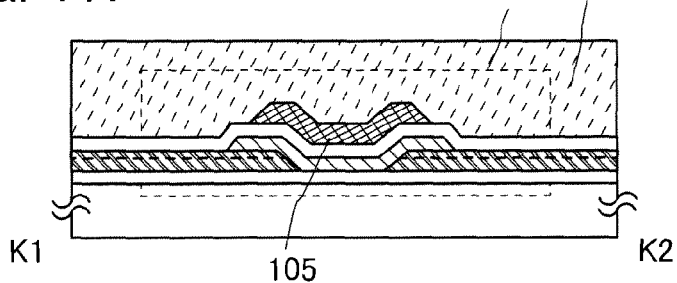

Through the above-described process, the transistor 140 can be manufactured (see FIG. 17F).

In this embodiment, the case where the heat treatment is performed before the oxide semiconductor film is processed into an island shape is described; however, one embodiment of the present invention is not construed as being limited thereto. The heat treatment may be performed after the oxide semiconductor film is processed into an island shape.

Further, in this embodiment, the material for the metal films 114a and 114b and the material for the conductive films 113a and 113b are selected to be the same as each other; however, the material for the metal films 114a and 114b and the material for the conductive films 113a and 113b may be selected so as to be different from each other. For example, ruthenium oxide and tantalum nitride are used for the metal oxide film 112 and the conductive film 113, respectively, and heat treatment is performed thereon, whereby a stacked layer of ruthenium and tantalum nitride is formed. Further, an oxide film is not formed at the interface between the metal film 114a and the conductive film 113a and the interface between the metal film 114b and the conductive film 113b, which is preferable. Note that the conductive films 113a and 113b may be formed to have a stacked layer of tungsten and tantalum nitride.

Note that even when the material for the metal films 114a and 114b and the material for the conductive films 113a and 113b are selected to be the same as each other, the characteristics of the metal films 114a and 114b are different from those of the conductive films 113a and 113b in some cases because the metal films 114a and 114b are the films which have formed by reducing the metal oxide film 112 and the conductive films 113a and 113b are the films which have formed by deposition. For example, the film density of the metal films 114a and 114b are lower than that of the conductive films 113a and 113b in some cases. The film density can be measured by X-ray reflectmetry (XRR), for example.

Further, the case where the source electrode layer 116a includes the metal film 114a and the conductive film 113a and the drain electrode layer 116b include the metal film 114b and the conductive film 113b is described in this embodiment; however, one embodiment of the present invention is not limited thereto. For example, the conductive films 113a and 113b are not necessarily formed.

According to this embodiment, the metal oxide films 112a and 112b which are in contact with the oxide semiconductor film 103 is reduced by heat treatment, so that oxygen is released from the metal oxide films 112a and 112b and can be supplied to the oxide semiconductor film 103. Oxygen vacancies can be reduced at the interface between the oxide semiconductor film 103 and each of the source electrode layer 116a and the drain electrode layer 116b. Accordingly, a shift of the threshold voltage of the transistor 140 in the negative direction can be suppressed.

Further, the metal films 114a and 114b which is formed by reduction of the metal oxide films 112a and 112b has a higher oxidation resistance than the metal element included in the oxide semiconductor film 103. That is, the metal films 114a and 114b are films in which oxygen is not likely to be diffused. The metal films 114a and 114b are used for the source electrode layer 116a and the drain electrode layer 116b, so that the formation of the high resistance component in the metal films 114a and 114b can be suppressed. Accordingly, the resistance due to the oxide semiconductor film 103, the source electrode layer 116a, and the drain electrode layer 116b can be reduced, so that the decrease in on-state current of the transistor 140 can be suppressed.

Further, it is preferable that the metal film 114 (e.g., a film of copper, silver, or ruthenium) having a work function of ±0.2 eV of the electron affinity of the oxide semiconductor film 103 be selected because the contact resistances between the oxide semiconductor film 103 and each of the source electrode layer 116a and the drain electrode layer 116b can be reduced. Thus, the resistance due to the oxide semiconductor film 103, the source electrode layer 116a, and the drain electrode layer 116b can be reduced, so that the decrease in on-state current of the transistor can be suppressed.

The structures, methods, and the like described in this embodiment can be combined as appropriate with any of the structures, methods, and the like described in the other embodiments.

Embodiment 12

In this embodiment, a semiconductor device having a display function (also referred to as display device) can be manufactured using the transistor described in any of the embodiments. Moreover, part or the whole of a driver circuit including the transistor can be formed over a substrate where a pixel portion is formed, whereby a system-on-panel can be obtained.

Figure 18A:
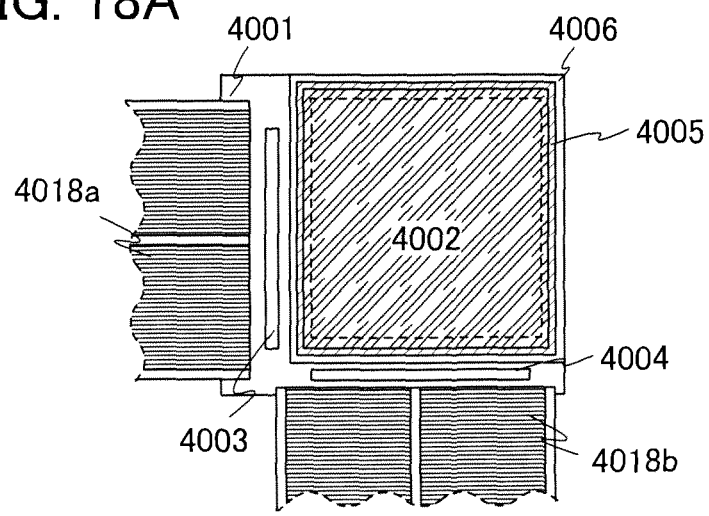
FIGS. 18A to 18C are plan views each illustrating one embodiment of a semiconductor device.

In FIG. 18A, a sealant 4005 provided so as to surround a pixel portion 4002 provided over a first substrate 4001 is provided, and the pixel portion 4002 is sealed by a second substrate 4006. In FIG. 18A, a signal line driver circuit 4003 and a scan line driver circuit 4004 which are each formed using a single crystal semiconductor film or a polycrystalline semiconductor film over a substrate prepared separately are mounted in regions that are different from the region surrounded by the sealant 4005 over the first substrate 4001. Various signals and potentials are supplied to the signal line driver circuit 4003, the scan line driver circuit 4004, and the pixel portion 4002, which are separately formed, from flexible printed circuits (FPCs) 4018a and 4018b.

Figure 18B:
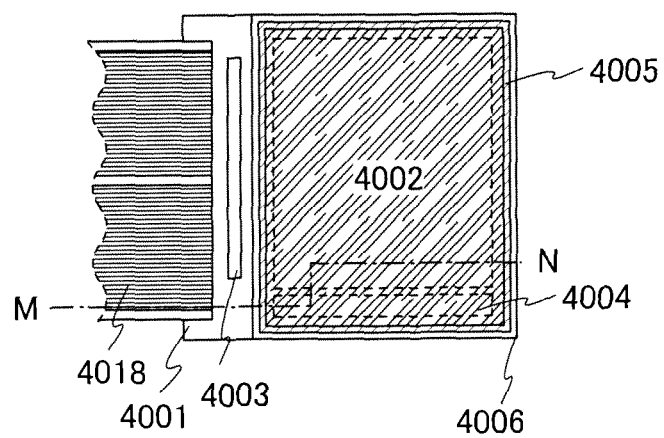
Figure 18C:
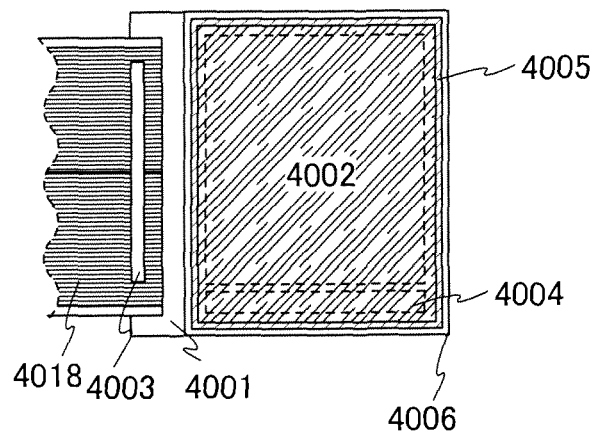

In FIGS. 18B and 18C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element by the first substrate 4001, the sealant 4005, and the second substrate 4006. In FIGS. 18B and 18C, the signal line driver circuit 4003 which is formed using a single crystal semiconductor film or a polycrystalline semiconductor film over a substrate prepared separately is mounted in a region that is different from the region surrounded by the sealant 4005 over the first substrate 4001. In FIGS. 18B and 18C, various signals and potentials are supplied to the signal line driver circuit 4003 which is separately formed, the scan line driver circuit 4004, and the pixel portion 4002 from an FPC 4018.

Although FIGS. 18B and 18C each illustrate an example in which the signal line driver circuit 4003 is formed separately and mounted on the first substrate 4001, one embodiment of the present invention is not limited to this structure. The scan line driver circuit may be formed separately and then mounted, or only part of the signal line driver circuit or part of the scan line driver circuit may be formed separately and then mounted.

Note that there is no particular limitation on the method of connecting a separately formed driver circuit, and a chip on glass (COG) method, a wire bonding method, a tape automated bonding (TAB) method, or the like can be used. FIG. 18A illustrates an example in which the signal line driver circuit 4003 and the scan line driver circuit 4004 are mounted by a COG method. FIG. 18B illustrates an example in which the signal line driver circuit 4003 is mounted by a COG method. FIG. 18C illustrates an example in which the signal line driver circuit 4003 is mounted by a TAB method.

In addition, the display device includes a panel in which the display element is sealed, and a module in which an IC or the like including a controller is mounted on the panel.

In addition, the display device includes a panel in which the display element is sealed, and a module in which an IC or the like including a controller is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and the transistor described in the above embodiments can be applied thereto.

As the display element provided in the display device, a liquid crystal element (also referred to as liquid crystal display element) or a light-emitting element (also referred to as light-emitting display element) can be used. The light-emitting element includes, in its category, an element whose luminance is controlled by current or voltage and specifically includes, in its category, an inorganic electroluminescent (EL) element, an organic EL element, and the like. Furthermore, a display medium whose contrast is changed by an electric effect, such as electronic ink, can be used.

Further, embodiments of the semiconductor device are described with reference to FIGS. 18A to 18C, FIGS. 19A and 19B, and FIGS. 20A and 20B. FIGS. 20A and 20B correspond to cross-sectional views along dashed-dotted line M-N in FIG. 18B.

As illustrated in FIGS. 20A and 20B, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same metal film and the same conductive film as source electrode layers and drain electrode layers of transistors 4040 and 4011.

The pixel portion 4002 and the scan line driver circuit 4004 which are provided over the first substrate 4001 include a plurality of transistors. In FIGS. 20A and 20B, the transistor 4040 included in the pixel portion 4002 and the transistor 4011 included in the scan line driver circuit 4004 are illustrated as an example. In FIG. 20A, an insulating film 4020 is provided over the transistors 4040 and 4011. In FIG. 20B, an insulating film 4021 is further provided.

In this embodiment, the transistor described in the above embodiments can be applied to a transistor 4010 and the transistor 4011. This embodiment shows an example in which a transistor which has a structure similar to that of the transistor 410 described in Embodiment 1 and is obtained by a manufacturing method similar to that of the transistor 410 is used.

In the transistors 4010 and 4011, each of which has a structure similar to that of the transistor 410 described in Embodiment 1 and is obtained by a manufacturing method similar to that of the transistor 410, a metal oxide film which has a higher reducing property than an oxide semiconductor film and a conductive film are formed over the oxide semiconductor film, and then heat treatment is performed, so that the metal oxide film is reduced to form a metal film. At this time, oxygen is released from the metal oxide film having a higher reducing property than an oxide semiconductor film, and can be supplied to the oxide semiconductor film. Accordingly, an increase in oxygen vacancies at the interface between the semiconductor film and each of the source electrode layer and the drain electrode layer can be suppressed, whereby a shift of the threshold voltage of the transistors 4010 and 4011 in the negative direction can be suppressed.

Further, a high resistance component can be prevented from being formed in the metal film, so that the resistance due to the oxide semiconductor film, the source electrode layer, and the drain electrode layer can be reduced. Thus, a decrease in on-state current of the transistors 4010 and 4011 can be suppressed.

Thus, a highly reliable semiconductor device including the transistors 4010 and 4011 of this embodiment illustrated in FIGS. 18A to 18C and FIGS. 20A and 20B, each of which includes an oxide semiconductor film and has stable electric characteristics, can be provided.

A conductive layer may be further provided over the insulating film to overlap with a channel formation region of the oxide semiconductor film of the transistor 4011 for the driver circuit. By providing the conductive layer to overlap with the channel formation region of the oxide semiconductor film, the amount of change in the threshold voltage of the transistor 4011 by a bias-temperature (BT) stress test can be further reduced. The conductive layer may have the same potential as or a potential different from that of a gate electrode layer of the transistor 4011, and can function as a second gate electrode layer. The potential of the conductive layer may be GND or 0 V, or the conductive layer may be in a floating state.

In addition, the conductive layer functions of blocking an external electric field, that is, preventing an external electric field (particularly, preventing static electricity) from affecting the inside (a circuit portion including a transistor). A blocking function of the conductive layer can prevent fluctuation in the electric characteristics of the transistor due to an influence of an external electric field such as static electricity.

The transistor 4010 provided in the pixel portion 4002 is electrically connected to a display element to form a display panel. A variety of display elements can be used as the display element as long as display can be performed.

An example of a liquid crystal display device using a liquid crystal element as a display element is illustrated in FIG. 20A. In FIG. 20A, a liquid crystal element 4013 which is a display element includes the first electrode layer 4030, a second electrode layer 4031, and a liquid crystal layer 4008. Insulating films 4032 and 4033 functioning as alignment films are provided so that the liquid crystal layer 4008 is interposed therebetween. The second electrode layer 4031 is provided on the second substrate 4006 side, and the first electrode layer 4030 and the second electrode layer 4031 are stacked with the liquid crystal layer 4008 interposed therebetween.

A columnar spacer 4035 is obtained by selective etching of an insulating film and is provided in order to control the thickness (cell gap) of the liquid crystal layer 4008. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In this case, the liquid crystal layer 4008 is in contact with the first electrode layer 4030 and the second electrode layer 4031. A blue phase is one of liquid crystal phases, which is generated just before a cholesteric phase changes into an isotropic phase while the temperature of a cholesteric liquid crystal is increased. The blue phase can be exhibited using a liquid crystal composition which is a mixture of a liquid crystal and a chiral agent. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved. A transistor formed using an oxide semiconductor film has a possibility that the electric characteristics of the transistor may fluctuate significantly by the influence of static electricity and deviate from the designed range. Therefore, it is more effective to use a liquid crystal composition exhibiting a blue phase for the liquid crystal display device including the transistor formed using an oxide semiconductor layer.

The specific resistivity of the liquid crystal material is higher than or equal to $1 \times 10^9$ $\Omega \cdot cm$, preferably higher than or equal to $1 \times 10^{11}$ $\Omega \cdot cm$, further preferably higher than or equal to 1×10$^{12}$ Ω·cm. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of the transistor or the like. By using a transistor including an oxide semiconductor film disclosed in this specification, it is enough to provide a storage capacitor having a capacitance that is ⅓ or less, preferably ⅕ or less of liquid crystal capacitance of each pixel.

In the transistor including an oxide semiconductor film, which is disclosed in this specification, the current in an off state (off-state current) can be made small. Accordingly, an electric signal such as an image signal can be held for a longer period, and a writing interval can be set longer in an on state. Accordingly, frequency of refresh operation can be reduced, which leads to an effect of suppressing power consumption.

The transistor including an oxide semiconductor film, which is disclosed in this specification, can have relatively high field-effect mobility and thus can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using a transistor which can operate at high speed in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed.

Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that one embodiment of the invention disclosed herein is not limited to the application to a display device for color display; one embodiment of the invention disclosed herein can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as organic EL element, and the latter is referred to as inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as current-excitation light-emitting element. In this embodiment, an example in which an organic EL element is used as the light-emitting element is described.

Inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is interposed between dielectric layers, which are further interposed between electrodes, and its light emission mechanism is localized type light emission that utilizes inner-shell electron transition of metal ions. Note that an example of an organic EL element is described here as a light-emitting element.

In order to extract light emitted from the light-emitting element, at least one of the pair of electrodes has a light-transmitting property. A transistor and a light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side, and a light-emitting element having any of these emission structures can be used.

Figures 19A, 19B:
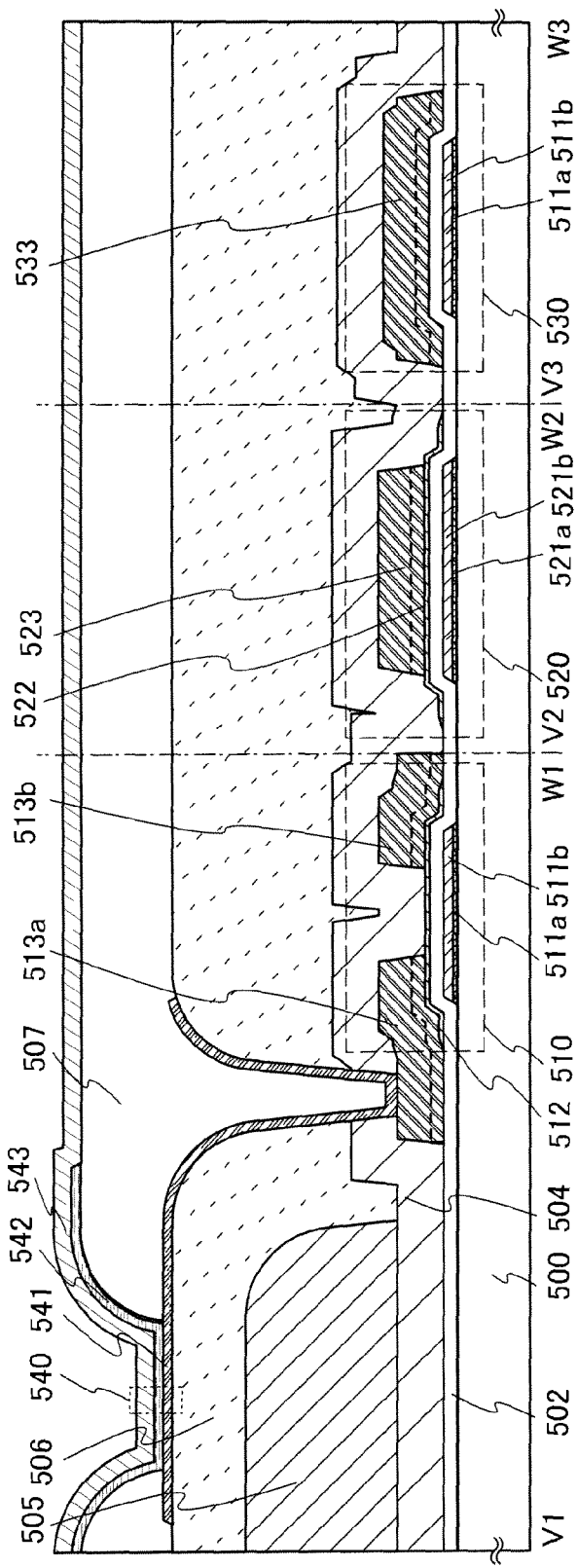
FIGS. 19A and 19B are a plan view and a cross-sectional view illustrating one embodiment of a semiconductor device.

An example of a light-emitting device in which a light-emitting element is used as a display element is illustrated in FIGS. 19A and 19B and FIG. 20B.

FIG. 19A is a plan view of a light-emitting device, and FIG. 19B is a cross-sectional view taken along dashed-dotted lines V1-W1, V2-W2, and V3-W3 in FIG. 19A. Note that an electroluminescent layer 542 and a second electrode layer 543 are not illustrated in the plan view of FIG. 19A.

The light-emitting device illustrated in FIGS. 19A and 19B includes, over a substrate 500, a transistor 510, a capacitor 520, and a wiring layer intersection 530. The transistor 510 is electrically connected to a light-emitting element 540. Note that FIGS. 19A and 19B illustrate a bottom-emission light-emitting device in which light from the light-emitting element 540 is extracted through the substrate 500.

The transistor described in the above embodiments can be applied to the transistor 510. In this embodiment, as an example, a transistor which has a structure similar to that of the transistor 410 described in Embodiment 1 and is obtained by a manufacturing method similar to that of the transistor 410 is used.

The transistor 510 includes gate electrode layers 511a and 511b, a gate insulating film 502, an oxide semiconductor film 512, and conductive layers 513a and 513b functioning as a source electrode layer and a drain electrode layer.

In the transistor 510, which has a structure similar to that of the transistor 410 described in Embodiment 1 and is obtained by a manufacturing method similar to that of the transistor 410, a metal oxide film which has a higher reducing property than an oxide semiconductor film and a conductive film are formed over the oxide semiconductor film, and then heat treatment is performed, so that the metal oxide film is reduced to form a metal film. At this time, oxygen is released from the metal oxide film having a higher reducing property than an oxide semiconductor film, and can be supplied to the oxide semiconductor film. Accordingly, an increase in oxygen vacancies at the interface between the semiconductor film and each of the source electrode layer and the drain electrode layer can be suppressed, whereby a shift of the threshold voltage of the transistor 510 in the negative direction can be suppressed.

Further, a high resistance component can be prevented from being formed in the metal film, so that the resistance due to the oxide semiconductor film, the source electrode layer, and the drain electrode layer can be reduced. Thus, a decrease in on-state current of the transistor 510 can be suppressed.

Thus, a highly reliable semiconductor device including the transistor 510 of this embodiment illustrated in FIGS. 19A and 19B, which includes the oxide semiconductor film 512 and has stable electric characteristics, can be provided.

The capacitor 520 includes conductive layers 521a and 521b, the gate insulating film 502, an oxide semiconductor film 522, and a conductive layer 523. The gate insulating film 502 and the oxide semiconductor film 522 are sandwiched between the conductive layer 523 and the conductive layers 521a and 521b, so that the capacitor is formed.

The intersection 530 of wiring layers is an intersection of a conductive layer 533 and the gate electrode layers 511a and 511b. The conductive layer 533 and the gate electrode layers 511a and 511b intersect with each other with the gate insulating film 502 provided therebetween.

In this embodiment, a 30-nm-thick titanium film is used as the gate electrode layer 511a and the conductive layer 521a, and a 200-nm-thick copper thin film is used as the gate electrode layer 511b and the conductive layer 521b. Thus, the gate electrode layer is a stack of a titanium film and a copper thin film.

A 25-nm-thick IGZO film is used as the oxide semiconductor films 512 and 522.

An interlayer insulating film 504 is formed over the transistor 510, the capacitor 520, and the intersection 530 of wiring layers. Over the interlayer insulating film 504, a color filter layer 505 is provided in a region overlapping with the light-emitting element 540. An insulating film 506 functioning as a planarization insulating film is provided over the interlayer insulating film 504 and the color filter layer 505.

The light-emitting element 540 having a stacked-layer structure in which a first electrode layer 541, the electroluminescent layer 542, and the second electrode layer 543 are stacked in that order is provided over the insulating film 506. The first electrode layer 541 and the conductive layer 513a are in contact with each other in an opening formed in the insulating film 506 and the interlayer insulating film 504, which reaches the conductive layer 513a; thus the light-emitting element 540 and the transistor 510 are electrically connected to each other. Note that a partition 507 is provided so as to cover part of the first electrode layer 541 and the opening.

As the interlayer insulating film 504, a silicon oxynitride film having a thickness greater than or equal to 200 nm and less than or equal to 600 nm, which is formed by a plasma CVD method can be used. Further, a photosensitive acrylic film having a thickness of 1500 nm and a photosensitive polyimide film having a thickness of 1500 nm can be used as the insulating film 506 and the partition 507, respectively.

As the color filter layer 505, for example, a chromatic light-transmitting resin can be used. As the chromatic color light-transmitting resin, a photosensitive organic resin or a non-photosensitive organic resin can be used. Use of the photosensitive organic resin layer makes it possible to reduce the number of resist masks; thus, the steps are simplified, which is preferable.

Chromatic colors are all colors except achromatic colors such as black, gray, and white. The color filter layer is formed using a material which transmits only light of the chromatic colors. As chromatic color, red, green, blue, or the like can be used. Alternatively, cyan, magenta, yellow, or the like may also be used. "Transmitting only light of a chromatic color" means that light passing through the color filter layer has a peak at a wavelength of the light of the chromatic color. The thickness of the color filter layer may be controlled as appropriate in consideration of the relationship between the concentration of the coloring material to be included and the transmittance of light. For example, the color filter layer 505 may have a thickness greater than or equal to 1500 nm and less than or equal to 2000 nm.

In a light-emitting device illustrated in FIG. 20B, a light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031, which is illustrated in FIG. 20B. The structure of the light-emitting element 4513 can be changed as appropriate depending on the direction in which light is extracted from the light-emitting element 4513, or the like.

A partition 4510 and the partition 507 can be formed using an organic insulating material or an inorganic insulating material. It is particularly preferable that the partitions 4510 and 507 be formed using a photosensitive resin material to have an opening over the first electrode layers 4030 and 541 so that a sidewall of the opening is formed as a tilted surface with continuous curvature.

The electroluminescent layers 4511 and 542 may be formed using either a single layer or a plurality of layers stacked.

A protective film may be formed over the second electrode layers 4031 and 543 and the partitions 4510 and 507 in order to prevent entry of oxygen, hydrogen, moisture, carbon dioxide, or the like into the light-emitting elements 4513 and 540. As the protective film, a silicon nitride film, a silicon nitride oxide film, a DLC film, or the like can be formed.

Further, a layer containing an organic compound may be deposited by a deposition method to cover the light-emitting elements 4513 and 540 so that oxygen, hydrogen, moisture, carbon dioxide, and the like do not enter the light-emitting elements 4513 and 540.

In addition, in a space which is formed with the first substrate 4001, the second substrate 4006, and the sealant 4005, a filler 4514 is provided for sealing. In this manner, the light-emitting element 4513 and the like are preferably packaged (sealed) with a protective film (such as a laminate film or an ultraviolet curable resin film) or a cover material with high air-tightness and little degasification so that the light-emitting element 4513 and the like are not exposed to the outside air.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used as the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, electronic paper in which electronic ink is driven can be provided as the display device. The electronic paper is also referred to as electrophoretic display device (electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain a pigment and do not move without an electric field. Moreover, the first particles and the second particles have different colors (which may be colorless).

Thus, an electrophoretic display device is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control the orientation of the spherical particles, so that display is performed.

Note that in FIGS. 18A to 18C, FIGS. 19A and 19B, and FIGS. 20A and 20B, a flexible substrate as well as a glass substrate can be used as the first substrates 4001 and 500 and the second substrate 4006. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is interposed between PVF films or polyester films can be used.

In this embodiment, an aluminum oxide film is used as the insulating film 4020. The insulating film 4020 can be formed by a sputtering method or a plasma CVD method.

The aluminum oxide film provided as the insulating film 4020 over the oxide semiconductor film has a high blocking effect and thus is less likely to transmit both oxygen and an impurity such as hydrogen or moisture.

Therefore, during the manufacturing process and after the manufacture, the aluminum oxide film functions as a protective film for preventing entry of an impurity such as hydrogen or moisture, which causes a change, into the oxide semiconductor film and release of oxygen, which is a main constituent material of the oxide semiconductor, from the oxide semiconductor film.

Further, the insulating films 4021 and 506 functioning as a planarization insulating film can be formed using an organic material having heat resistance, such as an acrylic-based resin, a polyimide-based resin, a benzocyclobutene-based resin, a polyamide-based resin, or an epoxy-based resin. Other than such organic materials, it is also possible to use a low-dielectric constant material (low-k material), a siloxane-based resin, phosphosilicate glass (PSG), borophosphosilicate glass (BPSG), or the like. Alternatively, the insulating film 4021 may be formed by stacking a plurality of insulating films formed using any of these materials.

There is no particular limitation on the method of forming the insulating films 4021 and 506, and the following method or tool (equipment) can be used depending on the material: a sputtering method, an SOG method, spin coating, dipping, spray coating, a droplet discharge method (such as an inkjet method), a printing method (such as screen printing or offset printing), a doctor knife, a roll coater, a curtain coater, a knife coater, or the like.

The display device displays an image by transmitting light from a light source or a display element. Therefore, the substrate and the thin films such as the insulating film and the conductive film provided for the pixel portion where light is transmitted have light-transmitting properties with respect to light in the visible light wavelength range.

The first electrode layer and the second electrode layer (each of which may be called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layers 4030 and 541 and the second electrode layers 4031 and 543 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (referred to as ITO), indium zinc oxide, indium tin oxide to which silicon oxide is added, or graphene.

The first electrode layers 4030 and 541 and the second electrode layers 4031 and 543 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

In this embodiment, since the light-emitting device illustrated in FIGS. 19A and 19B has a bottom-emission structure, the first electrode layer 541 has a light-transmitting property and the second electrode layer 543 has a light-reflecting property. Accordingly, in the case of using a metal film as the first electrode layer 541, the film is preferably thin enough to secure a light-transmitting property; and in the case of using a light-transmissive conductive film as the second electrode layer 543, a conductive film having a light-reflecting property is preferably stacked therewith.

A conductive composition containing a conductive high molecule (also referred to as conductive polymer) can be used for the first electrode layers 4030 and 541 and the second electrode layers 4031 and 543. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken owing to static electricity or the like, a protection circuit for protecting the driver circuit is preferably provided. The protection circuit is preferably formed using a nonlinear element.

By using the transistor described in Embodiment 1 or 2 as described above, the semiconductor device can have a variety of functions.

The structures, methods, and the like described in this embodiment can be combined as appropriate with any of the structures, methods, and the like described in the other embodiments.

Embodiment 13

A semiconductor device having an image sensor function of reading information on an object can be formed with the use of the transistor described in Embodiment 1 or 2.

Figure 21A:
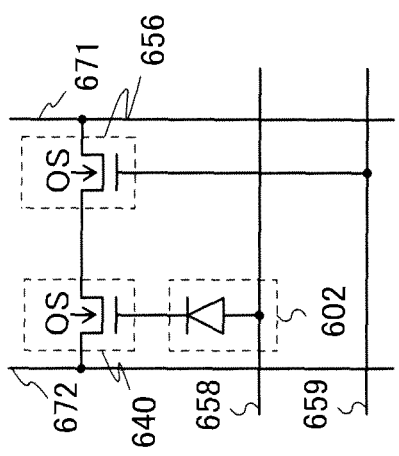
FIGS. 21A and 21B are a circuit diagram and a cross-sectional view illustrating one embodiment of a semiconductor device.

An example of a semiconductor device having an image sensor function is illustrated in FIG. 21A. FIG. 21A illustrates an equivalent circuit of a photo sensor, and FIG. 21B is a cross-sectional view illustrating part of the photo sensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photo sensor reference signal line 672, and the other of the source and the drain of the transistor 640 is electrically connected to one of a source and a drain of a transistor 656. A gate of the transistor 656 is electrically connected to a gate signal line 659, and the other of the source and the drain of the transistor 656 is electrically connected to a photo sensor output signal line 671.

Note that in circuit diagrams in this specification, a transistor formed using an oxide semiconductor film is denoted by a symbol "OS" so that it can be identified as a transistor formed using an oxide semiconductor film. In FIG. 21A, the transistor 640 and the transistor 656 are each a transistor formed using an oxide semiconductor film, to which the transistor described in the above embodiments can be applied. In this embodiment, as an example, a transistor which has a structure similar to that of the transistor 410 described in Embodiment 1 and is obtained by a manufacturing method similar to that of the transistor 410 is used.

Figure 21B:
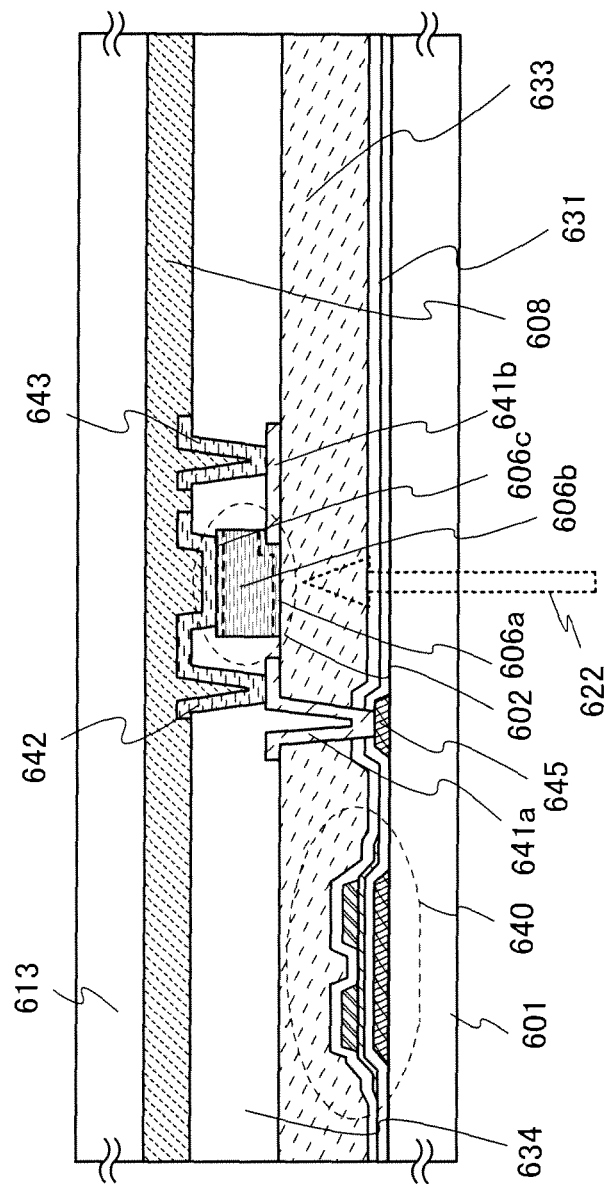

FIG. 21B is a cross-sectional view of the photodiode 602 and the transistor 640 in the photo sensor. The photodiode 602 functioning as a sensor and the transistor 640 are provided over a substrate 601 (TFT substrate) having an insulating surface. A substrate 613 is provided over the photodiode 602 and the transistor 640 with the use of an adhesive layer 608.

An insulating film 631, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are sequentially stacked from the interlayer insulating film 633 side, between an electrode layer 642 formed over the interlayer insulating film 634 and each of electrode layers 641a and 641b formed over the interlayer insulating film 633.

The electrode layer 641b is electrically connected to a conductive layer 643 formed over the interlayer insulating film 634, and the electrode layer 642 is electrically connected to a conductive layer 645 through the electrode layer 641a. The conductive layer 645 is electrically connected to a gate electrode layer of the transistor 640, and the photodiode 602 is electrically connected to the transistor 640.

Here, a pin photodiode in which a semiconductor film having p-type conductivity type as the first semiconductor film 606a, a high-resistance semiconductor film (i-type semiconductor film) as the second semiconductor film 606b, and a semiconductor film having n-type conductivity type as the third semiconductor film 606c are stacked is illustrated as an example.

The first semiconductor film 606a is a p-type semiconductor film and can be formed using an amorphous silicon film containing an impurity element imparting p-type conductivity type. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The first semiconductor film 606a is preferably formed to a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to a thickness greater than or equal to 200 nm and less than or equal to 1000 nm.

The third semiconductor film 606c is an n-type semiconductor film and is formed using an amorphous silicon film containing an impurity element imparting n-type conductivity type. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The third semiconductor film 606c is preferably formed to a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

In addition, the mobility of holes generated by a photoelectric effect is lower than the mobility of electrons. Therefore, a pin photodiode has better characteristics when a surface on the p-type semiconductor film side is used as a light-receiving plane. Here, an example in which light 622 received by the photodiode 602 from a surface of the substrate 601, over which the pin photodiode is formed, is converted into electric signals is described. Further, light from the semiconductor film having a conductivity type opposite to that of the semiconductor film on the light-receiving plane is disturbance light; therefore, the electrode layer is preferably formed using a light-blocking conductive film. Note that a surface on the n-type semiconductor film side can alternatively be used as the light-receiving plane.

With the use of an insulating material, the insulating film 631, the interlayer insulating film 633, and the interlayer insulating film 634 can be formed, depending on the material, using a method such as a sputtering method, a plasma CVD method, an SOG method, spin coating, dipping, spray coating, a droplet discharge method (such as an inkjet method), or a printing method (such as screen printing or offset printing).

The insulating film 631 can be formed using an inorganic insulating material and can have a single-layer structure or a stacked-layer structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

In this embodiment, an aluminum oxide film is used as the insulating film 631. The insulating film 631 can be formed by a sputtering method or a plasma CVD method.

The aluminum oxide film provided as the insulating film 631 over the oxide semiconductor film has a high blocking effect and thus is less likely to transmit both oxygen and an impurity such as hydrogen or moisture.

Therefore, during the manufacturing process and after the manufacture, the aluminum oxide film functions as a protective film for preventing entry of an impurity such as hydrogen or moisture, which causes a change, into the oxide semiconductor film and release of oxygen, which is a main constituent material of the oxide semiconductor, from the oxide semiconductor film.

For a reduction in surface roughness, an insulating film functioning as a planarization insulating film is preferably used as each of the interlayer insulating films 633 and 634. For the interlayer insulating films 633 and 634, for example, an organic insulating material having heat resistance such as a polyimide-based resin, an acrylic-based resin, a benzocyclobutene-based resin, a polyamide-based resin, or an epoxy-based resin can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

With detection of light that enters the photodiode 602, information on an object to be detected can be read. Note that a light source such as a backlight can be used at the time of reading information on the object to be detected.

In the transistor 640, which has a structure similar to that of the transistor 410 described in Embodiment 1 and is obtained by a manufacturing method similar to that of the transistor 410, a metal oxide film which has a higher reducing property than an oxide semiconductor film and a conductive film are formed over the oxide semiconductor film, and then heat treatment is performed, so that the metal oxide film is reduced to form a metal film. At this time, oxygen is released from the metal oxide film having a higher reducing property than an oxide semiconductor film, and can be supplied to the oxide semiconductor film. Accordingly, an increase in oxygen vacancies at the interface between the semiconductor film and each of the source electrode layer and the drain electrode layer can be suppressed, whereby a shift of the threshold voltage of the transistor 640 in the negative direction can be suppressed.

Further, a high resistance component can be prevented from being formed in the metal film, so that the resistance due to the oxide semiconductor film, the source electrode layer, and the drain electrode layer can be reduced. Thus, a decrease in on-state current of the transistor 640 can be suppressed.

Thus, a highly reliable semiconductor device including the transistor 640 of this embodiment, which includes an oxide semiconductor film and has stable electric characteristics, can be provided.

Embodiment 14

In this embodiment, an example of a semiconductor device which includes the transistor according to one embodiment of the present invention, which can hold stored data even when not powered, and which does not have a limitation on the number of write cycles, is described with reference to drawings.

Figure 22A:
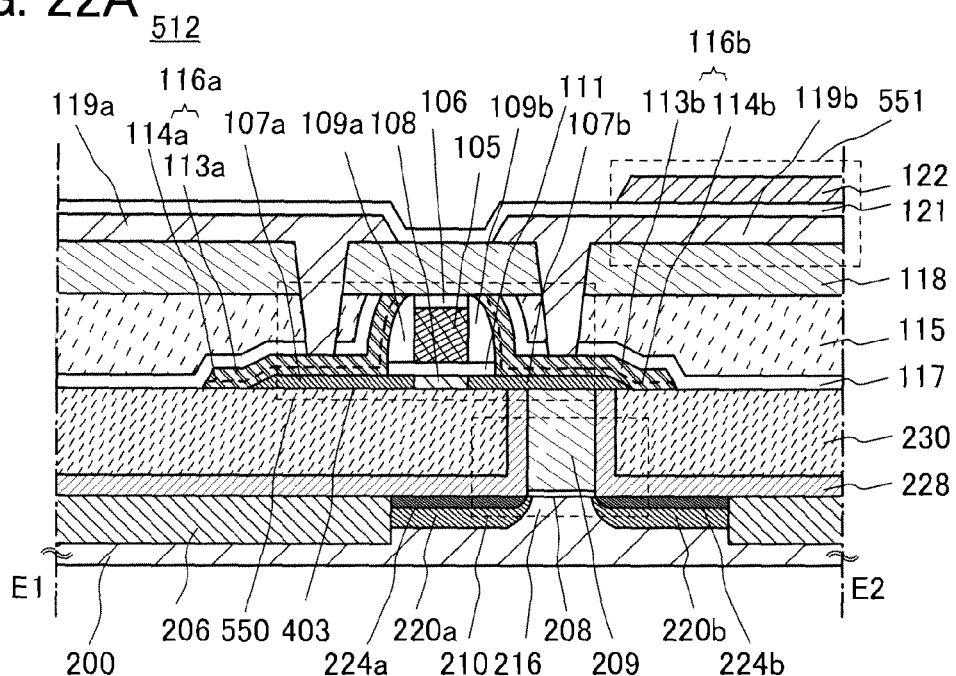
FIGS. 22A to 22C are a cross-sectional view, a plan view, and a circuit diagram illustrating one embodiment of a semiconductor device.
Figure 22B:
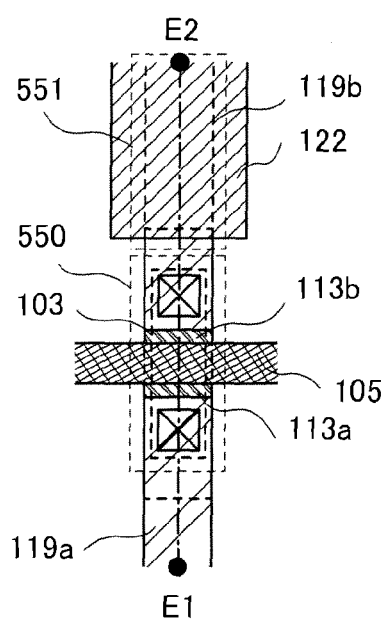
Figure 22C:
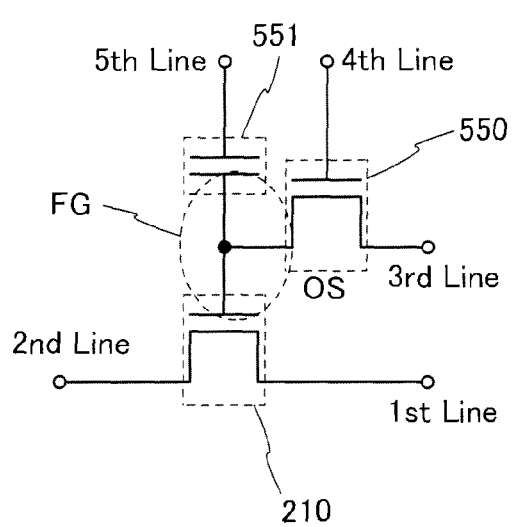

FIGS. 22A to 22C illustrate an example of a structure of a semiconductor device. FIG. 22A illustrates a cross-sectional view of the semiconductor device, FIG. 22B illustrates a plan view of the semiconductor device, and FIG. 22C is a circuit diagram of the semiconductor device. Here, FIG. 22A corresponds to a cross section along line E1-E2 in FIG. 22B.

The semiconductor device (memory cell 512) illustrated in FIGS. 22A and 22B includes a transistor 210 formed using a first semiconductor material in a lower portion, and a transistor 550 formed using a second semiconductor material in an upper portion. The structure of the transistor 110 described in Embodiment 6 is applied to the transistor 550.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, charge can be held in a transistor including an oxide semiconductor for a long time owing to its characteristics.

The semiconductor material included in the transistor 210 can be silicon, germanium, silicon germanium, silicon carbide, gallium arsenide, or the like, and is preferably a single-crystal semiconductor. Alternatively, an organic semiconductor material or the like may be used. A transistor including such a semiconductor material can operate at sufficiently high speed.

Note that although the transistor 210 and the transistor 550 are n-channel transistors here, it is needless to say that p-channel transistors can be used. The specific structure of the semiconductor device, such as the material used for the semiconductor device and the structure of the semiconductor device, is not necessarily limited to those described here. For example, the transistor 110 including an oxide semiconductor described in Embodiment 6 may be used as the transistor 210 for holding data.

The transistor 210 in FIG. 22A includes a channel formation region 216 provided in a substrate 200 including a semiconductor material (e.g., silicon), impurity regions 220a and 220b provided so that the channel formation region 216 is sandwiched therebetween, intermetallic compound regions 224a and 224b in contact with the impurity regions 220a and 220b, a gate insulating film 208 provided over the channel formation region 216, and the gate electrode layer 209 provided over the gate insulating film 208. Note that a transistor whose source electrode layer and drain electrode layer are not illustrated in a drawing may be referred to as a transistor for the sake of convenience. In such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" may include a source region.

An element separation insulating film 206 is provided over the substrate 200 to surround the transistor 210, and an insulating film 228 which is in contact with the transistor 210 and an insulating film 230 which is in contact with the insulating film 228 are provided. Note that in the transistor 210, sidewall insulating films may be formed on side surfaces of the gate electrode layer 209, and the impurity regions 220a and 220b may each include regions having different concentrations of impurities.

The transistor 210 using a single crystal semiconductor substrate can operate at high speed. Thus, when the transistor is used as a reading transistor, data can be read at high speed. In this embodiment, the insulating film in contact with the transistor 210 has a two-layer structure of the insulating film 228 and the insulating film 230 which is in contact with the insulating film 228. Note that the insulating film in contact with the transistor 210 may be a single layer or a stacked layer of three or more layers. As treatment prior to the formation of the transistor 550 and a capacitor 551, CMP treatment is performed on the insulating films formed over the transistor 210, whereby the insulating film 228 and the insulating film 230 which are planarized are formed and, at the same time, a top surface of the gate electrode layer 209 is exposed.

As each of the insulating film 228 and the insulating film 230, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used. The insulating film 228 and the insulating film 230 can be formed by a plasma CVD method, a sputtering method, or the like.

Alternatively, an organic material such as a polyimide-based resin, an acrylic-based resin, or a benzocyclobutene-based resin can be used. Other than the above-described organic materials, it is also possible to use a low-dielectric constant material (a low-k material) or the like. In the case of using an organic material, the insulating film 228 and the insulating film 230 may be formed by a wet method such as a spin coating method or a printing method.

Note that in this embodiment, a silicon nitride film is used as the insulating film 228, and a silicon oxide film is used as the insulating film 230.

Planarization treatment is preferably performed on a region, where the oxide semiconductor film 103 is formed, in a surface of the insulating film 230. In this embodiment, the oxide semiconductor film 103 is formed over the insulating film 230 which is sufficiently planarized by polishing treatment such as CMP treatment (the average surface roughness of the surface of the insulating film 230 is preferably less than or equal to 0.15 nm).

The transistor 550 includes the oxide semiconductor film 103 over the insulating film 230, the gate insulating film 111 over the oxide semiconductor film 103, the gate electrode layer 105 over the gate insulating film 111, the insulating film 106 over the gate electrode layer 105, the sidewall insulating films 109a and 109b each of which covers a side surface of the gate electrode layer 105 and a side surface of the insulating film 106, the source electrode layer 116a in contact with the oxide semiconductor film 103, the gate insulating film 111, and the sidewall insulating film 109a, and the drain electrode layer 116b in contact with the oxide The structures, methods, and the like described in this embodiment can be combined as appropriate with any of the structures, methods, and the like described in the other embodiments.

semiconductor film 103, the gate insulating film 111, and the side wall insulating film 109b. Further, the insulating film 117 and the interlayer insulating film 115 are provided to cover the transistor 550.

The oxide semiconductor film 103 includes the channel formation region 108 and the regions 107a and 107b containing dopants between which the channel formation region 108 is provided. The regions 107a and 107b containing dopants have a lower resistance than the channel formation region 108.

The transistor 550 includes the source electrode layer 116a and the drain electrode layer 116b which are in contact with the oxide semiconductor film 103 and have a stacked-layer structure. The source electrode layer 116a is a stack of the metal film 114a and the conductive film 113a. The drain electrode layer 116b is a stack of the metal film 114b and the conductive film 113b.

For the metal films 114a and 114b which are in contact with the oxide semiconductor film 103, a metal having a higher oxidation resistance than the metal element included in the oxide semiconductor film 103 (a metal having higher Gibbs free energy of oxidation reaction than at least indium, gallium, and zinc) is used, so that extraction of oxygen from the oxide semiconductor film 103 can be prevented. Accordingly, an increase in oxygen vacancies at the interface between the semiconductor film 103 and each of the source electrode layer 116a and the drain electrode layer 116b can be suppressed, whereby a shift of the threshold voltage of the transistor in the negative direction can be suppressed.

Further, since the metal films 114a and 114b are not likely to become oxidized as compared to the oxide semiconductor film 103 and thus, diffusion of oxygen in the metal films 114a and 114b can be suppressed, the formation of the high resistance component in the metal films 114a and 114b can be suppressed. Accordingly, the resistance due to the oxide semiconductor film 103, the source electrode layer 116a, and the drain electrode layer 116b can be reduced, so that the decrease in on-state current of the transistor can be suppressed.

The transistor 550 includes an oxide semiconductor in the channel formation region. Here, impurities such as hydrogen or moisture and oxygen vacancies are reduced in the oxide semiconductor film 103 included in the transistor 550. By using such an oxide semiconductor, the transistor 550 which has extremely favorable off-state current characteristics can be obtained.

Since the off-state current of the transistor 550 is extremely small, stored data can be held for a long time owing to such a transistor. In other words, power consumption can be sufficiently reduced because a semiconductor device in which refresh operation is unnecessary or the frequency of refresh operation is extremely low can be provided.

Further, the insulating film 117, the interlayer insulating film 115, and the insulating film 118 are provided to cover the transistor 210. The insulating films 117 and 118 can be formed using a material and method similar to those of the interlayer insulating film 115. Further, the interlayer insulating film 115, the insulating film 117, and the insulating film 118 have a single-layer structure or a stacked-layer structure. After the insulating film 117 and the interlayer insulating film 115 are formed to cover the transistor 550, polishing treatment is performed on the insulating film 117 and the interlayer insulating film 115 until the surface of the insulating film 106 is exposed, thereby planarization of the surfaces is performed. The insulating film 118 is formed over the insulating film 117 and the interlayer insulating film 115 on which the planarization has been performed.

In this embodiment, an aluminum oxide film formed by a sputtering method is used as the insulating film 117, a silicon oxynitride film formed by a plasma CVD method is used as the interlayer insulating film 115, and a silicon oxynitride film formed by a plasma CVD method is used as the insulating film 118.

As the insulating film 117, an inorganic insulating film having a high density is preferably used. For example, an aluminum oxide film is formed by a sputtering method to cover the transistor 550. The aluminum oxide film is formed to have high density (the film density is higher than or equal to 3.2 g/cm$^3$, preferably higher than or equal to 3.6 g/cm$^3$), so that the transistor 550 can have stable electric characteristics. The film density can be measured by Rutherford backscattering spectrometry (RBS) or X-ray reflectmetry (XRR).

An aluminum oxide film which can be used as an inorganic insulating film provided over the transistor 550 has a high shielding effect (blocking effect) of preventing penetration of both oxygen and impurities such as hydrogen and moisture.

Therefore, during the manufacturing process and after the manufacture, the aluminum oxide film functions as a protective film for preventing entry of impurities such as hydrogen or moisture, which causes change, into the oxide semiconductor film 103 and release of oxygen, which is a main constituent material of the oxide semiconductor, from the oxide semiconductor film 103.

Wiring layers 119a and 119b for connecting the transistor 210 to another transistor are provided over the insulating film 118. The wiring layer 119a is electrically connected to the source electrode layer 116a through an opening formed in the insulating film 118, the interlayer insulating film 115, and the insulating film 117. The wiring layer 119b is electrically connected to the drain electrode layer 116b through an opening formed in the insulating film 118, the interlayer insulating film 115, and the insulating film 117.

The wiring layers 119a and 119b can be formed using a material and a method which are similar to those of the gate electrode layer 105. For example, the wiring layers 119a and 119b can be formed using a metal film containing an element selected from aluminum (Al), chromium (Cr), copper (Cu), tantalum (Ta), titanium (Ti), molybdenum (Mo), and tungsten (W), a metal nitride film (a titanium nitride film, a molybdenum nitride film, or a tungsten nitride film) containing any of the above elements as a component, or the like. A film of a metal having a high melting point such as titanium, molybdenum, tungsten, or the like or a metal nitride film of any of these elements (a titanium nitride film, a molybdenum nitride film, or a tungsten nitride film) may be stacked on at least one of a lower side and an upper side of the metal film of aluminum, copper, or the like.

Further, a conductive metal oxide can be used as a material of the wiring layers 119a and 119b. As the conductive metal oxide, indium oxide ($In_2O_3$), tin oxide ($SnO_2$), zinc oxide (ZnO), indium tin oxide ($In_2O_3$—$SnO_2$, referred to as ITO), indium oxide-zinc oxide ($In_2O_3$—ZnO), or such a metal oxide material containing silicon oxide can be used. It is also possible to have a stacked-layer structure formed using the above-described conductive material and the above-described metal oxide material.

For example, as the wiring layers 119a and 119b, a single layer of a molybdenum film, a stack of a tantalum nitride film and a copper film, a stack of a tantalum nitride film and a tungsten film, or the like can be used.

Further, the insulating film 121 is formed to cover the wiring layers 119a and 119b, and an electrode layer 122 is formed in a region which is over the insulating film 121 and overlaps with the wiring layer 119b. The wiring layer 119b, the insulating film 121, and the electrode layer 122 form the capacitor 551.

The insulating film 121 can be formed using a material and method similar to those of the interlayer insulating film 115 or the like.

In FIGS. 22A and 22B, the transistor 210 is provided to overlap with at least part of the transistor 550. The source region or the drain region of the transistor 210 is preferably provided to overlap with part of the oxide semiconductor film 103. With such a planar layout, the area occupied by the semiconductor device can be reduced; thus, higher integration can be achieved.

Next, an example of a circuit configuration corresponding to FIGS. 22A and 22B is illustrated in FIG. 22C.

In FIG. 22C, a first line (1st Line) is electrically connected to a source electrode layer of the transistor 210. A second line (2nd Line) is electrically connected to a drain electrode layer of the transistor 210. A third line (a 3rd line) and one of source or drain electrode layers of the transistor 550 are electrically connected to each other, and a fourth line (a 4th line) and a gate electrode layer of the transistor 550 are electrically connected to each other. A gate electrode layer of the transistor 210 and the other of the source electrode layer and the drain electrode layer of the transistor 550 are electrically connected to one electrode of a capacitor 551, and a fifth line (a 5th line) and the other electrode of the capacitor 551 are electrically connected to each other.

The semiconductor device in FIG. 22C utilizes a characteristic in which the potential of the gate electrode layer of the transistor 210 can be held, and thus enables data writing, holding, and reading as follows.

Writing and holding of data are described. First, the potential of the fourth line is set to a potential at which the transistor 550 is turned on, so that the transistor 550 is turned on. Accordingly, the potential of the third line is supplied to the gate electrode layer of the transistor 210 and the capacitor 551. That is, predetermined charge is given to the gate electrode layer of the transistor 210 (writing). Here, one of two kinds of charges providing different potential levels (hereinafter referred to as a low level charge and a high level charge) is applied. After that, the potential of the fourth line is set to a potential at which the transistor 550 is turned off, so that the transistor 550 is turned off. Thus, the charge given to the gate electrode layer of the transistor 210 is held (holding).

Since the off-state current of the transistor 550 is extremely low, the charge of the gate electrode layer of the transistor 210 is held for a long time.

Next, reading of data is described. By supplying an appropriate potential (reading potential) to the fifth line while a predetermined potential (constant potential) is supplied to the first line, the potential of the second line varies depending on the amount of charge held in the gate electrode layer of the transistor 210. This is because in general, when the transistor 210 is an n-channel transistor, an apparent threshold voltage $V_{th\_H}$ in the case where a high level charge is given to the gate electrode layer of the transistor 210 is lower than an apparent threshold voltage $V_{th\_L}$ in the case where a low level charge is given to the gate electrode layer of the transistor 210. Here, an apparent threshold voltage refers to the potential of the fifth line, which is needed to turn on the transistor 210. Thus, the potential of the fifth line is set to a potential $V_0$ which is between $V_{th\_H}$ and $V_{th\_L}$, whereby charge given to the gate electrode layer of the transistor 210 can be determined. For example, in the case where a high level charge is given in writing, when the potential of the fifth line is set to $V_0$ ($>V_{th\_H}$), the transistor 210 is turned on. In the case where a low level charge is given in writing, even when the potential of the fifth line is set to $V_0$ ($<V_{th\_L}$), the transistor 210 remains in an off state. Therefore, the stored data can be read by the potential of the second line.

Note that in the case where memory cells are arrayed to be used, only data of desired memory cells needs to be read. In the case of a memory cell in which reading is not performed, a potential at which the transistor 210 is turned off, that is, a potential smaller than $V_{th\_H}$ may be given to the fifth line regardless of the state of the gate electrode layer of the transistor 210. Alternatively, a potential which allows the transistor 210 to be turned on regardless of a state of the gate electrode layer, that is, a potential higher than $V_{th\_L}$ may be applied to the fifth line.

When a transistor having a channel formation region formed using an oxide semiconductor and having extremely small off-state current is applied to the semiconductor device in this embodiment, the semiconductor device can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate; thus, the problem of deterioration of a gate insulating film does not occur. In other words, the semiconductor device according to an embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

As described above, a miniaturized and highly-integrated semiconductor device having high electric characteristics and a method for manufacturing the semiconductor device can be provided.

The structures, methods, and the like described in this embodiment can be combined as appropriate with any of the structures, methods, and the like described in the other embodiments.

Embodiment 15

In this embodiment, a semiconductor device which includes the transistor described in Embodiment 6, which can hold stored data even when not powered, and which does not have a limitation on the number of write cycles, and which has a structure different from the structure described in Embodiment 14 is described with reference to FIGS. 23A and 23B and FIGS. 24A and 24B.

Figure 23A:
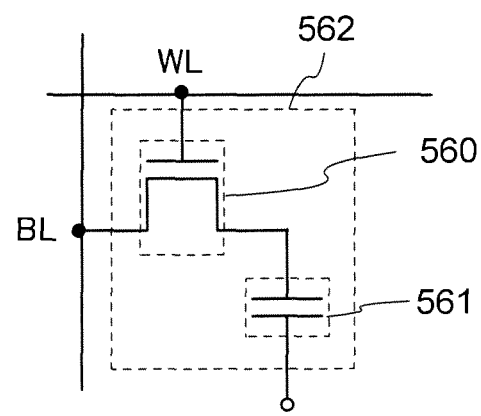
FIGS. 23A and 23B are a circuit diagram and a perspective view illustrating one embodiment of a semiconductor device.
Figure 23B:
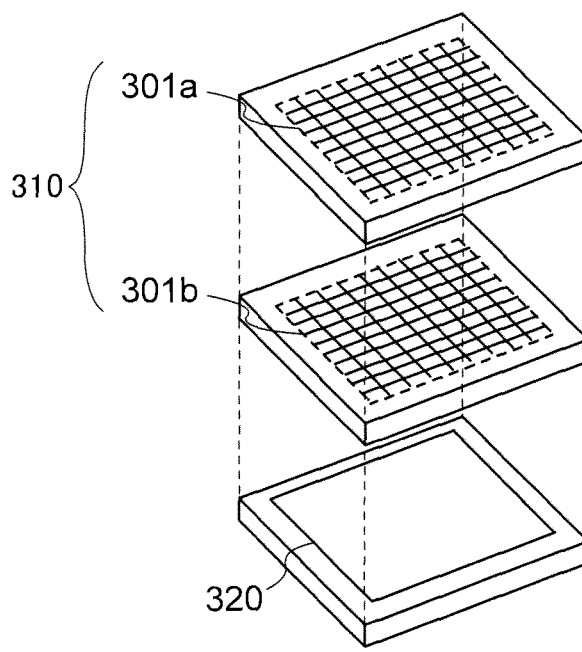

FIG. 23A illustrates an example of a circuit configuration of a semiconductor device, and FIG. 23B is a conceptual diagram illustrating an example of a semiconductor device. First, the semiconductor device illustrated in FIG. 23A is described, and then, the semiconductor device illustrated in FIG. 23B is described below.

In the semiconductor device illustrated in FIG. 23A, a bit line BL is electrically connected to one of the source electrode layer and the drain electrode layer of the transistor 560, a word line WL is electrically connected to the gate electrode layer of the transistor 560, and the other of the source electrode layer and the drain electrode layer of the transistor 560 is electrically connected to a first terminal of a capacitor 561.

Next, writing and holding of data in the semiconductor device (a memory cell 562) illustrated in FIG. 23A are described.

First, the potential of the word line WL is set to a potential at which the transistor 560 is turned on, and the transistor 560 is turned on. Accordingly, the potential of the bit line BL is supplied to the first terminal of the capacitor 561 (writing). After that, the potential of the word line WL is set to a potential at which the transistor 560 is turned off, so that the transistor 560 is turned off. Thus, the potential at the first terminal of the capacitor 561 is held (holding).

The transistor 560 including an oxide semiconductor has extremely low off-state current. For that reason, a potential of the first terminal of the capacitor 561 (or a charge accumulated in the capacitor 561) can be held for an extremely long period by turning off the transistor 560.

Secondly, reading of data is described. When the transistor 560 is turned on, the bit line BL which is in a floating state and the first terminal of the capacitor 561 are electrically connected to each other, and the charge is redistributed between the bit line BL and the capacitor 561. As a result, the potential of the bit line BL is changed. The amount of change in potential of the bit line BL varies depending on the potential of the first terminal of the capacitor 561 (or the charge accumulated in the capacitor 561).

For example, the potential of the bit line BL after charge redistribution is $(C_B \times V_{B0} + C \times V)/(C_B + C)$, where V is the potential of the first terminal of the capacitor 561, C is the capacitance of the capacitor 561, $C_B$ is the capacitance of the bit line BL (hereinafter also referred to as bit line capacitance), and $V_{B0}$ is the potential of the bit line BL before the charge redistribution. Therefore, it can be found that assuming that the memory cell 562 is in either of two states in which the potentials of the first terminal of the capacitor 561 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=C_B \times V_{B0} + C \times V_0)/(C_B + C)$).

Then, by comparing the potential of the bit line BL with a predetermined potential, data can be read.

As described above, the semiconductor device illustrated in FIG. 23A can hold charge that is accumulated in the capacitor 561 for a long time because the off-state current of the transistor 560 is extremely small. In other words, power consumption can be sufficiently reduced because refresh operation becomes unnecessary or the frequency of refresh operation can be extremely low. Moreover, stored data can be held for a long period even when power is not supplied.

Next, the semiconductor device illustrated in FIG. 23B is described.

The semiconductor device illustrated in FIG. 23B includes memory cell arrays 301a and 301b including a plurality of memory cells 562 illustrated in FIG. 23A as memory circuits in the upper portion, and a peripheral circuit 320 in the lower portion which is necessary for operating the memory cell array 310 (the memory cell arrays 301a and 301b). Note that the peripheral circuit 320 is electrically connected to the memory cell arrays 301a and 301b.

In the structure illustrated in FIG. 23B, the peripheral circuit 320 can be provided under the memory cell array 310 (the memory cell arrays 301a and 301b). Thus, the size of the semiconductor device can be decreased.

It is preferable that a semiconductor material of the transistor provided in the peripheral circuit 320 be different from that of the transistor 560. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably realized by the transistor.

Note that FIG. 23B illustrates, as an example, the semiconductor device in which two memory cell arrays 310 (the memory cell array 301a and the memory cell array 301b) are stacked; however, the number of memory cell arrays to be stacked is not limited thereto. Three or more memory cell arrays may be stacked.

Next, a specific structure of the memory cell 562 illustrated in FIG. 23A is described with reference to FIGS. 24A and 24B.

Figure 24A:
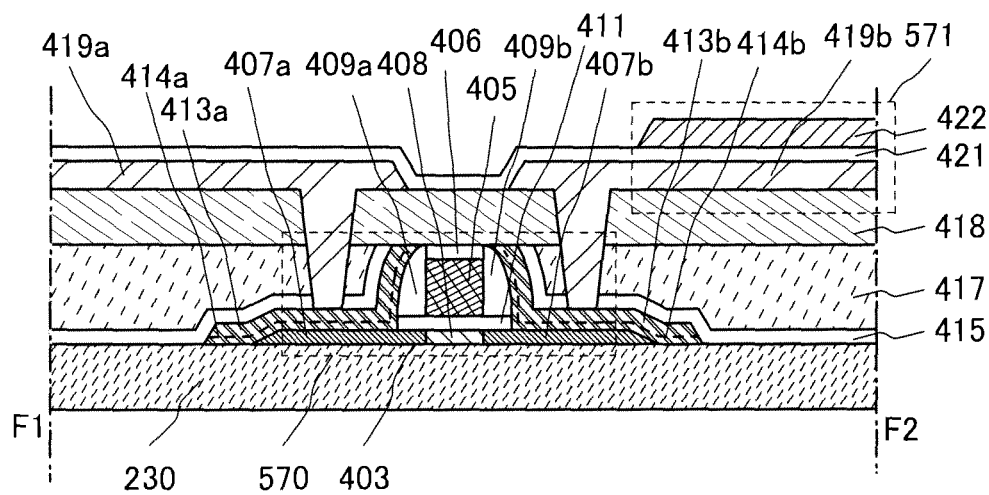
FIGS. 24A and 24B are a cross-sectional view and a plan view illustrating one embodiment of a semiconductor device.
Figure 24B:
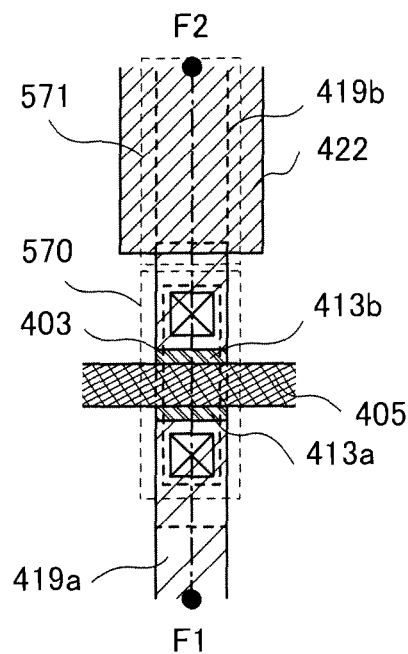

FIGS. 24A and 24B illustrate an example of a structure of the memory cell 562. FIG. 24A is a cross-sectional view of the memory cell 562, and FIG. 24B is a plan view of the memory cell 562. Here, FIG. 24A corresponds to a cross section along line F1-F2 in FIG. 24B.

The transistor 570 illustrated in FIGS. 24A and 24B can have the same structure as that of the transistor 550 described in Embodiment 14; thus, the detailed description thereof is omitted. Further, a capacitor 571 illustrated in FIGS. 24A and 24B can have the same structure as that of the capacitor 451 described in Embodiment 14; thus, the detailed description thereof is omitted.

Note that when the memory cell array has a stacked-layer structure, an insulating film is additionally formed over the insulating film 421 and the electrode layer 422, and a transistor including an oxide semiconductor similar to the transistor 570 may be formed over the insulating film.

With the planar layout illustrated in FIG. 24A, the occupied area of the semiconductor device can be decreased; thus, the semiconductor device can be highly integrated.

As described above, the plurality of memory cells is formed in the upper portion with the transistors including an oxide semiconductor. Since the off-state current of the transistor including an oxide semiconductor is small, stored data can be held for a long time owing to such a transistor. In other words, the frequency of the refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

As described above, a miniaturized and highly-integrated semiconductor device having high electric characteristics and a method for manufacturing the semiconductor device can be provided.

This embodiment can be implemented in appropriate combination with the structures described in the other embodiments.

Embodiment 16

In this embodiment, examples of application of the semiconductor device described in any of the above embodiments to portable devices such as cellular phones, smartphones, or electronic books are described with reference to FIGS. 25A and 25B, FIG. 26, FIG. 27, and FIG. 28.

In a portable device such as a cellular phone, a smartphone, or an electronic book, an SRAM or a DRAM is used to store image data temporarily. The reason why an SRAM or a DRAM is used is that a flash memory is slow in responding and is not suitable for image processing. On the other hand, an SRAM or a DRAM has the following characteristics when used for temporary storage of image data.

Figure 25A:
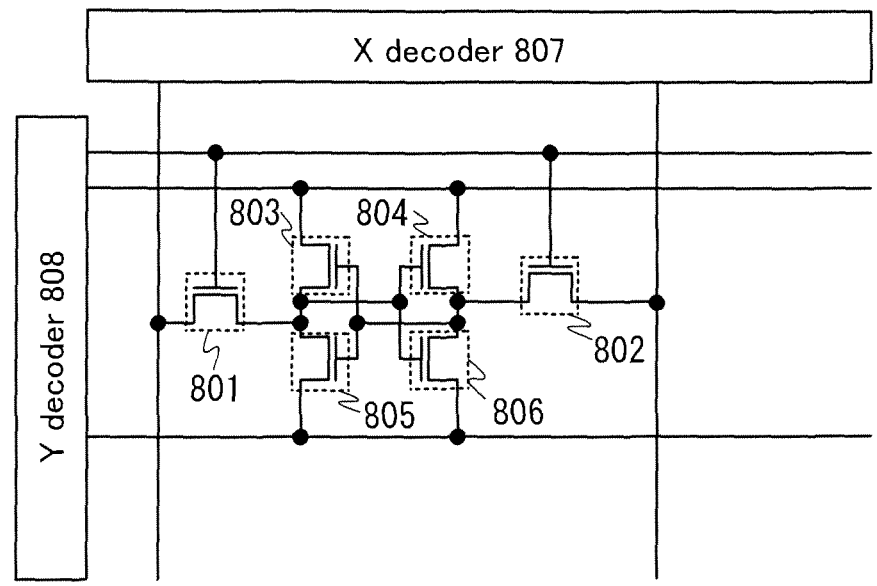
FIGS. 25A and 25B are a circuit diagram of SRAM and a circuit diagram of DRAM.

In an ordinary SRAM, as illustrated in FIG. 25A, one memory cell includes six transistors, that is, transistors 801 to 806, which are driven with an X decoder 807 and a Y decoder 808. The transistor 803 and the transistor 805, and the transistor 804 and the transistor 806 form inverters, which enables high-speed driving. However, because one memory cell includes six transistors, a large cell area is one disadvantage. Provided that the minimum feature size of a design rule is F, the area of a memory cell in an SRAM is generally 100 $F^2$ to 150 $F^2$. Therefore, the price per bit of an SRAM is the most expensive among memory devices.

Figure 25B:
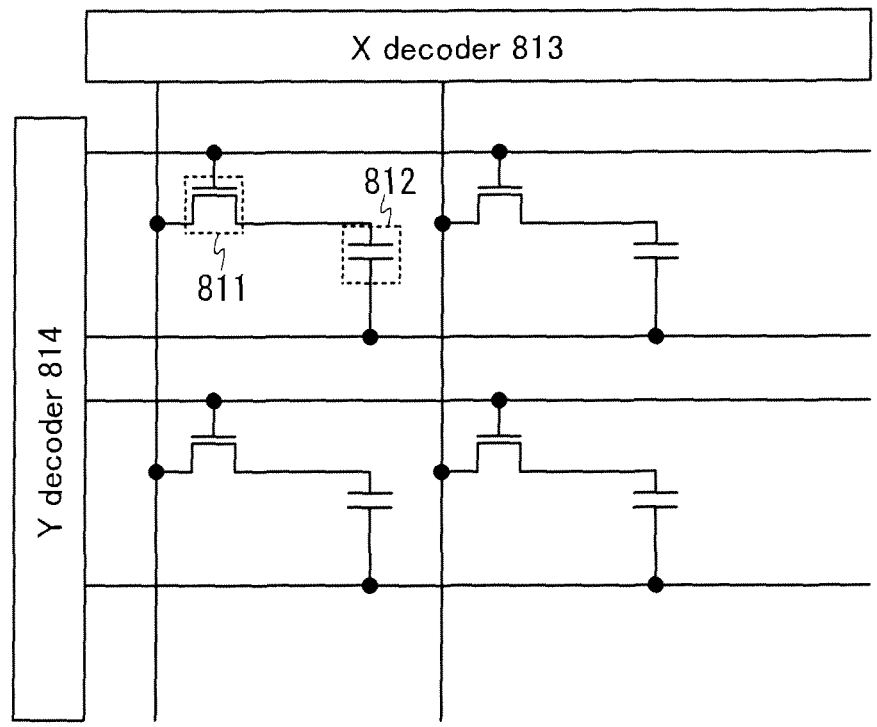

In a DRAM, as illustrated in FIG. 25B, a memory cell includes a transistor 811 and a storage capacitor 812, which are driven with an X decoder 813 and a Y decoder 814. One cell is configured with one transistor and one capacitor and has a small area. The area of a memory cell in a DRAM is generally 10 $F^2$ or less. Note that the DRAM needs to be refreshed periodically and consumes electric power even when a rewriting operation is not performed.

On the other hand, the memory cell of the semiconductor device described in any of the above embodiments has an area of approximately 10 $F^2$ and does not need to be refreshed frequently. Therefore, the area of a memory cell can be decreased, and power consumption can be reduced.

Figure 26:
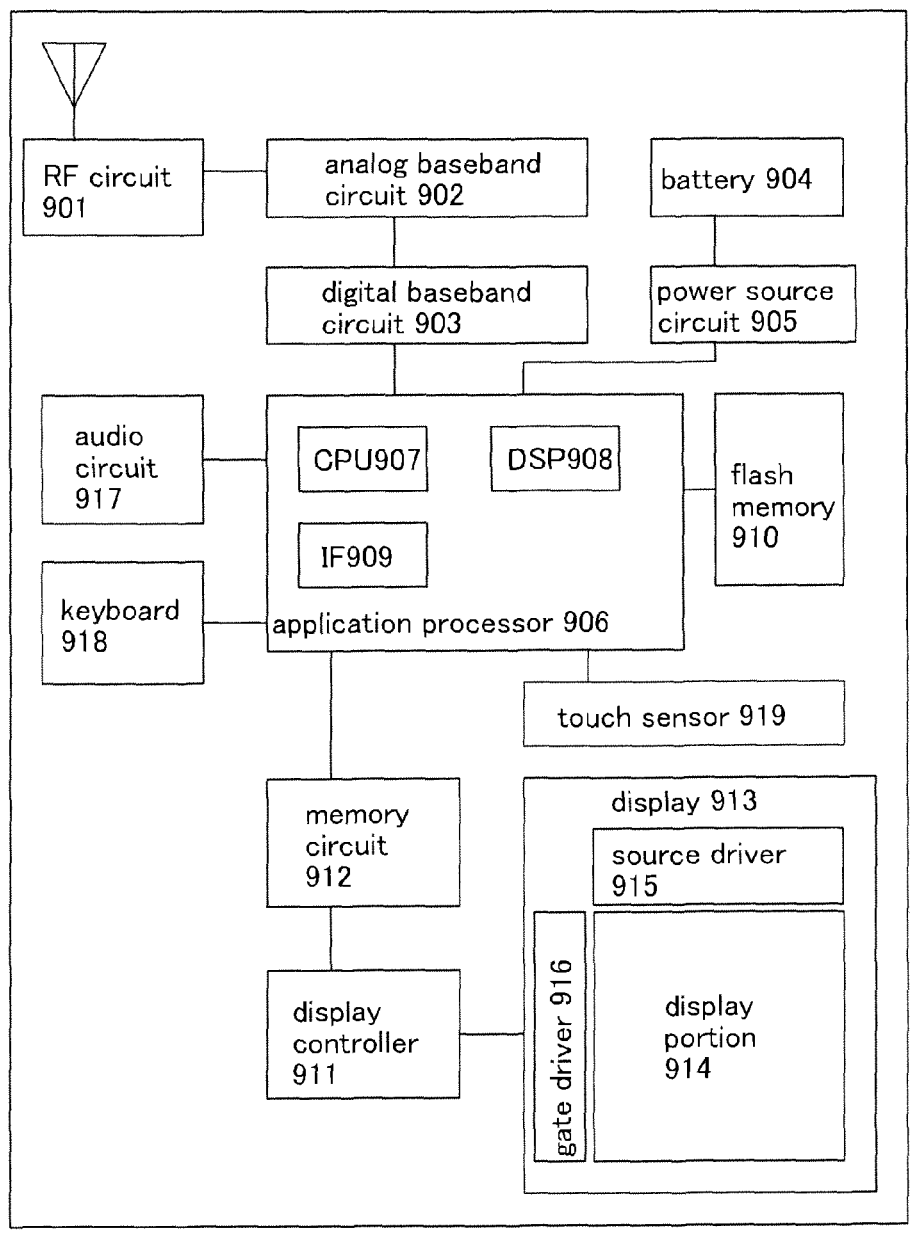
FIG. 26 is a block diagram illustrating one embodiment of a semiconductor device.

Next, FIG. 26 is a block diagram of a portable device. The portable device illustrated in FIG. 26 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM. By employing the semiconductor device described in any of the above embodiments for that portion, data can be written and read at high speed and can be held for a long time, and power consumption can be sufficiently reduced.

Figure 27:
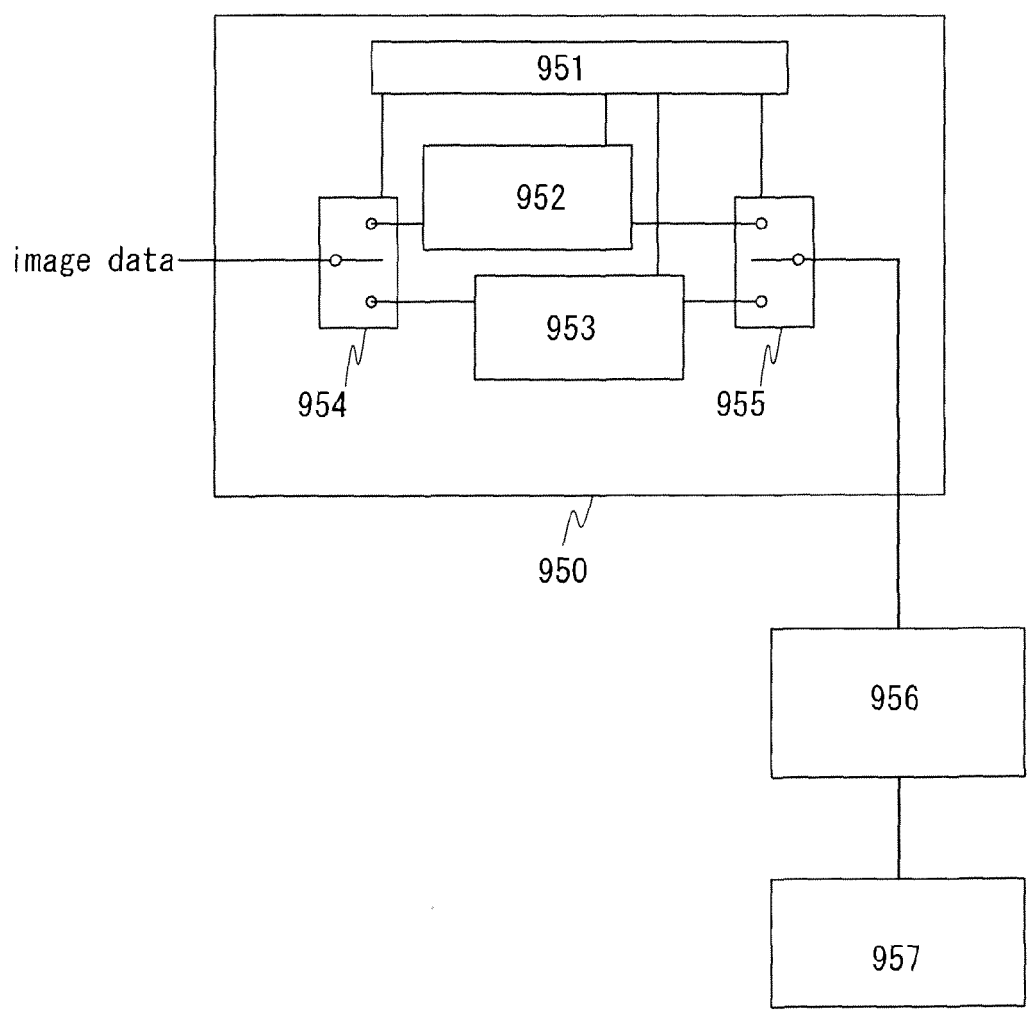
FIG. 27 is a block diagram illustrating one embodiment of a semiconductor device.

FIG. 27 illustrates an example of using the semiconductor device described in any of the above embodiments in a memory circuit 950 for a display. The memory circuit 950 illustrated in FIG. 27 includes a memory 952, a memory 953, a switch 954, a switch 955, and a memory controller 951. The memory circuit 950 is connected to a display controller 956 that reads and controls image data input through a signal line (input image data) and data stored in the memory 952 and the memory 953 (stored image data), and is also connected to a display 957 that displays an image based on a signal input from the display controller 956.

First, image data (input image data A) is produced by an application processor (not illustrated). The input image data A is stored in the memory 952 through the switch 954. Then, the image data stored in the memory 952 (stored image data A) is transmitted to the display 957 through the switch 955 and the display controller 956, and is displayed on the display 957.

When the input image data A remains unchanged, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. Also during that time, the stored image data A is regularly read from the memory 952 through the switch 955. After the completion of storing the new image data (the stored image data B) in the memory 953, from the next frame for the display 957, the stored image data B starts to be read, transmitted to the display 957 through the switch 955 and the display controller 956, and is displayed on the display 957. This reading operation continues until the next new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 28:
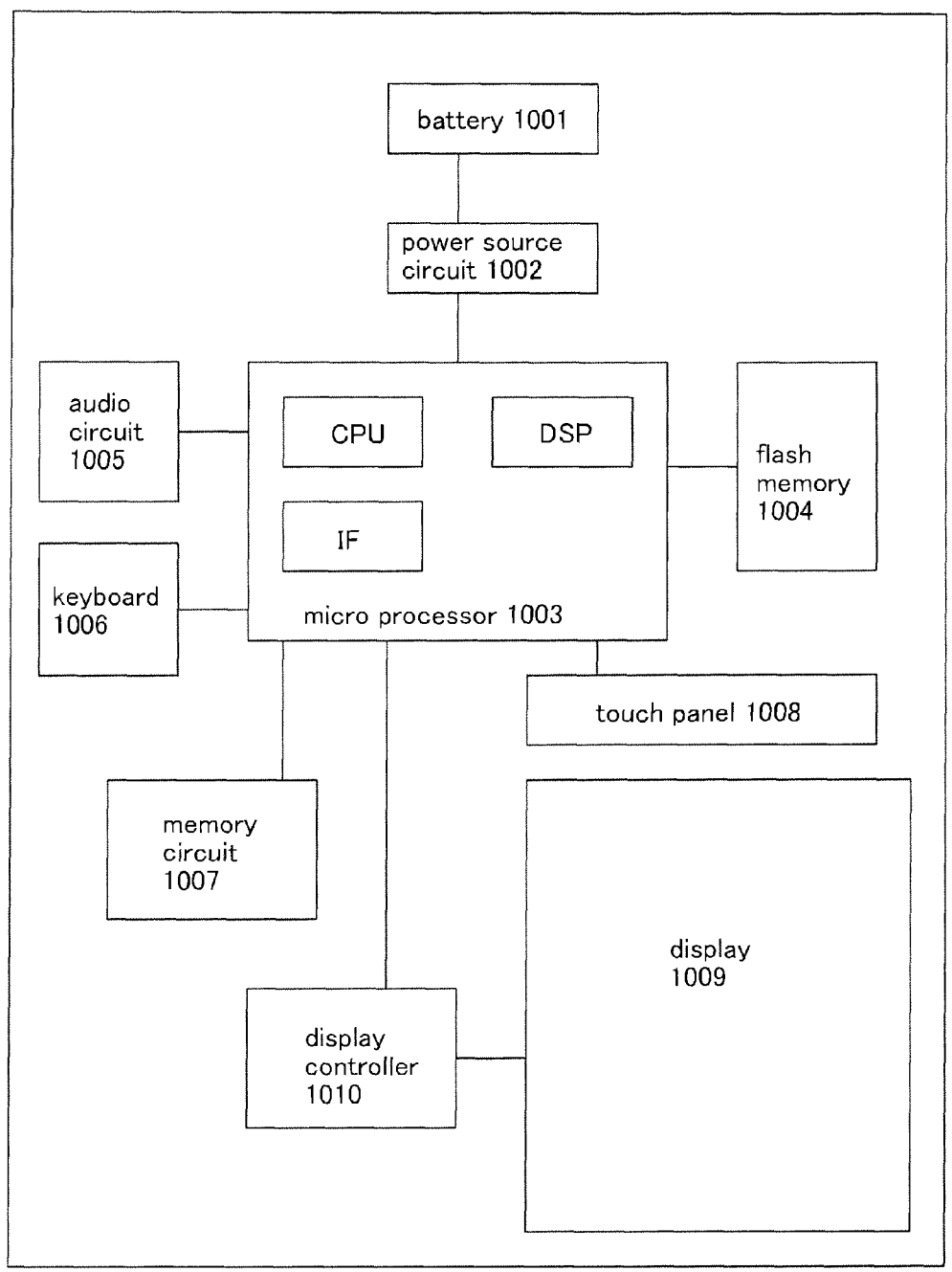
FIG. 28 is a block diagram illustrating one embodiment of a semiconductor device.

FIG. 28 is a block diagram of an electronic book. FIG. 28 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 28. The memory circuit 1007 has a function of temporarily storing the contents of a book. For example, a user may use a highlight function. In some cases, a user wants to mark a specific portion while reading an e-book reader. This marking function is called a highlight function and is used to make a difference from the other portions by changing the display color, underlining, making characters bold, changing the font of characters, or the like. The function makes it possible to store and hold data of a portion specified by a user. In order to store the data for a long time, the data may be copied to the flash memory 1004. Also in such a case, the semiconductor device described in any of the above embodiments is used, whereby writing and reading of data can be performed at high speed, data can be held for a long period, and power consumption can be sufficiently reduced.

As described above, the portable devices described in this embodiment each incorporate the semiconductor device according to any of the above embodiments. Therefore, it is possible to obtain a portable device which is capable of writing and reading data at high speed, holding data for a long time, and reducing power consumption.

The structures, methods, and the like described in this embodiment can be combined as appropriate with any of the structures, methods, and the like described in the other embodiments.

Embodiment 17

A semiconductor device disclosed in this specification can be applied to a variety of electronic devices (including an amusement machine). Examples of electronic devices are a television set (also referred to as a television or a television receiver), a monitor of a computer or the like, a camera such as a digital camera or a digital video camera, a digital photo frame, a mobile phone handset, a portable game machine, a portable information terminal, an audio reproducing device, a game machine (e.g., a pachinko machine or a slot machine), a game console, and the like. Specific examples of these electronic devices are illustrated in FIGS. 29A to 29C.

Figure 29A:
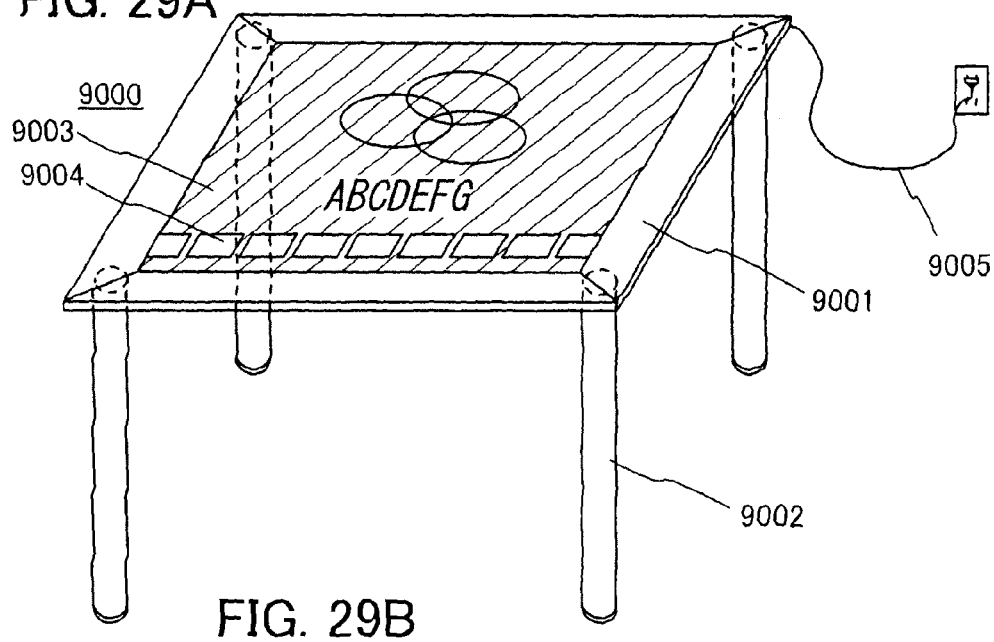
FIGS. 29A to 29C illustrate electronic devices.
Figure 29B:
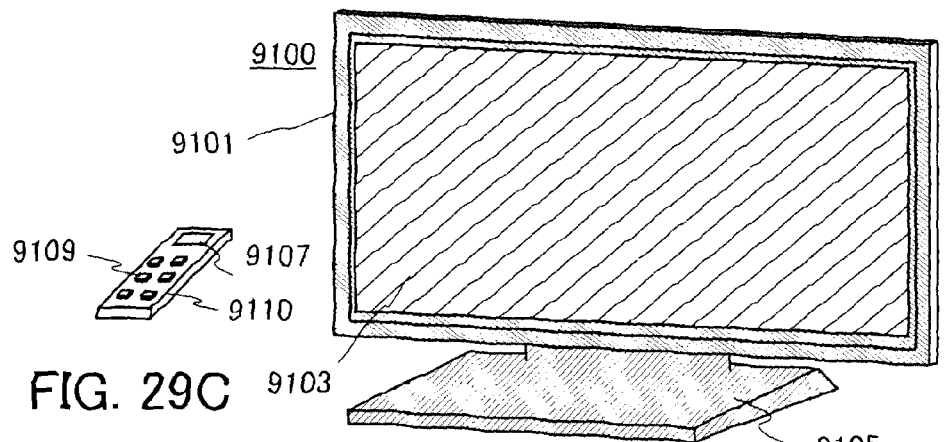
Figure 29C:
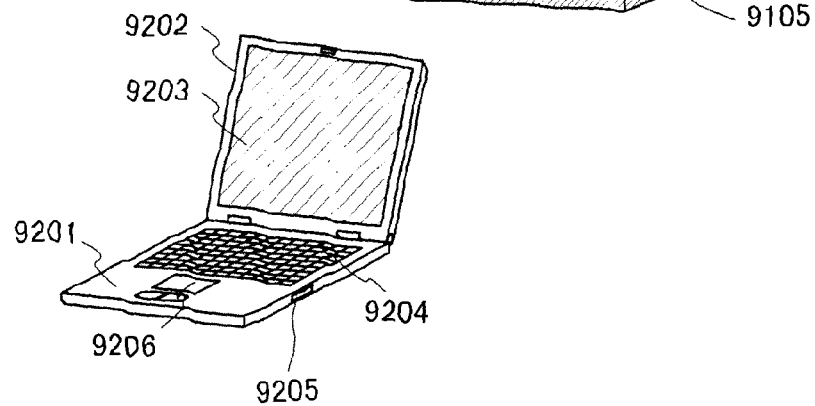

FIG. 29A illustrates a table 9000 having a display portion. In the table 9000, a display portion 9003 is incorporated in a housing 9001 and an image can be displayed on the display portion 9003. Note that the housing 9001 is supported by four leg portions 9002. Further, the housing 9001 is provided with a power cord 9005 for supplying power.

The semiconductor device described in any of the above embodiments can be used in the display portion 9003 so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, the table 9000 may be made to communicate with home appliances or control the home appliances, so that the table 9000 can function as a control device which controls the home appliances by operation on the screen. For example, with use of the semiconductor device having an image sensing function described in Embodiment 13, the display portion 9003 can have a touch input function.

Further, it is possible to stand the screen of the display portion 9003 so as to be perpendicular to a floor by using a hinge on the housing 9001; thus, the table 9000 can also be used as a television set. When a television set having a large screen is set in a small room, an open space is reduced; however, when a display portion is incorporated in a table, a space in the room can be efficiently used.

FIG. 29B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with operation keys 9109 of the remote controller 9110 so that an image displayed on the display portion 9103 can be controlled. Further, the remote controller 9110 may be provided with a display portion 9107 for displaying data output from the remote controller 9110.

The television set 9100 illustrated in FIG. 29B is provided with a receiver, a modem, and the like. With the receiver, the television set 9100 can receive a general television broadcast. Further, when the television set 9100 is connected to a communication network with or without wires via the modem, one-way (from a transmitter to a receiver) or two-way (between a transmitter and a receiver or between receivers) data communication can be performed.

The semiconductor device described in any of the above embodiments can be used in the display portions 9103 and 9107 so that the television set and the remote controller can have high reliability.

FIG. 29C illustrates a computer which includes a main body 9201, a housing 9202, a display portion 9203, a keyboard 9204, an external connection port 9205, a pointing device 9206, and the like.

The semiconductor device described in any of the above embodiments can be used in the display portion 9203, in which case, the computer can have high reliability.

FIGS. 30A and 30B illustrate a tablet terminal that can be folded. In FIG. 30A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038.

The semiconductor device described in any of the above embodiments can be used in the display portion 9631a and the display portion 9631b, in which case the tablet terminal can have high reliability.

A touch panel area 9632a can be provided in part of the display portion 9631a, in which area, data can be input by touching displayed operation keys 9638. In FIG. 30A, a half of the display portion 9631a has only a display function and the other half has a touch panel function. However, one embodiment of the present invention is not limited to this structure, and the whole display portion 9631a may have a touch panel function. For example, the display portion 9631a can display a keyboard in the whole region to be used as a touch panel, and the display portion 9631b can be used as a display screen.

A touch panel area 9632b can be provided in part of the display portion 9631b like in the display portion 9631a. By touching a keyboard display switching button 9639 displayed on the touch panel with a finger, a stylus, or the like, a keyboard can be displayed on the display portion 9631b.

Touch input can be performed concurrently on the touch panel area 9632a and the touch panel area 9632b.

The display-mode switching button 9034 allows switching between a landscape mode and a portrait mode, color display and black-and-white display, and the like. The power-saving-mode switching button 9036 allows optimizing the display luminance in accordance with the amount of external light in use which is detected by an optical sensor incorporated in the tablet terminal. In addition to the optical sensor, another detecting device such as a sensor for detecting inclination, like a gyroscope or an acceleration sensor, may be incorporated in the tablet terminal.

Although the display portion 9631a and the display portion 9631b have the same display area in FIG. 30A, one embodiment of the present invention is not limited to this example. The display portion 9631a and the display portion 9631b may have different areas or different display quality. For example, higher definition images may be displayed on one of the display portions 9631a and 9631b.

FIG. 30B illustrates the tablet terminal folded, which includes the housing 9630, a solar battery 9633, a charge and discharge control circuit 9634, a battery 9635, and a DCDC converter 9636. Note that FIG. 30B shows an example in which the charge and discharge control circuit 9634 includes the battery 9635 and the DCDC converter 9636.

Since the tablet terminal can be folded, the housing 9630 can be closed when not in use. Thus, the display portions 9631a and 9631b can be protected, which makes it possible to provide a tablet terminal with high durability and improved reliability for long-term use.

The tablet terminal illustrated in FIGS. 30A and 30B can have other functions such as a function of displaying a variety of kinds of data (e.g., a still image, a moving image, and a text image), a function of displaying a calendar, a date, the time, or the like on the display portion, a touch-input function of operating or editing the data displayed on the display portion by touch input, and a function of controlling processing by a variety of kinds of software (programs).

The solar battery 9633, which is attached on the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently. The use of a lithium ion battery as the battery 9635 is advantageous in downsizing or the like.

The structure and operation of the charge and discharge control circuit 9634 illustrated in FIG. 30B are described with reference to a block diagram of FIG. 30C. FIG. 30C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 30B.

First, description is given of an example of the operation in the case where power is generated by the solar battery 9633 using external light. The voltage of power generated by the solar battery is raised or lowered by the DCDC converter 9636 so that a voltage for charging the battery 9635 is obtained. When the power from the solar battery 9633 is used for the operation of the display portion 9631, the switch SW1 is turned on and the voltage of the power is raised or lowered by the converter 9637 to a voltage needed for operating the display portion 9631. When display is not performed on the display portion 9631, the switch SW1 is turned off and the switch SW2 is turned on so that the battery 9635 can be charged.

Although the solar battery 9633 is shown as an example of a charge means, there is no particular limitation on the charge means and the battery 9635 may be charged with another means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

The structures, methods, and the like described in this embodiment can be combined as appropriate with any of the structures, methods, and the like described in the other embodiments.

Embodiment 18

A semiconductor device disclosed in this specification can be applied to a variety of electronic devices (including game machines). Examples of electronic devices are a television set (also referred to as television or television receiver), a monitor of a computer or the like, a camera such as a digital camera or a digital video camera, a digital photo frame, a mobile phone (also referred to as cellular phone or cellular phone device), a portable game machine, a personal digital assistant, an audio reproducing device, and a large-sized game machine such as a pachinko machine. Examples of electronic devices each including the semiconductor device described in any of the above embodiments are described.

Figure 31A:
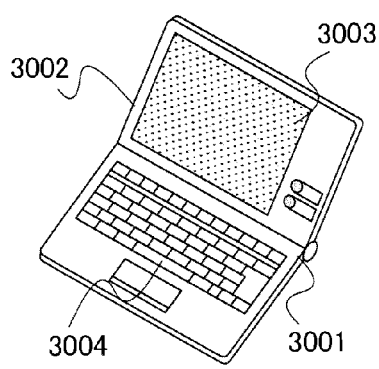
FIGS. 31A to 31F illustrate electronic devices.

FIG. 31A illustrates a laptop personal computer including a main body 3001, a housing 3002, a display portion 3003, a keyboard 3004, and the like. The display device described in Embodiment 12 can be used for the display portion 3003. Although not illustrated, a memory device according to any of the above embodiments can be used as an arithmetic circuit, a wireless circuit, or a memory circuit in the main body. With the use of the semiconductor device according to any of the above embodiments, the laptop personal computer can write and read data at high speed, hold data for a long time, and have low power consumption.

Figure 31B:
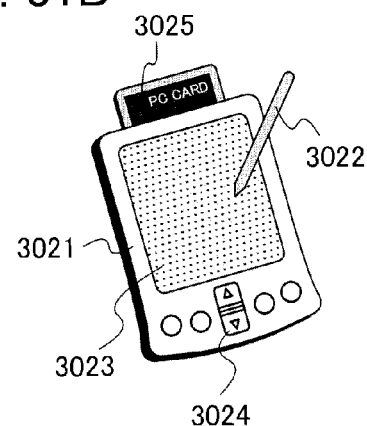

FIG. 31B is a personal digital assistant (PDA) including a display portion 3023, an external interface 3025, an operation button 3024, and the like in a main body 3021. A stylus 3022 is provided as an accessory for operation. The display device described in Embodiment 12 can be used for the display portion 3023. Although not illustrated, a memory device according to any of the above embodiments can be used as an arithmetic circuit, a wireless circuit, or a memory circuit in the main body. With the use of the semiconductor device according to any of the above embodiments, the personal digital assistant (PDA) can write and read data at high speed, hold data for a long time, and have low power consumption.

Figure 31C:
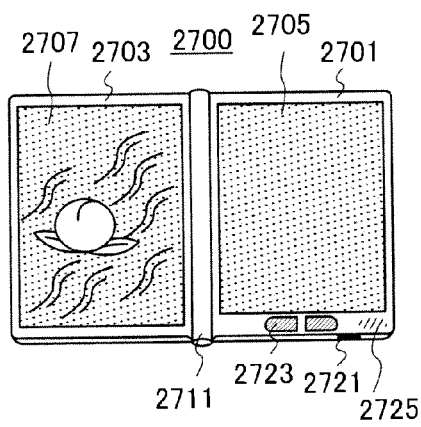

FIG. 31C illustrates an example of an e-book reader. For example, the e-book reader 2700 includes two housings, a housing 2701 and a housing 2703. The housing 2701 and the housing 2703 are combined with a hinge 2711 so that the e-book reader can be opened and closed with the hinge 2711 as an axis. With such a structure, the e-book reader can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 31C) can display text and a display portion on the left side (the display portion 2707 in FIG. 31C) can display graphics. The display device described in Embodiment 12 can be used for the display portions 2705 and 2707. Although not illustrated, a memory device according to any of the above embodiments can be used as an arithmetic circuit, a wireless circuit, or a memory circuit in the main body. With the use of the semiconductor device according to any of the above embodiments, the e-book reader 2700 can write and read data at high speed, hold data for a long time, and have low power consumption.

FIG. 31C illustrates an example in which the housing 2701 includes an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (such as an earphone terminal or a USB terminal), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an e-book server.

Figure 31D:
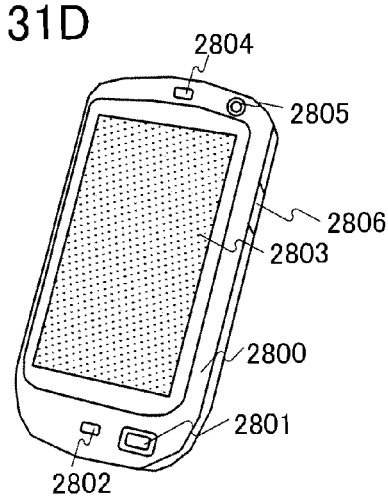

FIG. 31D illustrates a smartphone which includes a housing 2800, a button 2801, a microphone 2802, a display portion 2803 provided with a touch panel, a speaker 2804, and a camera lens 2805 and has a function of a mobile phone. The display device described in Embodiment 12 can be used for the display portion 2803. Although not illustrated, a memory device according to any of the above embodiments can be used as an arithmetic circuit, a wireless circuit, or a memory circuit in the main body. With the use of the semiconductor device according to any of the above embodiments, the smartphone can write and read data at high speed, hold data for a long time, and have low power consumption.

In the display portion 2803, the display direction can be appropriately changed depending on a usage pattern. Further, the smartphone is provided with the camera lens 2805 on the same surface as the display portion 2803; thus, it can be used as a video phone. The speaker 2804 and the microphone 2802 can be used for videophone calls, recording and playing sound, and the like as well as voice calls.

The external connection terminal 2806 can be connected to an AC adapter and various types of cables such as a USB cable, and charge and data communication with a personal computer or the like are possible. Moreover, a large amount of data can be stored by inserting a memory medium into an external memory slot (not illustrated) and can be moved.

Further, in addition to the above functions, an infrared communication function, a television reception function, or the like may be provided.

Figure 31E:
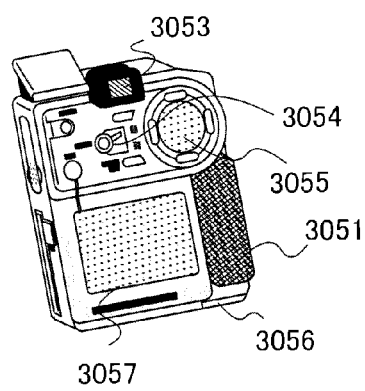

FIG. 31E illustrates a digital video camera including a main body 3051, a display portion A 3057, an eyepiece 3053, an operation switch 3054, a display portion B 3055, a battery 3056, and the like. The display device described in Embodiment 12 can be used for the display portion A 3057 and the display portion B 3055. Although not illustrated, a memory device according to any of the above embodiments can be used as an arithmetic circuit, a wireless circuit, or a memory circuit in the main body. With the use of the semiconductor device according to any of the above embodiments, the digital video camera can write and read data at high speed, hold data for a long time, and have low power consumption.

Figure 31F:
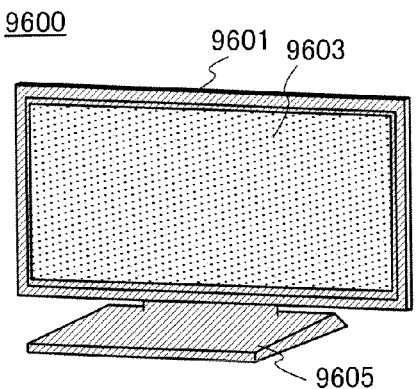

FIG. 31F illustrates an example of a television set. In the television set 9600, a display portion 9603 is incorporated in a housing 9601. The display portion 9603 can display images. Here, the housing 9601 is supported by a stand 9605. The display device described in Embodiment 12 can be used for the display portion 9603. Although not illustrated, a memory device according to any of the above embodiments can be used as an arithmetic circuit, a wireless circuit, or a memory circuit in the main body. With the use of the semiconductor device according to any of the above embodiments, the television set 9600 can write and read data at high speed, hold data for a long time, and have low power consumption.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) data communication can be performed.

The structures, methods, and the like described in this embodiment can be combined as appropriate with any of the structures, methods, and the like described in the other embodiments.

Example 1

In this example, results obtained from a research on elimination of oxygen contained in a ruthenium oxide film with thermal desorption spectroscopy (TDS) are described.

In thermal desorption spectroscopy, infrared heating is performed on a sample in high vacuum and released gas molecules are subjected to mass spectrometry, whereby a mass spectrum of a component eliminated from the sample is obtained at each temperature. The degree of vacuum of a background of a measurement apparatus is $1.33 \times 10^{-7}$ Pa ($10^{-9}$ Torr), which enables a component whose amount is extremely small to be analyzed. In this example, EMD-WA1000S manufactured by ESCO Ltd. was used.

Further, the peaks of the curves shown in the results obtained from TDS appear due to release of atoms or molecules contained in the analyzed samples to the outside. The total amount of the atoms or molecules released to the outside corresponds to the integral value of the peak. Thus, the total amount of the atoms or molecules contained in the ruthenium oxide film can be evaluated by the height of the peak intensity.

In this example, a ruthenium oxide film was formed over a silicon wafer by a sputtering method. The formation conditions of the ruthenium oxide film were as follows: the flow rate of oxygen was 20 sccm; the pressure in the treatment chamber was 0.4 Pa; the DC power was 100 W; the distance between a target and the substrate was 60 nm; and the substrate temperature was 150° C. The thicknesses of the ruthenium oxide film were set to 10 nm, 30 nm, 50 nm, 100 nm, and 200 nm. Here, the 10-nm-thick ruthenium oxide film, the 30-nm-thick ruthenium oxide film, the 50-nm-thick ruthenium oxide film, the 100-nm-thick ruthenium oxide film, and the 200-nm-thick ruthenium oxide film are referred to as Sample A, Sample B, Sample C, Sample D, and Sample E, respectively.

Figure 33:
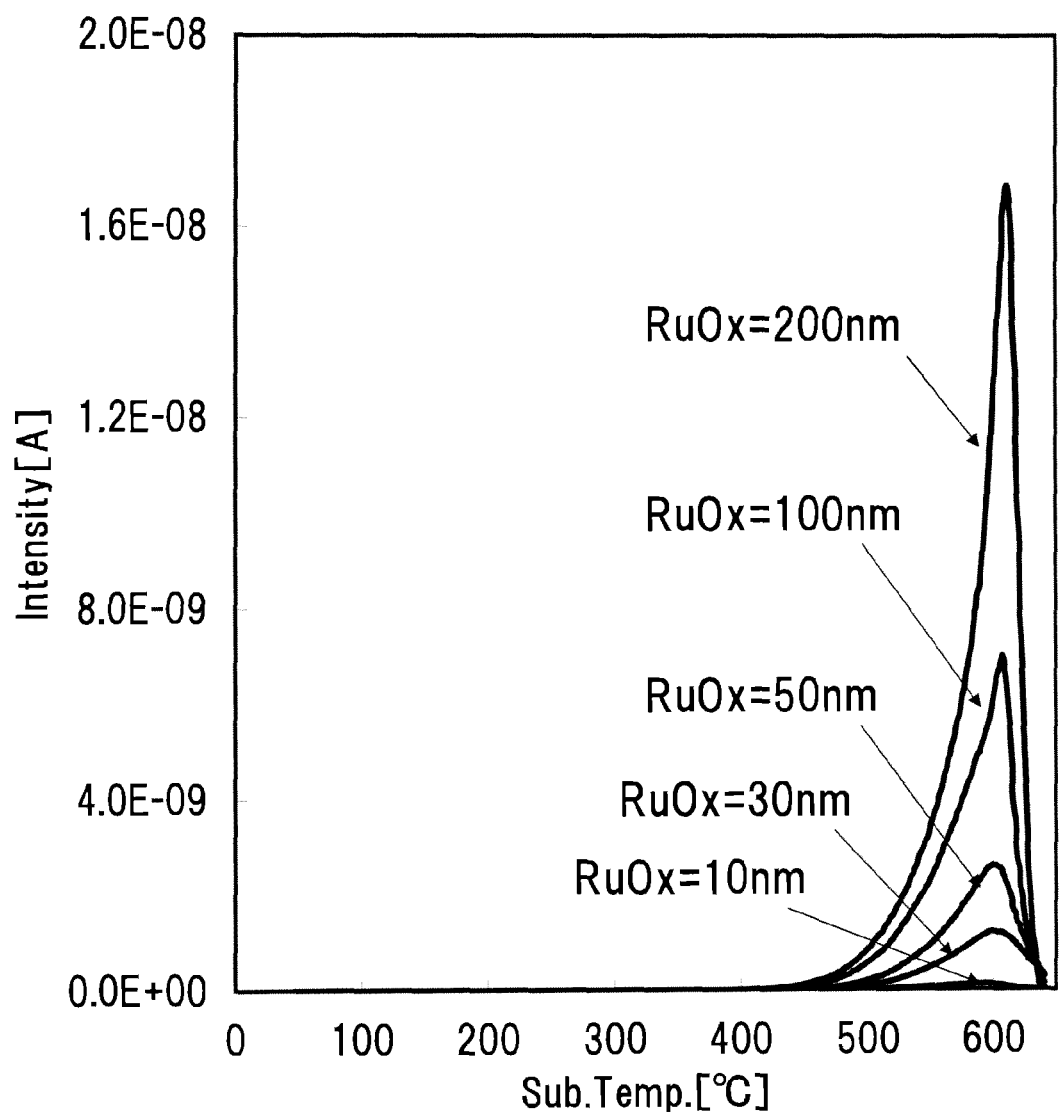
FIG. 33 shows the results obtained from TDS.

Next, FIG. 33 shows the results obtained from TDS performed on Sample A versus Sample E. FIG. 33 is a graph showing the amount of released oxygen molecules versus the substrate temperature.

From the results obtained from TDS shown in FIG. 33, release of oxygen molecules was observed even from the 10-nm-thick ruthenium oxide film. Further, it was observed that as the thickness of the ruthenium oxide film is increased, the amount of released oxygen molecules is increased.

From the above results, it is verified that the ruthenium oxide film can eliminate oxygen with heating.

Example 2

In this example, the concentration of oxygen of a conductive film provided in contact with an oxide semiconductor film before and after heat treatment is described. In this example, transfer of oxygen ($^{18}O$) due to heat treatment is described by measuring the concentration of oxygen by SIMS.

First, a sample formed in this example is described.

A 100-nm-thick IGZO film was formed over a silicon wafer by a sputtering method. The formation conditions of the IGZO film were as follows: a sputtering target of In:Ga:Zn=3:1:2 [atomic ratio] was used; 30 sccm of argon and 15 sccm of oxygen were supplied as a sputtering gas into a treatment chamber of a sputtering apparatus respectively; the pressure in the treatment chamber was controlled to 0.4 Pa; the DC power was 0.5 kW; and the substrate temperature was 200° C. The oxygen used as the sputtering gas was $^{18}$O.

Next, a 100-nm-thick ruthenium film was formed over the IGZO film by a sputtering method. The formation conditions of the ruthenium film were as follows: at 50 sccm of argon was supplied as a sputtering gas into a treatment chamber of a sputtering apparatus; the pressure in the treatment chamber was controlled to 0.4 Pa; the DC power was 50 W; and the substrate temperature was 25° C.

Next, a substrate that had been formed up to the ruthenium film was divided into plural parts, and one of the divided substrates was subjected to heat treatment. The heat treatment was performed at 400° C. under a nitrogen atmosphere for one hour. Here, a substrate on which heat treatment is not performed is referred to as Sample L, and a substrate on which heat treatment is performed is referred to as Sample M.

Next, samples that were formed as comparative samples are described.

First, a 100-nm-thick IGZO film was formed over a glass substrate by a sputtering method. The formation conditions of the IGZO film were as follows: a sputtering target of In:Ga:Zn=3:1:2 [atomic ratio] was used; 30 sccm of argon and 15 sccm of oxygen were supplied as a sputtering gas into a treatment chamber of a sputtering apparatus, respectively; the pressure in the treatment chamber was controlled to 0.44 Pa; the DC power was 0.5 kW; and the substrate temperature was 200° C. The oxygen used as the sputtering gas was $^{18}$O.

Next, a 100-nm-thick tungsten film was formed over the IGZO film by a sputtering method. The formation conditions of the tungsten film were as follows: 80 sccm of argon was supplied as a sputtering gas; the pressure in the treatment chamber was controlled to 0.8 Pa; the DC power was 1 kW; and the substrate temperature was 230° C.

Next, a substrate that had been formed up to the tungsten film was divided into plural parts, and one of the divided substrates was subjected to heat treatment. The heat treatment was performed at 400° C. under a nitrogen atmosphere for one hour. Here a substrate on which heat treatment is not performed is referred to as Comparative Sample N, and a substrate on which heat treatment is performed is referred to as Comparative Sample O.

Next, SIMS measurement was performed on Sample L, Sample M, Comparative Sample N, and Comparative Sample O.

Figure 34:
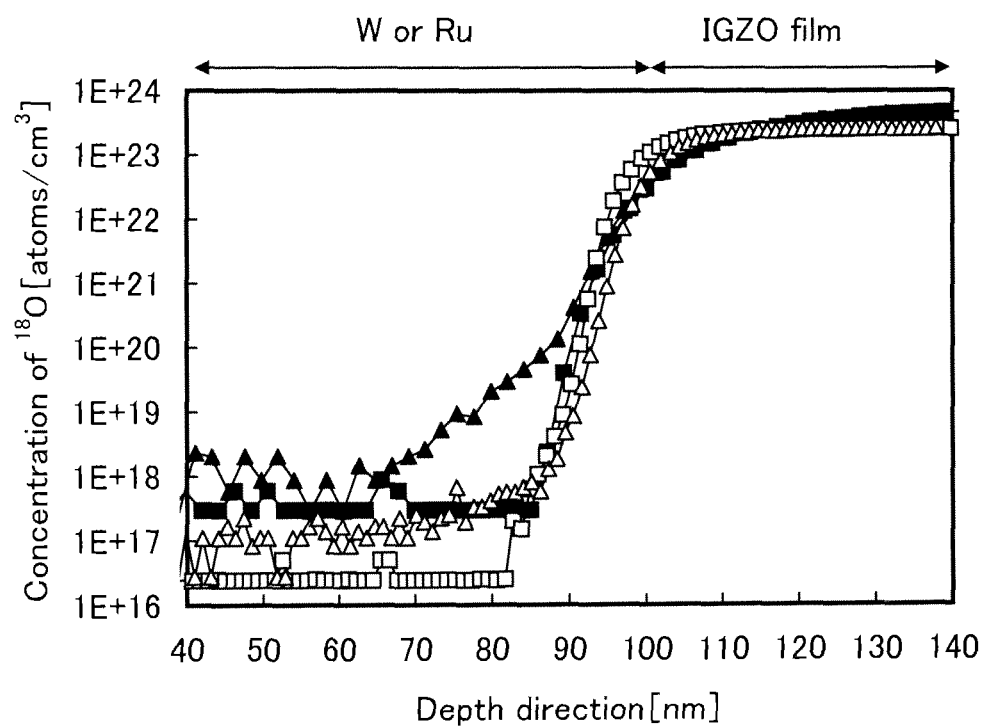
FIG. 34 shows the results obtained from SIMS.

FIG. 34 shows a profile of concentration of oxygen ($^{18}$O) in each of Sample L, Sample M, Comparative Sample N, and Comparative Sample O, which was obtained by the SIMS measurement. In FIG. 34, the white square denotes Sample L, the white triangle denotes Sample M, the black square denotes Comparative Sample N, and the black triangle denotes Comparative Sample O.

When Comparative Sample N and Comparative Sample O each of which has the tungsten film formed over the IGZO film are compared to each other, it is observed from the results shown in FIG. 34 that oxygen moves through heat treatment. In contrast, in Sample L and Sample M each of which has the ruthenium film formed over the IGZO film, the ruthenium film contains less oxygen than the tungsten film, and oxygen does not move so much through heat treatment.

From the results, in the case where the ruthenium film was formed as the conductive film provided in contact with the IGZO film, diffusion of oxygen was not observed as compared to a case where a tungsten film was formed as the conductive film. Therefore, the results show that in the case where a ruthenium film is provided in contact with an IGZO film, reduction of the IGZO film caused by extraction of oxygen from the IGZO film can be suppressed.

This application is based on Japanese Patent Application serial No. 2011-262644 filed with Japan Patent Office on Nov. 30, 2011 and Japanese Patent Application serial No. 2011-262720 filed with Japan Patent Office on Nov. 30, 2011, the entire contents of which are hereby incorporated by reference.

What is claimed is:

1. A semiconductor device comprising a transistor, the transistor comprising:
   a gate electrode layer;
   an oxide semiconductor layer over the gate electrode layer;
   a gate insulating layer interposed between the gate electrode layer and the oxide semiconductor layer;
   a first conductive layer over and in contact with the oxide semiconductor layer;
   a second conductive layer over and in contact with the oxide semiconductor layer;
   an oxide insulating film over the oxide semiconductor layer, the first conductive layer and the second conductive layer, the oxide insulating film being capable of supplying oxygen; and
   an aluminum oxide film over the oxide insulating film, the aluminum oxide film having a film density of 3.2 g/cm$^3$ or more,
   wherein the first conductive layer and the second conductive layer do not overlap each other,
   wherein the oxide semiconductor layer comprises indium, gallium and zinc,
   wherein each of the first conductive layer and the second conductive layer is formed using a first metal having a higher oxidation resistance than molybdenum, and
   wherein the first metal is ruthenium.

2. The semiconductor device according to claim 1,
   wherein the transistor further comprising a first insulating film over the oxide semiconductor layer, and
   wherein a part of the first insulating film is sandwiched with the first conductive layer and the oxide semiconductor layer.

3. The semiconductor device according to claim 1, wherein each of the first conductive layer and the second conductive layer comprises a ruthenium oxide.

4. The semiconductor device according to claim 1,
   wherein the first conductive layer is included in a source electrode layer of the transistor,
   wherein the second conductive layer is included in a drain electrode layer of the transistor,
   wherein the source electrode layer has a stacked-layer structure of the first conductive layer and a third conductive layer, and
   wherein the drain electrode layer has a stacked-layer structure of the second conductive layer and a fourth conductive layer.

5. The semiconductor device according to claim 4,
   wherein each of the third conductive layer and the fourth conductive layer is formed using a second metal different from the first metal.

6. The semiconductor device according to claim 4,
wherein at least one of the source electrode layer and the drain electrode layer includes a metal oxide of the first metal.

7. The semiconductor device according to claim 4,
wherein the first conductive layer is located over the third conductive layer, and
wherein the second conductive layer is located over the fourth conductive layer.

8. The semiconductor device according to claim 4, wherein each of the third conductive layer and the fourth conductive layer is formed using a material selected from the group consisting of gold, platinum, copper, silver, ruthenium, iridium, titanium, tungsten, titanium nitride, molybdenum nitride, tungsten nitride, and tantalum nitride.

9. A semiconductor device comprising a transistor, the transistor comprising:
a gate electrode layer;
an oxide semiconductor layer;
a gate insulating layer interposed between the gate electrode layer and the oxide semiconductor layer;
a first conductive layer in contact with the oxide semiconductor layer; and
a second conductive layer in contact with the oxide semiconductor layer,
wherein the first conductive layer and the second conductive layer do not overlap each other,
wherein the oxide semiconductor layer comprises indium, gallium and zinc,
wherein each of the first conductive layer and the second conductive layer is formed using a first metal having a higher oxidation resistance than molybdenum, and
wherein the first metal is ruthenium.

10. The semiconductor device according to claim 9,
wherein the transistor further comprising a first insulating film over the oxide semiconductor layer, and
wherein a part of the first insulating film is sandwiched with the first conductive layer and the oxide semiconductor layer.

11. The semiconductor device according to claim 9,
wherein each of the first conductive layer and the second conductive layer comprises a ruthenium oxide.

12. The semiconductor device according to claim 9,
wherein the first conductive layer is included in a source electrode layer of the transistor,
wherein the second conductive layer is included in a drain electrode layer of the transistor,
wherein the source electrode layer has a stacked-layer structure of the first conductive layer and a third conductive layer, and
wherein the drain electrode layer has a stacked-layer structure of the second conductive layer and a fourth conductive layer.

13. The semiconductor device according to claim 12,
wherein each of the third conductive layer and the fourth conductive layer is formed using a second metal different from the first metal.

14. The semiconductor device according to claim 12,
wherein at least one of the source electrode layer and the drain electrode layer includes a metal oxide of the first metal.

15. The semiconductor device according to claim 12,
wherein the first conductive layer is located over the third conductive layer, and
wherein the second conductive layer is located over the fourth conductive layer.

16. The semiconductor device according to claim 12, wherein each of the third conductive layer and the fourth conductive layer is formed using a material selected from the group consisting of gold, platinum, copper, silver, ruthenium, iridium, titanium, tungsten, titanium nitride, molybdenum nitride, tungsten nitride, and tantalum nitride.

* * * * *